US009665970B2

(12) United States Patent
Redgrave et al.

(10) Patent No.: US 9,665,970 B2
(45) Date of Patent: May 30, 2017

(54) VARIABLE-SIZED CONCURRENT GROUPING FOR MULTIPROCESSING

(75) Inventors: Jason Rupert Redgrave, Mountain View, CA (US); Steven John Clohset, San Francisco, CA (US); James Alexander McCombe, San Francisco, CA (US); Luke Tilman Peterson, Oakland, CA (US)

(73) Assignee: Imagination Technologies Limited, Kings Langley (GB)

( * ) Notice: Subject to any disclaimer, the term of this patent is extended or adjusted under 35 U.S.C. 154(b) by 1120 days.

(21) Appl. No.: 13/368,644

(22) Filed: Feb. 8, 2012

(65) Prior Publication Data

US 2012/0133654 A1 May 31, 2012

Related U.S. Application Data

(63) Continuation-in-part of application No. 12/771,408, filed on Apr. 30, 2010, now Pat. No. 8,674,987.
(Continued)

(51) Int. Cl.
*G06F 9/44* (2006.01)
*G06F 9/45* (2006.01)
(Continued)

(52) U.S. Cl.
CPC .......... *G06T 15/005* (2013.01); *G06F 8/4442* (2013.01); *G06F 9/4881* (2013.01);
(Continued)

(58) Field of Classification Search
CPC .... G06F 8/4442; G06F 8/445; G06F 12/0269; G06F 11/3612; G06F 9/3851;
(Continued)

(56) References Cited

U.S. PATENT DOCUMENTS 750,948 A     2/1904  Cox
4,625,289 A  11/1986  Rockwood
(Continued)

FOREIGN PATENT DOCUMENTS

WO    WO9617326      6/1996
WO    2007070456 A   6/2007
(Continued)

OTHER PUBLICATIONS

Roger Espasa et al., Multithreaded Vector Architectures, 1997 IEEE, [Retrieved on Mar. 6, 2015], Retrieved from the internet: <URL: http://www.redbooks.ibm.com/redbooks/pdfs/sg246472.pdf> 12 Pages (237-248).*

(Continued)

*Primary Examiner* — Thuy Dao
*Assistant Examiner* — Anibal Rivera
(74) *Attorney, Agent, or Firm* — Vorys, Sater, Seymour and Pease LLP; Vincent M DeLuca

(57) ABSTRACT

Aspects include, for example, a method for interpreting information in a computer program, or profiling such a program to estimate a group size for instances of that program (program module, or portion thereof). Such a method can be used in a system that supports collecting outputs of executing instances, where those outputs can specify new program instances. Scheduling of new instances (or allocation of resources for executing such instances) can be deferred. A trigger to begin scheduling (or allocation) for a collection of instances uses a target group size for that program. Thus, different programs can have different group sizes, which can be set explicitly, or based on profiling. The profiling can occur during one or more of pre-execution and during execution. The group size estimate can be an input into an algorithm that also accounts for system state during execution.

26 Claims, 23 Drawing Sheets

Related U.S. Application Data which is a continuation-in-part of application No. 12/408,478, filed on Mar. 20, 2009, now Pat. No. 7,830,379, which is a continuation-in-part of application No. 11/856,612, filed on Sep. 17, 2007, now Pat. No. 7,969,434.

(60) Provisional application No. 61/038,731, filed on Mar. 21, 2008, provisional application No. 61/095,890, filed on Sep. 10, 2008, provisional application No. 61/497,915, filed on Jun. 16, 2011, provisional application No. 61/515,824, filed on Aug. 5, 2011, provisional application No. 61/174,448, filed on Apr. 30, 2009, provisional application No. 61/229,705, filed on Jul. 29, 2009, provisional application No. 61/229,258, filed on Jul. 28, 2009, provisional application No. 60/826,207, filed on Sep. 19, 2006, provisional application No. 61/535,487, filed on Sep. 16, 2011.

(51) Int. Cl.
  G06T 15/00 (2011.01)
  G06F 9/48 (2006.01)
  G06F 17/50 (2006.01)
  G06T 15/06 (2011.01)
  G06F 17/30 (2006.01)
  G06F 9/30 (2006.01)

(52) U.S. Cl.
  CPC .......... G06F 17/5054 (2013.01); G06T 15/06 (2013.01); *G06F 9/30036* (2013.01); *G06F 17/30961* (2013.01); *G06T 2200/16* (2013.01); *G06T 2200/28* (2013.01); *G06T 2210/52* (2013.01)

(58) Field of Classification Search
  CPC ............... G06F 9/30167; G06F 9/3885; G06F 9/30145; G06F 9/4881; G06F 9/30036; G06F 9/3887; G06F 9/3009; G06F 9/3895; G06F 9/52; G06F 9/30014; G06F 9/28; G06F 9/30021; G06F 9/3802; G06F 9/3842; G06F 9/485; G06F 9/5066; G06F 9/30149; G06F 8/456; G06F 8/434; G06F 8/41; G06F 8/452; G06F 8/443; G06F 11/3466; G06F 11/3404; G06F 11/3409; G06F 11/3419; G06F 11/008; G06F 17/30256; G06F 17/2247; G06F 17/5054; G06F 17/30961
  See application file for complete search history.

(56) References Cited

U.S. PATENT DOCUMENTS

| | | | |
|---|---|---|---|
| 5,021,945 A * | 6/1991 | Morrison ................ G06F 8/445 712/216 |
| 5,313,568 A | 5/1994 | Wallace | |
| 5,815,698 A * | 9/1998 | Holmann ............ G06F 9/30058 712/237 |
| 5,819,088 A * | 10/1998 | Reinders ................ G06F 8/452 717/149 |
| 5,909,572 A * | 6/1999 | Thayer ................ G06F 9/30014 712/223 |
| 5,923,862 A * | 7/1999 | Nguyen ................... G06F 9/28 712/208 |
| 5,933,146 A | 8/1999 | Wrigley | |
| 5,961,628 A * | 10/1999 | Nguyen .............. G06F 9/30036 712/2 |
| 5,973,699 A | 10/1999 | Kent | |
| 6,023,279 A | 2/2000 | Sowizral et al. | |
| 6,028,608 A | 2/2000 | Jenkins | |
| 6,111,582 A | 8/2000 | Jenkins | |
| 6,173,366 B1 * | 1/2001 | Thayer ................ G06F 9/30014 375/E7.093 |
| 6,202,141 B1 * | 3/2001 | Diefendorff ........ G06F 9/30014 712/5 |
| 6,339,822 B1 * | 1/2002 | Miller ................ G06F 9/30149 711/125 |
| 6,344,837 B1 * | 2/2002 | Gelsey ............... G02B 27/2228 345/20 |
| 6,381,740 B1 * | 4/2002 | Miller .................... G06F 8/445 717/151 |
| 6,442,661 B1 * | 8/2002 | Dreszer ................ G06F 12/023 707/999.202 |
| 6,489,955 B1 | 12/2002 | Newhall, Jr. | |
| 6,493,810 B1 * | 12/2002 | Pang ................... H04L 67/2852 711/130 |
| 6,539,339 B1 * | 3/2003 | Berry ................... G06F 11/3466 702/182 |
| 6,556,200 B1 | 4/2003 | Pfister et al. | |
| 6,559,843 B1 | 5/2003 | Hsu | |
| 6,578,129 B1 * | 6/2003 | da Silva Junior ...... G06F 12/08 707/999.1 |
| 6,611,956 B1 * | 8/2003 | Ogawa .................... G06F 8/443 717/152 |
| 6,618,046 B1 * | 9/2003 | Srinivasa ........... G06Q 30/0283 345/418 |
| 6,658,564 B1 * | 12/2003 | Smith ................ G06F 17/5054 712/15 |
| 6,731,304 B2 | 5/2004 | Sowizral et al. | |
| 6,754,890 B1 * | 6/2004 | Berry ................ G06F 11/3409 717/128 |
| 6,760,833 B1 * | 7/2004 | Dowling ............... G06F 9/3842 711/105 |
| 6,829,697 B1 * | 12/2004 | Davis .................. G06F 15/7864 712/21 |
| 6,904,594 B1 * | 6/2005 | Berry ................ G06F 11/3404 717/130 |
| 6,961,930 B1 * | 11/2005 | Waldspurger ....... G06F 11/3419 717/131 |
| 7,009,608 B2 | 3/2006 | Pharr et al. | |
| 7,012,604 B1 | 3/2006 | Christie et al. | |
| 7,030,879 B1 | 4/2006 | Pharr | |
| 7,098,907 B2 | 8/2006 | Houston et al. | |
| 7,212,207 B2 | 5/2007 | Green | |
| 7,250,948 B2 | 7/2007 | Hayes | |
| 7,269,715 B2 * | 9/2007 | Le .......................... G06F 9/3802 712/215 |
| 7,289,118 B2 | 10/2007 | Schmittler et al. | |
| 7,348,975 B2 | 3/2008 | Reshetov et al. | |
| 7,362,332 B2 | 4/2008 | Gritz | |
| 7,401,333 B2 * | 7/2008 | Vandeweerd ......... G06F 9/5066 712/16 |
| 7,412,532 B2 * | 8/2008 | Gondhalekar ... H04N 21/23617 370/264 |
| 7,483,024 B2 | 1/2009 | Maillot | |
| 7,570,180 B2 * | 8/2009 | Osorio ................ G06F 17/2247 341/51 |
| 7,688,320 B2 | 3/2010 | Shearer | |
| 7,739,667 B2 * | 6/2010 | Callahan, II ........ G06F 11/3404 717/127 |
| 7,782,318 B2 | 8/2010 | Shearer | |
| 7,830,379 B2 | 11/2010 | Peterson et al. | |
| 8,205,200 B2 * | 6/2012 | Liao ...................... G06F 9/4881 712/220 |
| 8,520,740 B2 * | 8/2013 | Flachs .................... H04N 19/13 375/240.25 |
| 8,832,417 B2 * | 9/2014 | Chen ...................... G06F 9/3887 712/22 |
| 2002/0019928 A1 * | 2/2002 | Saulsbury ........... G06F 9/30021 712/222 |
| 2002/0029357 A1 * | 3/2002 | Charnell .................. G06F 8/4442 714/5.11 |
| 2002/0067857 A1 * | 6/2002 | Hartmann .......... G06F 17/30256 382/224 |
| 2002/0100029 A1 * | 7/2002 | Bowen .................... G06F 8/41 717/140 |

(56) References Cited

U.S. PATENT DOCUMENTS

| | | | |
|---|---|---|---|
| 2002/0129343 A1* | 9/2002 | Pinter | G06F 8/434 717/140 |
| 2004/0025144 A1* | 2/2004 | Yang | G06F 11/3612 717/128 |
| 2004/0073773 A1* | 4/2004 | Demjanenko | G06F 9/30036 712/7 |
| 2004/0078780 A1* | 4/2004 | Dutt | G06F 8/456 717/106 |
| 2004/0078785 A1* | 4/2004 | Dutt | G06F 8/445 717/136 |
| 2004/0181652 A1* | 9/2004 | Ahmed | G06F 9/30036 712/215 |
| 2004/0249809 A1 | 12/2004 | Ramani et al. | |
| 2005/0050305 A1* | 3/2005 | Kissell | G06F 8/4442 712/220 |
| 2005/0125795 A1* | 6/2005 | Kissell | G06F 8/4442 718/100 |
| 2005/0144602 A1* | 6/2005 | Ngai | G06F 8/41 717/151 |
| 2005/0149697 A1* | 7/2005 | Enright | G06F 9/3009 712/214 |
| 2005/0166038 A1* | 7/2005 | Wang | G06F 9/30145 712/226 |
| 2005/0198644 A1* | 9/2005 | Jiang | G06F 9/52 718/107 |
| 2005/0206649 A1* | 9/2005 | Whitaker | G06F 9/3895 345/571 |
| 2005/0210178 A1* | 9/2005 | Klingman | G06F 9/485 711/1 |
| 2005/0257078 A1* | 11/2005 | Bose | G06F 11/008 714/1 |
| 2005/0264568 A1 | 12/2005 | Keller | |
| 2006/0004996 A1* | 1/2006 | Gonion | G06F 8/443 712/241 |
| 2006/0098009 A1* | 5/2006 | Zuniga | G06F 17/30961 345/421 |
| 2006/0112377 A1* | 5/2006 | Nacul | G06F 8/456 717/140 |
| 2006/0139350 A1 | 6/2006 | Reshetov | |
| 2007/0035545 A1 | 2/2007 | Hempel et al. | |
| 2007/0124732 A1* | 5/2007 | Lia | G06F 9/4881 718/102 |
| 2007/0132754 A1 | 6/2007 | Reshetov et al. | |
| 2008/0024489 A1 | 1/2008 | Shearer | |
| 2008/0028154 A1 | 1/2008 | Hoover | |
| 2008/0028403 A1 | 1/2008 | Hoover | |
| 2008/0049017 A1 | 2/2008 | Shearer | |
| 2008/0074420 A1 | 3/2008 | Kuesel | |
| 2008/0074421 A1 | 3/2008 | Hayes | |
| 2008/0088622 A1 | 4/2008 | Shearer | |
| 2008/0122841 A1 | 5/2008 | Brown | |
| 2008/0122845 A1 | 5/2008 | Brown et al. | |
| 2008/0129734 A1 | 6/2008 | Seung-Woo et al. | |
| 2008/0180442 A1 | 7/2008 | Brown et al. | |
| 2008/0211804 A1 | 9/2008 | Hempel et al. | |
| 2009/0102844 A1 | 4/2009 | Deparis | |
| 2009/0167763 A1* | 7/2009 | Waechter | G06T 15/06 345/426 |
| 2009/0183167 A1 | 7/2009 | Kupferschmidt et al. | |
| 2009/0189898 A1* | 7/2009 | Dammertz | G06T 15/06 345/426 |
| 2010/0194751 A1 | 8/2010 | Wald et al. | |
| 2012/0057637 A1* | 3/2012 | Flachs | H04N 19/13 375/240.25 |
| 2013/0061027 A1* | 3/2013 | Chen | G06F 9/3887 712/234 |

FOREIGN PATENT DOCUMENTS

| | | |
|---|---|---|
| WO | 2007090974 A | 8/2007 |
| WO | WO2008037599 | 4/2008 |

OTHER PUBLICATIONS

David J. Lilja et al., Exploiting the Parallelism Available in Loops, Nov. 30, 1994, [Retrieved on Nov. 21, 2016]. Retrieved from the internet: <URL: http://citeseerx.ist.psu.edu/viewdoc/download-?doi=10.1.1.48.8439&rep=rep1&type=pdf> 43 Pages (1-43).*

Haitham Akkary et al., A Dynamic Multithreading Processor, 1998 IEEE, [Retrieved on Nov. 21, 2016]. Retrieved from the internet: <URL: http://dl.acm.org/citation.cfm?id=290988> 10 Pages (226-236).*

Roni Yagel and John Meeker, "Priority-driven Ray Tracing," The Journal of Visualization and Computer Animation, vol. 8, No. 1, pp. 17-32, Jan. 1, 1997.

Russel E. Caflisch and Bradley Moskowitz, "Modified Monte Carlo Methods Using Quasi-Random Sequences," Lecture Notes in Statistics 106, Dec. 1994, Mathematics Department, UCLA, Los Angeles, CA.

Spjut "TRaX: A Multi-Threaded Architecture for Real-Time Ray Tracing" Application Specific Processors, 2008. SASP 2008. pp. 108-114.

Stefan Heinrich and Alexander Keller, "Quasi-Monte Carlo Methods in Computer Graphics, Part I: The QMC Buffer," Technical Report 242/94, Fachbereich Informatik, AG Numerische Algorithmen, Universit at Kaisersiautern, 1994.

Stefan Heinrich and Alexander Keller, "Quasi-Monte Carlo Methods in Computer Graphics, Part II: The Radiance Equation," Technical Report 243/94, Fechbereich Informatik, AG Numerische Algorithmen, Universit at Kaisersiautern, 1994.

Sugerman, "GRAMPS: A Programming Model for Graphics Pipelines", ACM Transactions on Graphics, vol. 28, No. 1, Article 4, Publication date: Jan. 2009.

Susumu, H., Katahira, M., Nakada, T., Parallel processing of incremental ray tracing on a shared-memory multiprocessor, 1993, The Visual Computer, vol. 9, No. 7, pp. 371-380.

Sven Woop, Jorg Schmittler and Philipp Slusallek, "RPU: A Programmable Ray Processing Unit for Realtime Ray Tracing," ACM Transactions on Graphics (TOG), vol. 24, Issue 3, (Jul. 2005), Proceedings of ACM SIGGRAPH 2005, session: Hardware rendering, pp. 434-444, 2005.

W.R. Mark and D. Fussell, "Real-Time Rendering Systems in 2010," The University of Texas at Austin, Department of Computer Sciences, Technical Report # TR-05-18, May 2, 2005. (Available at http://www-csl.csres.utexas.edu/users/billmark/papers/rendering2010-TR/TR-05-18-Rendering2010.pdf, last visited Jan. 7, 2008.).

Wilfrid Lefer "An Efficient Parallel Ray Tracing Scheme for Distributed Memory Parallel Computers," Oct. 25, 1993, Parallel Rendering Symposium, 1993 San Jose, CA, USA Oct. 25-26, 1993, New York, NY, USA, IEEE, pp. 77-80.

William J. Morokoff and Russel E. Caflisch, "Quasi-Monte Carlo Integration," Journal of Computational Physics, vol. 122, Issue 2, Dec. 1995, pp. 218-230,1995, published by Academic Press Professional, Inc., San Diego, CA.

William J. Morokoff and Russel E. Caflisch, "Quasi-random sequences and Their discrepancies," SIAM Journal on Scientific Computing, vol. 15, Issue 6, Nov. 1994, pp. 1251-1279, Philadelphia, PA.

A. Augusto de Sousa and F. Nunes Ferreira, "A Scalable Implementation of an Interactive Increasing Realism Ray-Tracing Algorithm," Vector and Parallel Processing—VECPAR '96. Second International Conference on Vector and Parallel Processing—Systems and Applications. Selected Papers Springer-Verlag Berlin, Germany, 1997, pp. 458-469.

A.J. van der Pioeg, "Interactive Ray Tracing, the replacement of rasterization?" B.Sc. thesis, VU University Amsterdam, The Netherlands, Dec. 2006. (Available at http://www.cs.vu.nl/.about.kielmann/theses/avdpioeg.pdf, last visted on Mar. 31, 2008.).

Andreas Dietrich, Ingo Wald, Carsten Benthin and Philipp Slusallek, "The OpenRT Application Programming Interace—Towards a Common API for Interactive Ray Tracing—" OpenSG, Darmstadt, Germany (Available online at http://graphics.cs/uni-sb.

(56) References Cited

OTHER PUBLICATIONS de/fileadmin/cgunds/papers/2003/opensg03/The- OpenRTAPI.sub.--OpenSG2003.ppt, last visited Sep. 21, 2009).
Andreas Dietrich, Ingo Wald, Carsten Benthin and Philipp Slusallek, "The OpenRT Application Programming Interface—Towards a Common API for Interactive Ray Tracing—" OpenSG 2003, Darmstadt, Germany (Available online at http://graphics.cs.uni-sb.de/fileadmin/cguds/papers/2003/opensg-03/TheOpenRTAPI.sub.--OpenSG2003.ppt, last visited Sep. 21, 2009).
C. Benthin, I. Wald M. Scherbaum and H. Friedrich, "Ray Tracing on the Cell Processor," IEEE Symposium on Interactive Ray Tracing 2006, Sep. 18-20, 2006. pp. 15-23, Salt Lake City, UT.
Carsten Benthin, PhD thesis: "Realtime Ray Tracing on Current CPU Architectures," Saarland University Saarbrucken, Germany, Jan. 2006. (Available at graphics.cs.uni-sb.de/.about.benthin/phd.pdf, last visited on Jan. 7, 2008.).
Christian Lauterbach, Sung-Eui Yoon, David Tuft and Dinesh Manocha, "RT-DEFORM: Interactive Ray Tracing of Dynamic Scenes using BVHs," In Proceedings of the 2006 IEEE Symposium on Interactive Ray Tracing, Salt Lake City, UT, Sep. 18-20, 2006.
David R. Chapman, "High Definition Interactive Animated Ray Tracing on CELL Processor using Coherent Grid Traversal," Class final project paper, CMSC 635: Advanced Computer Graphics, Computer Science and Electrical Engineering, University of Maryland, Baltimore County, Baltimore, MD (Available online at http://www.csee.umbc.edu/.about.olano/635s07/dchapm2.pdf, last vistied Oct. 30, 2009).
E. Groller and W. Purgathofer, "Coherence in Computer Graphics," Institute for Computer Graphics, Technical University Vienna, Vienna. Austria, Trans. on Information and Communication Technologies, vol. 5, 1993 WIT Press.
E. Mansson, J. Munkberg and T. Akenine-Moller, "Deep Coherent Ray Tracing," RT 07—Symposium on Interactive Ray Tracing 2007, Sep. 10-12, 2007, pp. 749-785. (Available at http://graphics.cs.ith.se/research/papers/2007/deepcoh/deepcoherent.pdf, last vistited Jan. 7, 2008.).
Eric Haines, "Ray Tracing News: Light Makes Right" [Online], vol. 2, No. 8, Oct. 27, 1989, Retrieved from the Internet: URL:http://tog/acm.org/resources/RTNews/html/rtnews9a.html> [retrieved on Oct. 26, 2009].
Eric Haines, Ray Tracing News: "Light Makes Right," vol. 12, No. 2, Dec. 21, 1999. Retrieved from the Internet: http://tog.acm.org/resources/RTNews/html/rtnv12n2.html#art3 [retrieved on Mar. 10, 2008].
Eric Haines, Ray Tracing News: "Light Makes Right," vol. 3, No. 1, Jan. 2, 1990. Retrieved from the Internet: URL:http://log.acm.org/resources/RTNews/html/rtnv3n1.html [retrieved on Jul. 28, 2009].
Eric Haines, Ray Tracing News: "Light Makes Right," vol. 3, No. 1, Jan. 2, 1990. Retrieved from the Internet: URL:http://tog.acm.org/resources/RTNews/html/rtnv3n1.html [retrieved on Jul. 28, 2009].
Eric Lafortune, "Mathematical Models and Monte Carlo Algorithms for Physically Based Rendering," Ph. D. thesis, Department of Computer Science, Faculty of Engineering, Katholieke Universiteit Leuven, Feb. 1996.
Eric Larsen, Stefan Gottschalk, Ming C. Lin, and Dinesh Manocha, "Fast Distance Queries with Rectangular Swept Sphere Volumes," Proceedings of IEEE International Conference on Robotics and Automation, San Francisco, CA, 2000, vol. 4, pp. 3719-3726.
F James, "Monte Carlo theory and practice," Reports on Progress in Physics, vol. 43, 1980, pp. 1145-1189, The Institute of Physics, Great Britain.
Frederic Cazals, George Drettakis and Claude Puech, "Filtering, Clustering and Hierarchy Construction: a New Solution for Ray-Tracing Complex Scenes," Computer Graphics Forum (Eurographics '95) 14, 3.
G. Humphreys and C.S. Ananian, "TigerSHARK: A Hardware Accelerated Ray-Tracing Engine," Technical report, Princeton University, Princeton, NJ, May 14, 1996. (Available at citeseer.ist.psu.edu/article/humphreys96tigershark.html, last visited on Jan. 7, 2008.).
Geoff Wyvill, "Practical Ray Tracing," Computer Graphics International 1995, Tutorial notes.
H. Du, M. Sanchez-Elez, N. Tabrizi, N. Bagherzadeh, M.L. Anido and M. Fernandez, "Interactive Ray Tracing on Reconfigurable SIMD MorphoSys," Proceedings of the Design, Automation and Test in Europe Conference and Exhibition, 2003, Asia and South Pacific Jan. 21-24, 2003, pp. 471-476.
H. Friedrich, J. Gunther, A. Dietrich, M. Scherbaum, H-P Seidel and P. Slusallek, "Exploring the Use of Ray Tracing for Future Games," Proceedings of the 2006 ACM SIGGRAPH symposium on Videogames, Boston, MA, pp. 41-50, 2006.
Hank Weghorst, Gary Hooper and Donald P. Greenberg, "Improved Computational Methods for Ray Tracing," ACM Transactions on Graphics (TOG), Jan. 1984, vol. 3, issue 1, pp. 52-69.
I. Wald and P. Slusallek, "State of the Art in Interactive Ray Tracing," In State of the Art Reports, EUROGRAPHICS 2001, pp. 21-42, 2001.
I. Wald, C. Gribble, S. Boulos and A. Kensler, "SIMD Ray Stream Tracing—SMID Ray Traversal with Generalized Ray Packets and On-the-fly Re-Ordering," SCI Institue Technical Report No. UUSCI-2007-012, 2007.
I. Wald, P. Slusallek and C. Benthin, "Interactive Distributed Ray Tracing of Highly Complex Models," Rendering Techniques 2001—Proceedings of the 12th EUROGRAPHICS Workshop on Rendering, pp. 274-285, London, England, Jun. 2001.
I. Wald, P. Slusallek, C. Benthin and M. Wagner, "Interactive Rendering with Coherent Ray Tracing," Computer Graphics Forum, Proceedings of Eurographics 2001, vol. 20, No. 3, 2001.
J. Fender and J. Rose, "A High-Speed Ray Tracing Engine Built on a Field-Programmable System," Proceedings of the 2003 IEEE International Conference on Field-Programmable Technology (FPT), Dec. 15-17, 2003, pp. 188-195.
J. Hanika and A. Keller, "Towards Hardware Ray Tracing using Fixed Point Arithmetic," IEEE/EG Symposium on Interactive Ray Tracing, 2007, Sep. 10-12, 2007, Ulm, Germany, pp. 119-128.
J.G. Cleary, B.M. Wyvill, G.M. Birtwistie and R. Vatli, "Multiprocessor Ray Tracing," Computer Graphics Forum, vol. 5, issue 1, pp. 3-12, 1986.
James Arvo and David Kirk, "Fast Ray Tracing by Ray Classification," ACM SIGGRAPH Computer Graphics 21 (4), Jul. 1987, pp. 55-64.
James Bigler, Abe Stephens and Steven G. Parker, "Design for Parallel Interactive Ray Tracing Systems," Proceedings of the IEEE Symposium on Interactive Ray Tracing, 2006, pp. 187-196.
James T. Klosowski, Martin Held, Joseph S.B. Mitchell, Henry Sowizral and Karel Zikan, "Efficient Collision Detection Using Bounding Volume Hierarchies of k-DOPs," IEEE Transactions on Visualization and Computer Graphics, Jan. 1998, vol. 4, issue 1, pp. 21-36.
Jeffrey A. Mahovsky, "Ray-Tracing with Reduced-Precision Bounding Volume Hierarchies," PhD thesis, University of Calgary, Alberta, Canada, 2005. (Available at http://pages.cpsc.ucalgary.ca/.about.brosz/theses/PhD%20Thesis%20-%202005-%20-%20Jeffrey%20Mahovsky%20-%20Ray%20Tracing%20with%20Reduced-Precision%2- 0Bounding%20Volume%20Hierarchies.pdf, last visited on Mar. 31, 2008).
John Amanatides, "Ray Tracing with Cones," ACM SIGGRAPH Computer Graphics 18(3), Jul. 1984, pp. 129-135.
Jorg Schmittler, Ingo Wald, and Philipp Slusallek, "SaarCOR—A Hardware Architecture for Ray Tracing," Proceedings of the ACM SIGGRAPH/EUROGRAPHICS conference on Graphics hardware, Saarbrucken, Germany, Session: Ray tracing vs. scan conversion, pp. 27-36, 2002.
K. R. Subramanian and Donald S. Fussell, "A Search Structure based on K-d Trees for Efficient Ray Tracing," PhD thesis, The University of Texas at Austin, Dec. 1990.
Kenneth I. Joy and Murthy N. Bhetanabhotla, "Ray Tracing Parametric Surface Patches Utilizing Numerical Techniques and Ray Coherence," ACM SIGGRAPH Computer Graphics 20(4), Aug. 1986, pp. 279-285.

(56) References Cited

OTHER PUBLICATIONS

M. Pharr, C. Kolb, R. Gershbein and P. hanrahan, "Rendering Complex Scenes with Memory-Coherent Ray Tracing," in Computer Graphics, vol. 31, pp. 101-108, Aug. 1997, ACM Siggraph 1997 Conference Proceedings.

M. Sanchez-Elez, H. Du, N. Tabrizi, Y. Long, N. Bagherzadeh and M. Fernandez, "Algorithm Optimizations and Mapping Scheme for Interactive Ray Tracing on a Reconfigurable Architecture," Computers & Graphics 27(5), 2003, pp. 701-713.

M. Shinya, T. Takahashi and S. Naito, "Principles and Applications of Pencil Tracing," ACM SIGGRAPH Computer Graphics 21(4), Jul. 1987, pp. 45-54.

M.L. Anido, N. Tabrizi, H. Du, M. Sanchez-Elez M and N. Bagherzadeh, "Interactive Ray Tracing Using a SIMD Reconfigurable Architecture," Proceedings of the 14th Symposium on Computer Architecture and High Performance Computing, 2002, pp. 20-28.

Martin Christen, "Ray Tracing on GPU," Master's thesis, Univ. of Applied Sciences Basel (FHBB), Jan. 19, 2005 (Available online at http://gpurt.sourceforge.net/DA07.sub.--0405.sub.-- Ray.sub.-- Tracing.sub.--on.sub.--GPU-1.0.5.pdf, last visited Dec. 10, 2009).

Masataka Ohta and Mamoru Maekawa, "Ray-bound tracing for perfect and efficient anti-aliasing," The Visual Computer: International Journal of Computer Graphics, vol. 6, issue 3, Springer Berlin / Heidelberg, May 1990, pp. 125-133.

N. Thrane and L.O. Simonsen, "A Comparison of Acceleration Structures for GPU Assisted Ray Tracing", Masters thesis, University of Aarhus, Denmark, Aug. 1, 2005. (Available at http://www.larsole.com/files/GPU.sub.--BVHthesis.pdf, last visited on Jan. 7, 2008.).

P.A. Navratil, D. S. Fussell, C. Lin and W. R. Mark, "Dynamic Ray Scheduling to Improve Ray Coherence and Bandwidth Utilization," IEEE Symposium on Interactive Ray Tracing, 2007, Sep. 10-12, 2007, pp. 95-104.

P. H. Christensen, J. Fong, D. M. Laur and Dana Batali, "Ray Tracing for the Movie 'Cars'," IEEE Symposium on Interactive Ray Tracing, 2006, pp. 1-6.

P.A. Navratil, D.S. Fussell and C. Lin, "Dynamic Ray Scheduling for Improved System Performance," The University of Texas at Austin, Department of Computer Sciences, Technology Report #TR-07-19, Apr. 12, 2007. (Available at http://www.cs.utexas.edu/.about.pnav/papers/utcs-tr-07-19/utcs-tr-07-19.p- df, last visited Jan. 7, 2008.).

Paul S. Heckbert and Pat Hanrahan, "Beam Tracing Polygonal Objects," ACM SIGGRAPH Computer Graphics 18(3), Jul. 1984, pp. 119-127.

Peter Shirley, Changyaw Wang and Kurt Zimmerman "Monte Carlo Techniques for Direct Lighting Calculations," ACM Transactions on Graphics, vol. 15, Issue 1, Jan. 1996, pp. 1-36, ACM, New York, New York.

\* cited by examiner

FIG. 8a Packet 180

FIG. 8b Packet 181

FIG. 8c Packet 182

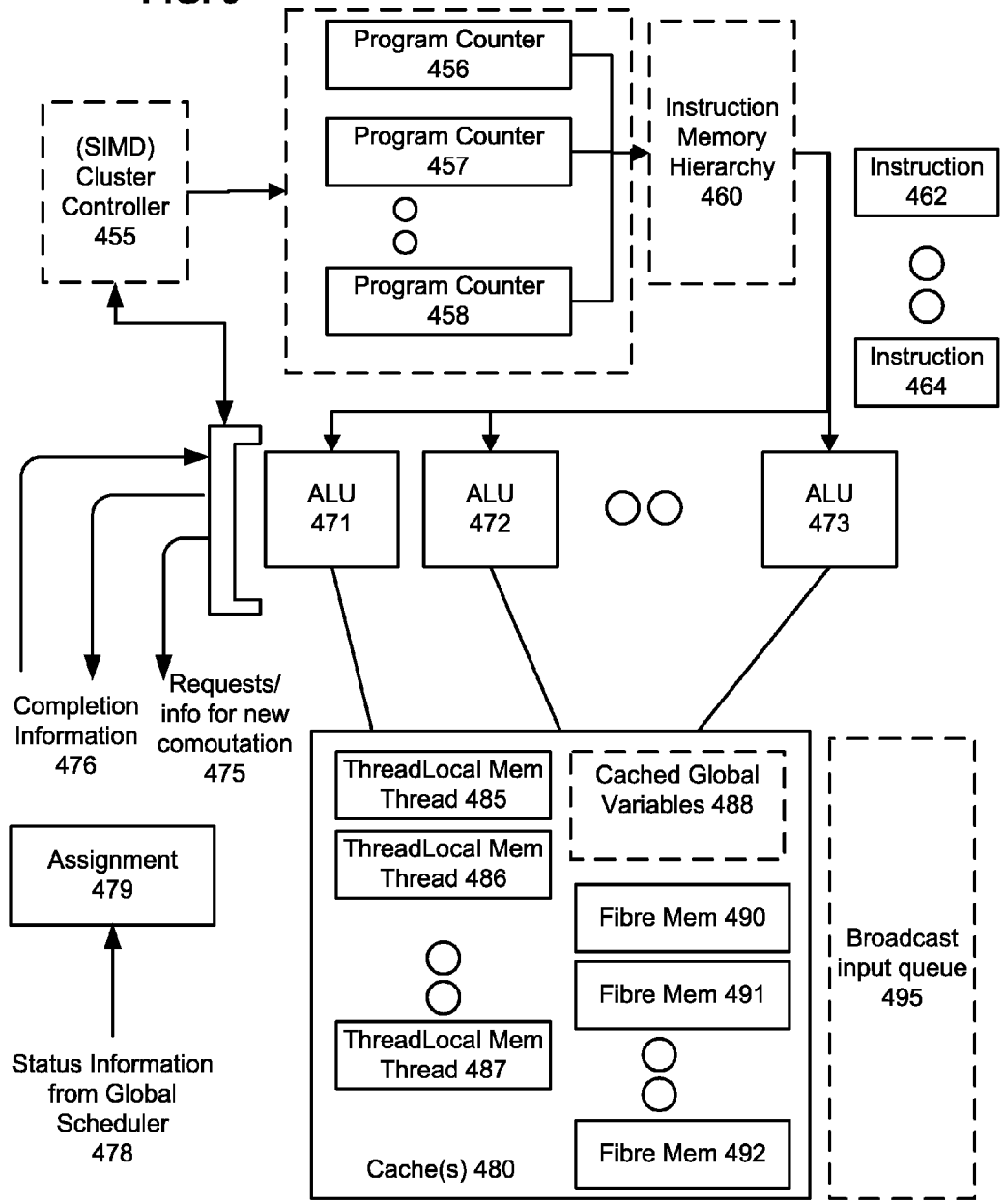

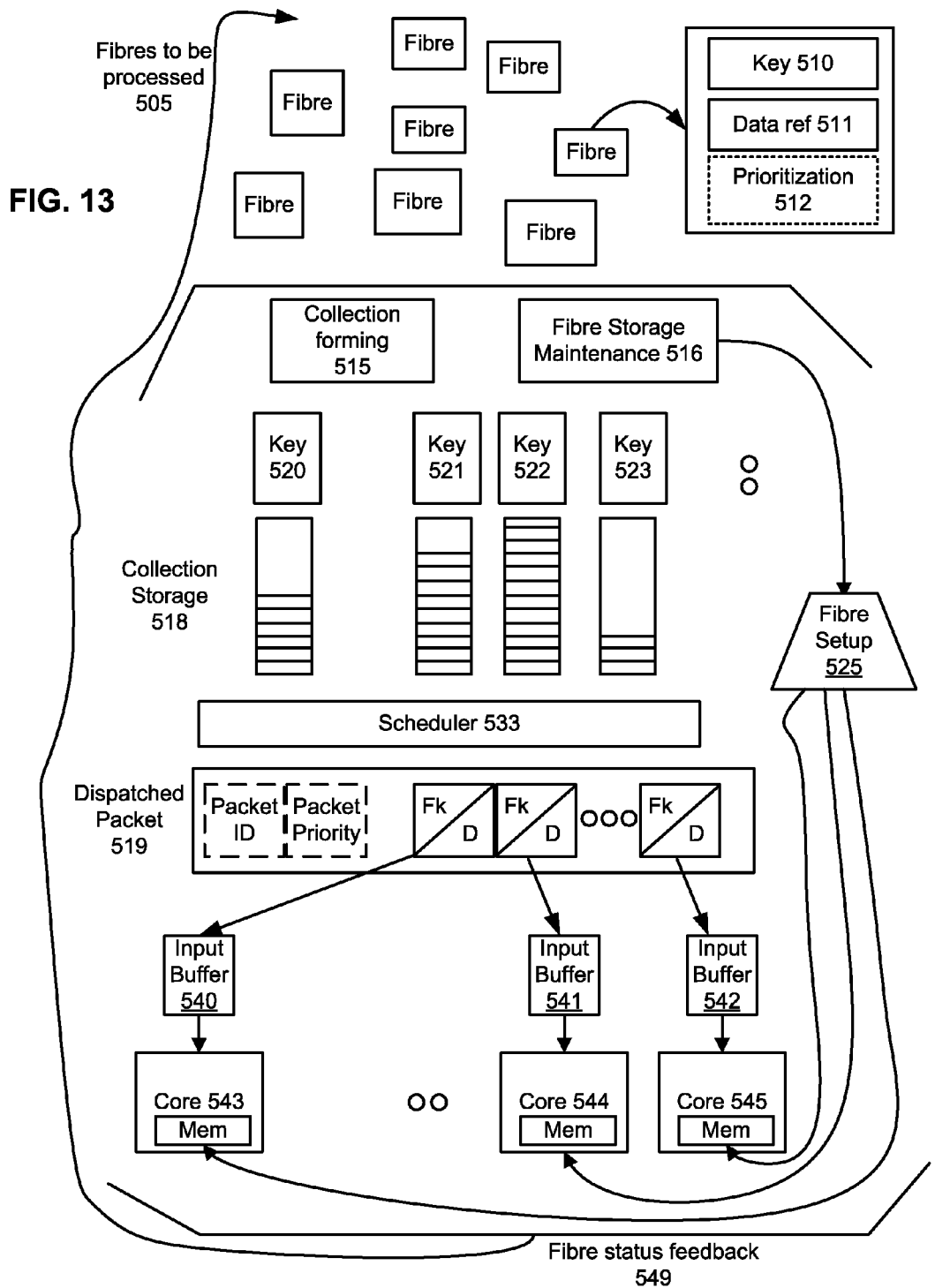

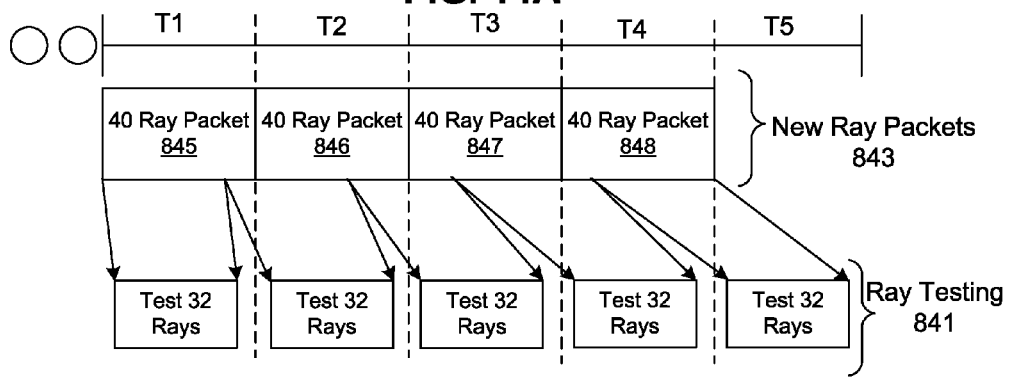
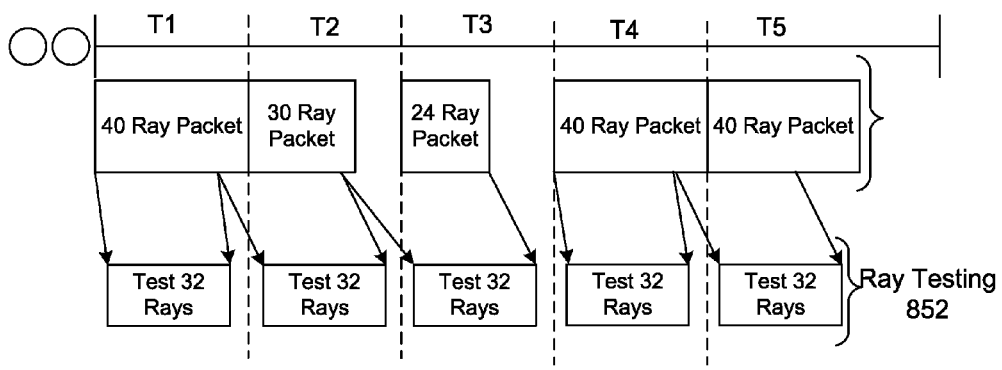
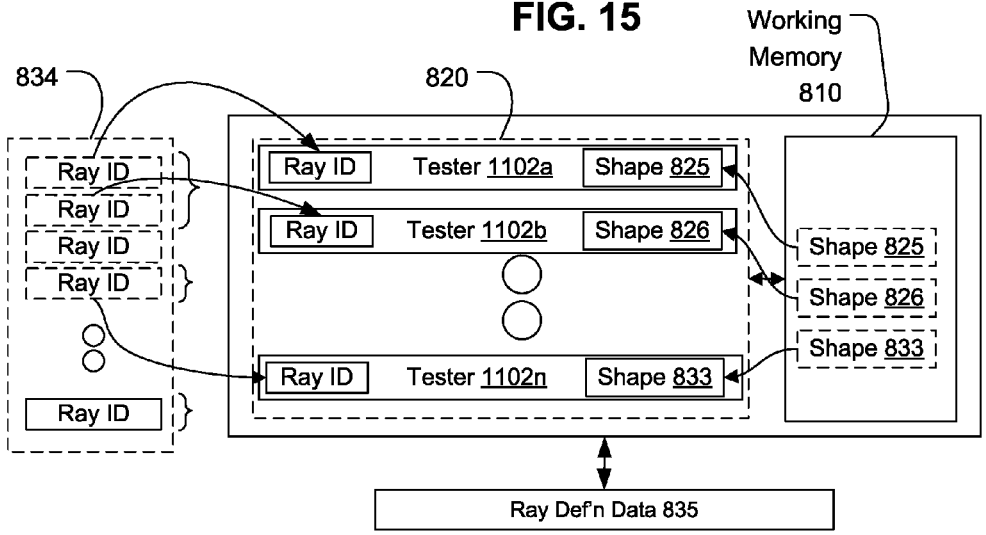

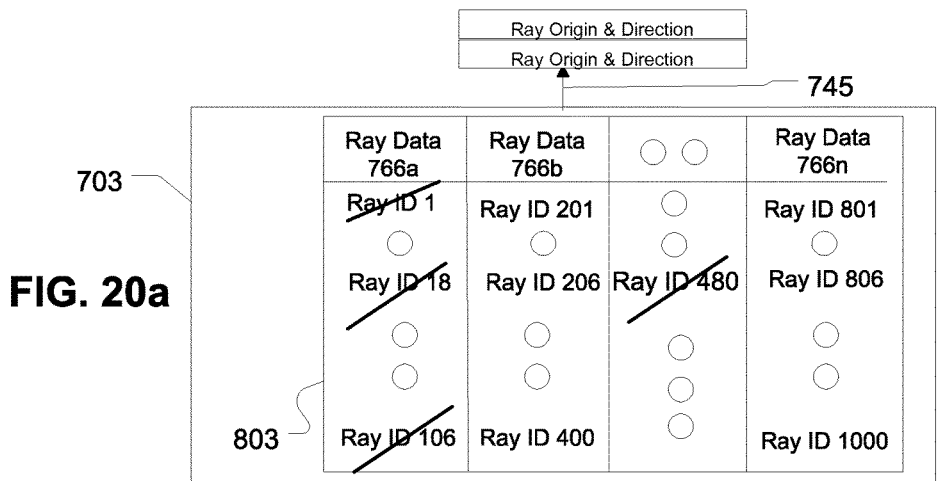
FIG. 20a
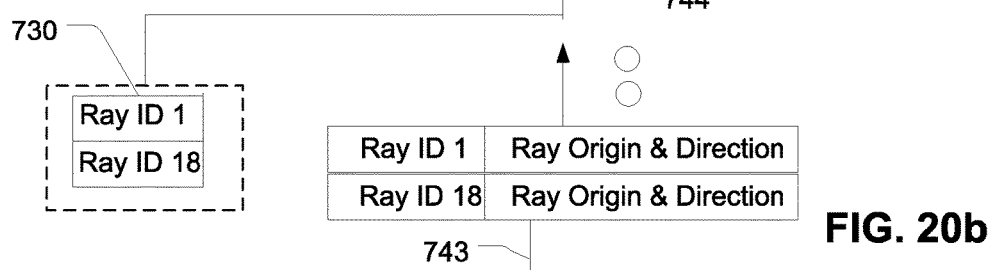
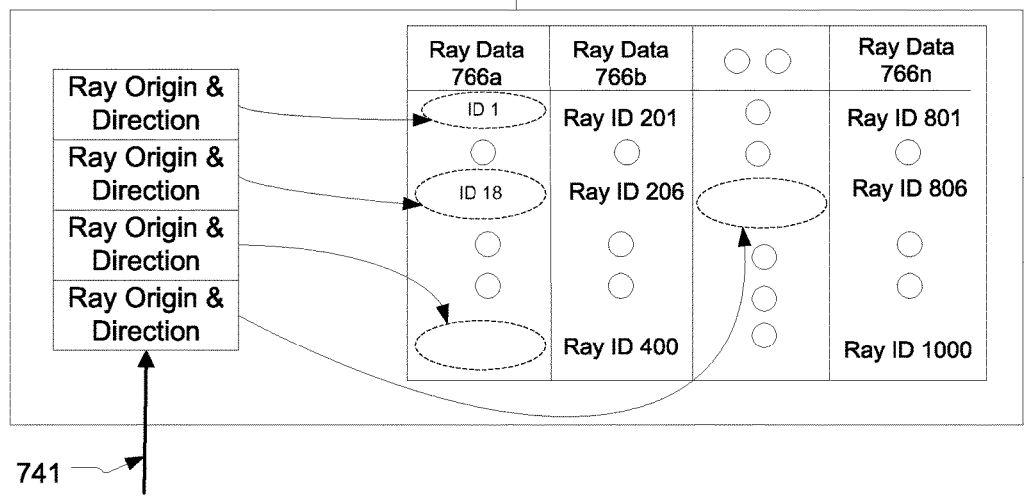
FIG. 20b

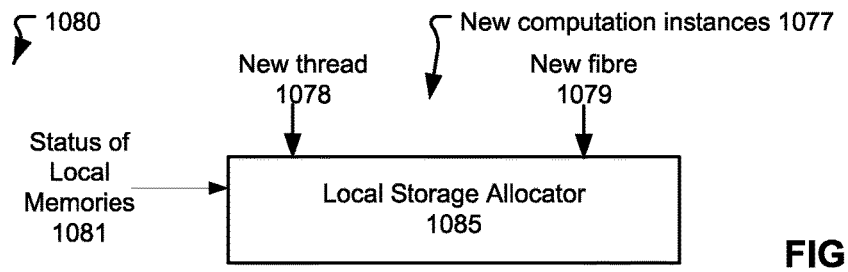
FIG. 21
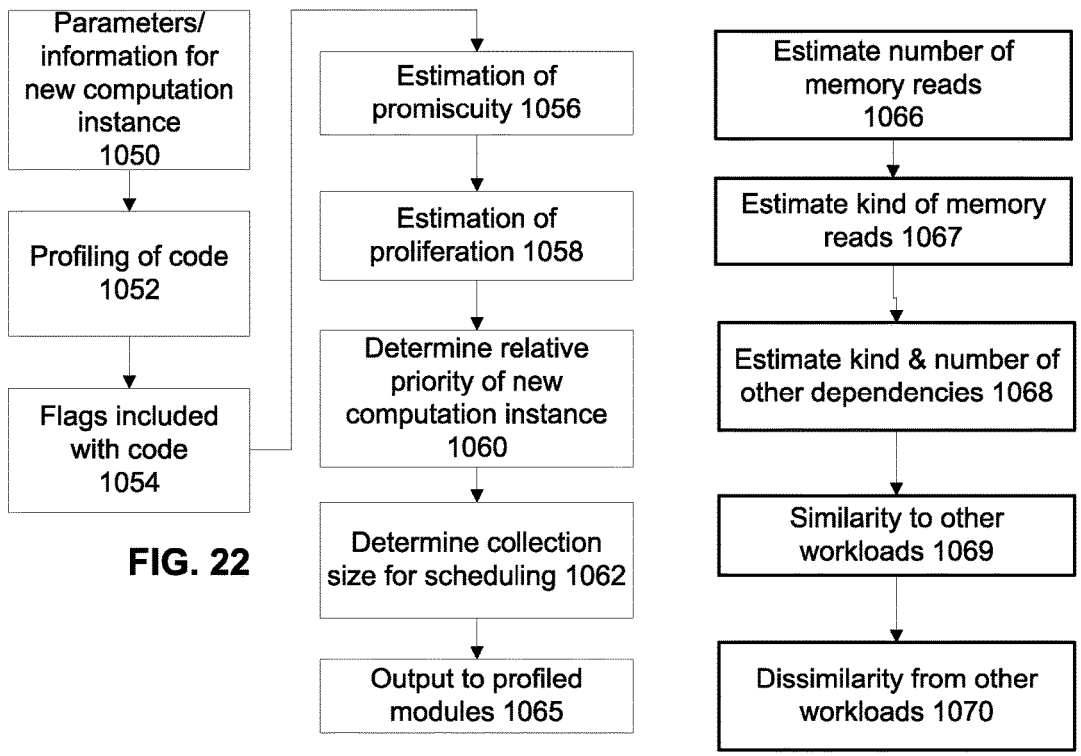
FIG. 22
FIG. 23
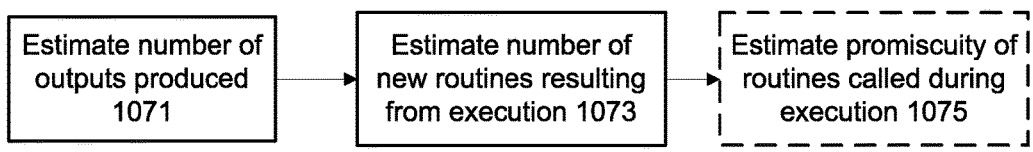
FIG. 24

| Module | Promiscuity | Proliferation | Coherence size | Instance count |
|---|---|---|---|---|
| Module ID 905<br>Module ID 906<br>Module ID 907 ↓ | Indicator 910 ↓ | Indicator 911 ↓ | Indicator 912 ↓ | Indicator 913 ↓ |

FIG. 27

| Cluster | Trig 922 | DP FP 924 | Transcendental 925 |
|---|---|---|---|
| Cluster 920 ↓ | ↓ | ↓ | ↓ |

| Code Module ID | Memory Range 915 |
|---|---|
| Code Module 918 ↓ | ↓ |

US 9,665,970 B2

VARIABLE-SIZED CONCURRENT GROUPING FOR MULTIPROCESSING

CROSS REFERENCE TO RELATED CASES

This application is a continuation-in-part of U.S. patent application Ser. No. 12/771,408, filed on Apr. 30, 2010, which is a continuation-in-part of U.S. patent application Ser. No. 12/408,478, filed on Mar. 20, 2009, now U.S. Pat. No. 7,830,379, which is a continuation-in-part of U.S. patent application Ser. No. 11/856,612, which was filed on Sep. 17, 2007, now U.S. Pat. No. 7,969,424, and claims priority from and incorporates U.S. Prov. App. No. 60/826,201, entitled "Ray Tracing Enhancements for Graphical Rendering", filed on Sep. 19, 2006; this application also claims priority from U.S. Prov. App. No. 61/497,915, filed on Jun. 16, 2011, from U.S. Prov. App. No. 61/515,824 filed on Aug. 5, 2011, and from U.S. Prov. App. No. 61/535,487, filed on Sep. 16, 2011; U.S. patent application Ser. No. 12/408,478 also claims priority from U.S. Prov. App. No. 61/038,731, entitled "Coupling Ray Storage and Compute for Memory-Efficient Ray Intersection Test Scaling", filed on Mar. 21, 2008, and from U.S. Prov. App. No. 61/095,890, entitled "Architectures for Parallelized Intersection Testing and Shading for Ray-Tracing Rendering", filed on Sep. 10, 2008; U.S. patent application Ser. No. 12/771,408 also claims priority from U.S. Prov. App. No. 61/174,448 filed on Apr. 30, 2009, entitled "Dynamic Ray Population Control", and from U.S. Prov. App. No. 61/229,258, filed on Jul. 28, 2009 and from U.S. Prov. App. No. 61/229,705, filed on Jul. 29, 2009, both entitled "Ray Tracing System Architectures and Methods"; all applications referenced above are incorporated by reference in their entirety, for all purposes, herein.

BACKGROUND

Field

Rendering photo-realistic 2-D images from 3-D scene descriptions with ray tracing is well-known in the computer graphics arts. Ray tracing is known to produce photo-realistic images, including realistic shadow and lighting effects, because ray tracing can model the physical behavior of light interacting with elements of a scene. Ray tracing usually involves obtaining a scene description composed of geometric shapes, which describe surfaces of structures in the scene, and can be called primitives. A common primitive shape is a triangle. Objects can be composed of one or more such primitives. Objects can be composed of many thousands, or even millions of such primitives. Scenes typically contain many objects. Resolution of displays and the media to be displayed thereon continue to increase. Ray tracing requires repeating a few calculations many times with different data (e.g. intersection testing), as well as executing special purpose code ("shading") for identified ray intersections.

Ray tracing calculations can be parallelized relatively easily at the level of pixels of a frame being rendered, because a great many of these calculations are independent of each other, or have well-characterized dependencies. However, other portions of the calculation are not so easily parallelized. However, parallelizing other portions of the ray tracing problem present a different parallelization challenge. More broadly, ray tracing is an example work load among a variety of workloads that can benefit from practical increases in throughput and/or quality of rendering available within given computation parameters. As such, provision of different computing architectures and components thereof continues to be an active area research and development in furtherance of such goals.

BRIEF DESCRIPTION OF THE DRAWINGS

FIG. 8a-8c depict examples of packet formats that can be generated and used in systems according to the disclosure;

FIG. 9 depicts an example architecture of a cluster that can be provided in systems according to the disclosure;

FIG. 13 depicts an example computation architecture by which computation instances are collected according to scheduling keys and dispatched as packets that are fragmented for processing among a plurality of processing elements;

FIGS. 14A and 14B depict aspects of an example where packets are variable in size, and which at least some can have a number of instances in excess of what can be concurrently processed in available processor elements;

FIG. 15 depicts an example intersection tester architecture that can be used in disclosed examples;

FIG. 20a 20b depict aspects of providing identifiers for computation instances (e.g., ray intersection tasks) to be in systems according to the disclosure;

FIG. 21 depicts a local storage allocator functional component that can be implemented in systems according to the disclosure;

FIG. 22 depicts an example process of profiling computation instances in order to allocate storage or other resources for use in execution the computation instances;

FIG. 23 depicts a process of characterizing data access by a computation instance being profiled;

FIG. 24 depicts an example process of characterizing a compute workload proliferation attributable to an instance being profiled;

FIG. 27 depict storage of data that can be used in local storage allocation, and which can be derived by profiling code modules, for which instances have storage allocated for execution;

FIG. 28 depict aspects of cluster characteristics that may be used in local storage allocation;

FIG. 29 depicts a correspondence between code modules and memory ranges, for use in determining memory to be allocated to instances of the code modules.

SUMMARY

Figure 1:
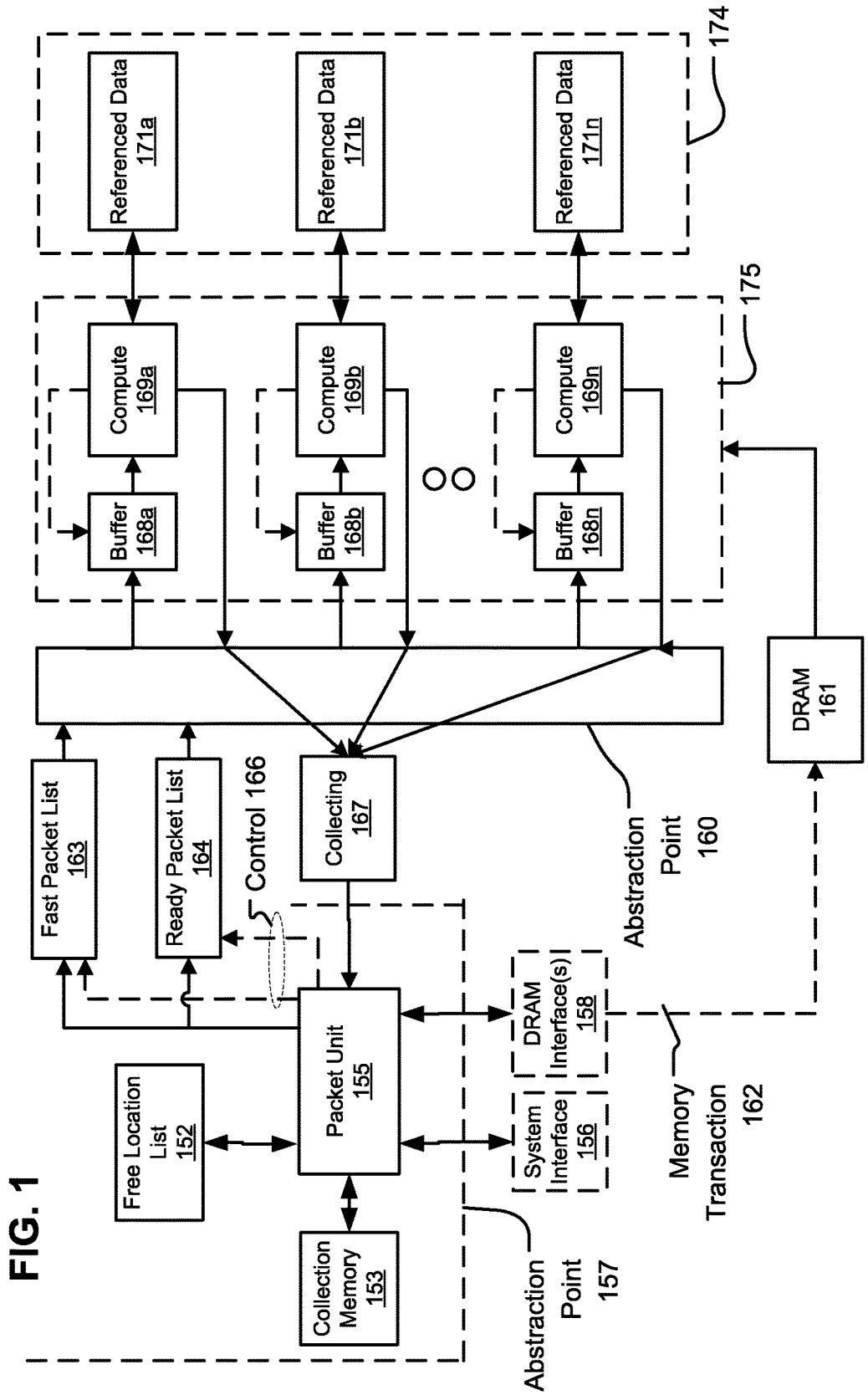
FIG. 1 depicts an example system architecture abstracting computation elements from a source of instances of work to be processed on the computation elements.

In some aspects, the following disclosure relates to components, methods, and systems that provide practical approaches to enabling larger scale, finer grained parallelism of computation tasks. In some implementations, finer grained parallelism is achieved by segmenting programmatic workloads into smaller discretized portions, where each portion can be specified by a minimum of two elements. A first element, in some implementations can be indicative both of a configuration or program to be executed, and a first data set to be used in such execution, the other element can be indicative of a second data element to be used in such computation. In the context of ray tracing, one data element can be indicative of a shape to be tested for intersection with a ray; specifying the shape can indicate the program to be executed, depending on the kind of shape being tested. In this disclosure, these discretized portions can be collected and recollected (e.g., as output and then input) in varying quantities, for input to different kinds of processes (e.g., subroutines, methods, functions, and so on). Some aspects disclosed herein to providing variable sized collections and packetizing of computation instances. Still further aspects relate to approaches for allocating local storage to computation instances according to example techniques and profiling, for processing architectures according to the examples disclosed herein.

In one aspect, a method of scheduling a multiprocessor computing system comprises receiving requests for execution of instances of specified code modules, of a plurality of code modules. The requests result from code modules executing on the multiprocessor computing system. Each request comprises information from which a specific code module can be identified, and a potentially variable number of data elements that are to be used during execution of instances of the specified code module.

The method also comprises packing the data elements identified in each request into collections that are associated with respective code modules, and grouping collections associated with a selection of the code modules into superset collections for scheduling execution of code modules that are associated with those superset collections on the multiprocessor computing system.

In some aspects, methods comprise receiving electronic messages comprising execution progress information. The execution progress information comprising information identifying a portion of code remaining to be executed and identification of a data element to be used in executing the identified portion of code. Such methods may comprise maintaining respective counts of a number of data elements identified by the messages that reference each portion of code, and determining target dispatch sizes for each of the portions of code. The methods may comprise selecting, for execution on a computation system, portions of code as a function of the target dispatch sizes and maintained counts for the portions of code for which execution is being scheduled.

Scheduling may include providing a packet identifying a scheduled portion of code and at least a portion of data elements associated with that portion of code. Each packet may identify up to a maximum number of data elements, and methods may comprises packing the identified data elements into initial groupings that are assembled into respective packets for execution scheduling.

An example method according to the disclosure is a method of scheduling a multiprocessor computing system. Requests for execution of instances of specified code modules, of a plurality of code modules are received. The requests result from code modules executing on the multiprocessor computing system. Each request comprises information from which a specific code module can be identified, as well as a potentially variable number of data elements that are to be used during execution of instances of the specified code module. The method includes packing the data elements identified in each request into collections that are associated with respective code modules and grouping collections associated with a selection of the code modules into superset collections for scheduling execution of code modules that are associated with those superset collections on the multiprocessor computing system.

In some implementations a number of data elements packed into each collection is functionally related to a width of a Single Instruction Multiple Data (SIMD) processing capability of a processor in the multiprocessor computing system. In an example, specified code modules include discrete portions of a code base for implementing different functions. In some implementations, each request for execution of instances of specified code modules comprises any of a fork request to instantiate a new thread for execution, a defined execution path through a portion of a code base, a divergent branch instruction, and a request for execution of that code module is specified based on a branch condition for that divergent branch.

Another example method is a method that includes receiving electronic messages comprising execution progress information. The execution progress information comprises information identifying a portion of code remaining to be executed and identification of a data element to be used in executing the identified portion of code. The method also includes maintaining respective counts of a number of data elements identified by the messages that reference each portion of code and determining target dispatch sizes for each of the portions of code. The method causes selecting, for execution on a computation system, portions of code as a function of the target dispatch sizes and maintained counts for the portions of code for which execution is being scheduled. The scheduling may involve providing a packet identifying a scheduled portion of code and at least a portion of data elements associated with that portion of code. Each packet may identify up to a maximum number of data elements, and the method further comprises packing the identified data elements into initial groupings that are assembled into respective packets for execution scheduling.

The target dispatch size can be set based on sensed operating conditions of the computation system. Example operating conditions comprise an amount of available memory for storing data describing the collections, a target latency in processing of data elements by that selected segment of code. The target dispatch size for a selected segment of code may be set responsive to determining to decrease latency in processing of data elements by that selected segment of code. The respective target dispatch sizes for collections associated with a selected group of segments of code can be varied based on a variety of factors, such as memory address ranges of data elements in the collections, operating conditions of the computation units, and target latency in processing of data elements by that selected segment of code.

DETAILED DESCRIPTION

In some aspects, the following disclosure relates to components, methods, and systems that provide practical approaches to enabling larger scale, finer grained parallelism of computation tasks. In some implementations, finer grained parallelism is achieved by segmenting programmatic workloads into smaller discretized portions, where each portion can be specified by a minimum of two elements. A first element, in some implementations can be indicative both of a configuration or program to be executed, and a first data set to be used in such execution, the other element can be indicative of a second data element to be used in such computation.

In the context of ray tracing, one data element can be indicative of a shape to be tested for intersection with a ray. Specifying the shape can indicate the program to be executed, depending on the kind of shape being tested. In this disclosure, these discretized portions can be collected and recollected (e.g., as output and then input) in varying quantities, for input to different kinds of processes (e.g., subroutines, methods, functions, and so on). Some aspects disclosed herein to providing variable sized collections and packetizing of computation instances. Still further aspects relate to approaches for allocating local storage to computation instances according to example techniques and profiling, for processing architectures according to the examples disclosed herein.

In some aspects, a set of program elements, such as code modules, or portions thereof, may be pre-loaded, such that a set of possible code modules to be executed can be identified. In order to execute a given computation problem, such as rendering a scene, these code modules can be instantiated to produce instances that have more particular execution characteristics, such as data elements that are to be used during execution of those instances. As one portion of instantiation, memory allocations for instances can be made in local memories associated with respective processor units of a multiprocessor system. Memory allocations can be made according to capability requirements associated with a program element which is being instantiated.

In an aspect, a requirements vector of at least one of the program elements comprises an indicator that instances of that program element are to be distributed among processing units of the plurality. In an aspect, there is a one-to-one correspondence between local memories and processing units. Respective requirements vectors specify required processing unit capabilities that are to be satisfied by any of the processing units that the allocator considers in allocating space in local memories associated with those processing units. Many other factors and example approaches to such allocation are found in the detailed description.

In a more particular example, a system for multiprocessing comprises a plurality of processing units, each comprising a Single Instruction Multiple Data (SIMD) execution unit. Each of the processing units comprises an instruction unit to provide control instructions to the SIMD execution unit, and a local memory. The system also comprises an allocator operable to allocate local memory space to instances of program elements to be executed in the plurality of processing units, where the instances comprise instances of a plurality of types of workloads. One type of workload is a recursive instantiation of an existing instance of a program element. Another type is a new instance of a program element. The allocator is operable to allocate memory for recursive instances in a local memory of a processing unit where the existing instance has allocated memory.

In some aspects, the program elements can be modules of program code, portions of a base of program code, or distinct paths leading from a divergent branch in program code.

In some aspects, the system has a collector configured to collect instances of program elements for dispatch to the plurality of processing units for execution according to a collection criteria. One example of a collection criteria is commonality of program element. In some aspects, the criteria comprises a primary criteria of commonality of program element and a secondary criteria of commonality of a data element to be used during execution. In still further aspects, the criteria comprises identifying instances of a plurality of different programs that, when executed concurrently, have complementary execution and memory access profiles.

In some aspects, machine readable media store a plurality of code modules containing machine readable instructions for configuring a multiprocessor to execute the instructions, and data representative of one or more of proliferation parameters indicative of a respective number of computation tasks that may be generated by execution of the code modules and promiscuity parameters indicative of an amount of data that may be read by an instance of the code module during execution. Such media also can store configuration for a scheduler of a cluster of computation units, wherein the configuration for the scheduler uses the one or more of the proliferation and promiscuity parameters during run-time scheduling of instances of the code modules to select a computation unit from among the cluster of computation units in which to execute each instance of the code modules.

In some aspects, the plurality of code modules comprise a code module for intersection testing a ray with a primitive composing an object in a 3-D scene definition, and a code module for traversing a ray through an acceleration structure bounding objects in the 3-D scene definition, and the primitive intersection testing code module has a different proliferation parameter value than the traversal code module.

In an aspect, a processor for graphics rendering has a plurality of processing units, each processing unit capable of executing at least one program element independently of the other processing units of the plurality. The processor also comprises a plurality of local memories used by the plurality of processing units. The processor also has an allocator shared among the plurality of processing units. The allocator is operable to allocate space in the local memories for instances of program elements and to create a mapping between the instances of the program elements and the allocated space in the local memories. The processor also has a collector configured to collect instances of program elements into packets and a distributor configured to distribute instances of program elements, obtained from the packets, to be executed on the plurality of processing units according to the mapping.

In an aspect, the collector is further configured to collect the instances into packets by collecting identifiers of program elements and packets comprise identifiers for the instances of program elements in that packet. In an aspect, the collector is configured to collect instances of program elements into packets according to commonality of an operand to be used during execution of each instance collected in each packet. The program elements comprise any of separately identifiable modules of program code, separately identifiable portions of a single program module, and divergent paths through a branch. In an aspect, the allocator is operable to disperse instances of a first category of program elements across the plurality of processing units that collectively use different elements of a persistent data set and common elements of a transitory data set.

In an aspect, the allocator is operable to match a requirements vector associated with the program element to respective capabilities of the plurality of processing units. In an aspect, the allocator is configured to receive a new instance of a program element to be executed, and is operable to identify which, if any, of the processing units of the plurality has, in an associated local memory, the program element identified by the new instance, and of those identified processing units, to assign that new instance to a selected identified processing unit.

In some aspects, systems are operable to defer commencement of execution of new instances of program elements until a distributor distributes the new instances from a packet containing the new computation instance among computation units that will execute the instances.

In some aspects, a program element is capable of being a parent instance for recursive instantiation of new instances, during execution. Each new recursive instance references at least one data element in common with its parent, and at least one data element different than its parent. The allocator is operable to allocate memory for each new recursive instance in the local memory of its parent.

In another aspect, a method of scheduling computation tasks for execution in a plurality of computation clusters comprises accessing a capability vector for each computation cluster of the plurality of computation clusters. Each of the plurality of computation clusters comprises a Single Instruction Multiple Data (SIMD) Arithmetic Logic Unit (ALU) with a respective data vector width. The method includes determining a capability requirements set for each computation task to be scheduled and determining respective candidate computation clusters that have a capability vector matching the capability requirements for each of the computation tasks. The method also includes allocating each computation task among the respective candidate computation clusters for that computation task.

The plurality of functional units include one or more programmable accelerator units for a pre-determined type of elementary operation, or fixed function accelerators that implement a process. Examples of programmable accelerator units include a transcendental co-processor and a double precision floating point unit. Examples of fixed function accelerators include a ray tracing intersection test unit, a unit for creating an acceleration structure for a 3-D scene, a texture unit, a raster operation unit, and a packetizing unit.

DETAILED DESCRIPTION

As semiconductors continue to scale to lower geometries, theoretical clock speeds and transistor counts continue to increase. It has been recognized however, that attempting to use an entire transistor budget for a single processor core, such as a fine-grained pipeline processor, with ability to execute instructions out of order, is not going to be able to stay within a reasonable power budget, and presents a variety of other challenges in design, and fabrication. Thus, computing architectures have sought to increase computing power by increasing parallelism. A variety of approaches to parallel computing exist, with examples including Single Instruction Multiple Data (SIMD) and Multiple Instruction Multiple Data (MIMD) computers, and combinations thereof.

One area that remains a topic of consideration is how to subdivide a given computing task to take advantage of a parallelized computation resource. In some aspects, the following relates to methods, components and systems of computation that provide capabilities to subdivide a computing task in ways that can allow better usage of parallel computation resources.

Single Instruction Multiple Data (SIMD) computing provides an approach to increase computational parallelism within a processor, without duplicating the entirety of a processor. For example, a plurality of ALUs can share a single instruction decoder and scheduler, an instruction cache, and memory interface. Multiple Instruction Multiple Data (MIMD) provides an approach where essentially multiple redundant cores can be placed on a single die. MIMD computers can have SIMD components. Regardless of how a given transistor budget or a given computer architecture is organized, computation components will ultimately need to complete tasks and schedule new tasks. Other considerations include an amount of interconnect required to implement a given design, as well as an amount of global synchronization required.

One reason that parallelism does not scale in accordance with computation resource availability is that memory bandwidth is not scaling in proportion to the available computation capability. Therefore, computational problems that do not enjoy inherent data locality can cause the computation elements to wait on data being accessed from memory. Memory access remains a problem even as peak theoretically available memory bandwidth has gone up, because such peak bandwidths assume burst transfer rates that often are unrealistic for these kinds of computation problems. Further, scalability of memory interface performance is hindered by other factors, such as pin count of the memory interface, and the fact that memory access latency does not readily scale with process technology changes. For example, DDR3 Column Address Strobe (CAS) latency can be around 9 ns, while typical DDR2 CAS latency is around 10 ns. Also, memory latency between processing nodes also may be a factor in different computational paradigms, such as NUMA architectures.

Further, the SIMD nature of compute clusters means that simultaneously executing threads must follow identical program execution paths in order to realize peak computation throughput. For example, if half of the threads in such a SIMD cluster take a branch one way and the remainder the other branch, the hardware must serialize these two paths (i.e., one half stalls while the other half executes so that ultimately, the SIMD cluster can once again execute on vectorized data). In such a situation, the computation unit executes at only 50% throughput. In situations where a code base being executed contains many branches, a worst case performance from SIMD loss alone can be 1/SIMD_width, which is about 3% efficiency on a 32 wide SIMD architecture. There are a large number of computing problems, including ray tracing, spatial search, sorting and database traversal which, while theoretically parallizable, have not mapped efficiently to such wide SIMD architectures.

Some applications of the technology described below relates to graphics processors, such as processors that can perform rasterization and/or ray tracing. With particular regard to ray tracing, ray tracing can be used to produce realistic images rendered from 3-D scenes, in the context of video games, motion pictures, animated advertisement, industrial models, architectural simulation, and so on. One construct employed in the field of rendering is to provide a physical scene model, and associate surface information with different parts of the scene model. For example, a scene model can contain objects including a person, an automobile, and a building. The physical model of the scene would describe the surfaces of these objects, for example, as a wire frame model, which can include a large number of primitive shapes interconnected with each other to describe boundaries of the surfaces. This physical model generally lacks information about the visual appearance of the objects' surfaces. Then, information and programming is associated with particular surfaces, and/or portions of particular surfaces that describe their appearance. Such information can include textures for the surfaces, while programming associated with the surfaces often is intended to model what effect the surface has on light hitting the surface. For example, programming allows modeling of glass, a shiny surface, a bumpy surface and so on. Such programming and information thus is bound or otherwise associated with portions of the physical model descriptive of those surfaces. For example, programming can be associated with or bound to a particular primitive. Such programming and other description, or portions thereof, for a particular primitive or scene object can be referred to generally as a "shader" for that primitive or object.

The term "thread" can connote different meanings in different circumstances and contexts (but such meanings are not an exhaustive explanation of potential usages of the term). Therefore, in the description that follows, terminology will be used in an attempt to reduce reliance on terminology associated with multi-threading, e.g., by introducing the term "fibre" as a moniker that is intended to refer collectively and individually to a plurality of concepts, which will be apparent from the context of their usage, but not all of which may need to be practiced in every implementation according to this disclosure. Nevertheless, multi-threaded operating systems, and machines that support concurrent and parallel processing of multi-threaded applications may be adapted to implement aspects of these disclosures, as will become more apparent from the description that follows.

The following disclosure relates in some aspects to components, methods, and systems that provide practical approaches to enabling larger scale, finer grained parallelism of computation tasks. In some implementations, finer grained parallelism is achieved by segmenting programmatic workloads into smaller discretized portions, where each portion can be specified by a minimum of two elements. A first element, in some implementations can be indicative both of a configuration or program to be executed, and a first data set to be used in such execution, the other element can be indicative of a second data element to be used in such computation. In the context of ray tracing, one data element can be indicative of a shape to be tested for intersection with a ray; specifying the shape can indicate the program to be executed, depending on the kind of shape being tested. In this disclosure, these discretized portions can be collected and recollected (e.g., as output and then input) in varying quantities, for input to different kinds of processes (e.g., subroutines, methods, functions, and so on).

In one aspect, a fibre is an instance of code (e.g., a C function declaration) that can be forked repeatedly by a parent thread or recursively entered from another instance of the same fibre routine. An instance of a fibre routine (instances of fibre routines are, for convenience, simply called "fibres") includes an identifier for an element of data used as a scheduling key, and identification of a particular element (a declaration of) of fibre storage.

Fibres sharing a scheduling key can be grouped for concurrent execution (as described below, such grouping does not impose a requirement that such execution occur strictly in parallel). All fibres referencing the same element of fibre storage can be channeled for execution to a computation element having that element of fibre storage locally cached. In one exemplary implementation, a given element of fibre storage, for a given fibre, or set of fibres, has at least the characteristic that this element of fibre storage is readable and writable only by that fibre, or set of fibres. this limitation can be enforced by appropriate programming practices, by a compiler, by hardware, and by some combination thereof.

A fibre can be defined by a standard C function declaration and contains all the code required to execute the fibre to completion (standard inline expansions of functions can be provided). An operative difference being that a fibre is not to wait for a return value from another function called within the fibre. Such definition is referred to as a "fibre routine." In the exemplary aspect, the fibre routine function declaration contains at least one argument for which a value is stored in fibre storage associated with the thread that forks fibres using that fibre routine declaration.

In one exemplary aspect, all fibres that reference a given element of fibre storage (e.g, instantiated by a parent thread (or fibre) have their execution controlled or distributed, so that they execute serially within a given processor (a processor can itself by a grouping of processing elements, and in one example, can include a plurality of SIMD processor elements), and concurrently or generally in parallel with other fibre routines that have a matching scheduling key. In one example, a grouping of processor elements considered to be a processor, in this context, is determined according to which processing elements can write to a particular fibre storage location. In one example, all processor elements that can write to a particular fibre storage location are considered as a group to be a processor, for the purposes of enforcing serial execution of fibres that reference that particular fibre storage location.

Only fibres that ultimately trace to a common parent can access a fibre storage element allocated for these fibres. Thus, a fibre that traces to a different parent for that set cannot access such fibre storage location. Further, in exemplary aspects, no two or more fibres from the same parent are scheduled to be executed in parallel, so that no mutex or lock management is required to fibre storage locations.

However, in such exemplary aspect, a fibre otherwise can have full access to all the features that a standard thread would have, including full global memory access, local memory, barriers, texture samplers, private variables and all arithmetical and logical operations. The fibre routine may also contain arguments that are directly taken from the kernel arguments of its parent thread, which allows the fibre to have access to global memory pointers and other shared variables. These memory locations can be accessed using standard memory protection techniques.

Each thread in the system can define a plurality of fibres, each with a respective scheduling key. Further, a plurality of fibre routines can be defined, such that a given thread can define a number of fibres, which are instances of different fibre routines. As explained above, in an exemplary aspect, fibres of the same fibre routine (sharing a code base), and from the same parent (e.g., a parent thread or fibre), do not overlap in execution in implementations that avoid mutexes or locks for accessing at least one variable or data source that is available only to those fibres.

In some aspects, and unlike a function call in a typical multi-threaded environment, a kernel (or other system scheduler resource) does not necessarily immediately attempt to execute, or make preparations to execute, the fibre such invoked (as it would a thread, in a typical multi-threaded environment). Examples of such preparations were introduced above. Instead, in one exemplary aspect, its activation (allocating actual processing resources for execution) is deferred until an unknown future time. Further, after a parent thread instantiates a fibre (e.g., by using a fibre definition API semantic), the parent thread can continue execution (e.g., continue to be an active thread, incrementing its program counter and using hardware resources). An API also can provide a semantic for instantiating a number of fibres (e.g., of the same fibre routine or of different fibre routines) at the same time. In one example, each of the fibres can have a common fibre key, and in another example, the fibres can have the same fibre key, but operate on one or more different values.

Because, in this exemplary aspect, a parent thread does not block or wait for a return value from this fibre, a fibre does not return any return value to a parent thread, as would a standard C function. By contrast, upon completion, a fibre routine can simply cease to exist (e.g., go into a zombie state, awaiting deallocation of memory resources), and does not return to the caller (parent) thread. Thus, for a fibre, in this aspect, to have effect or produce useful output, the fibre is to write results into fibre storage. Note that although the fibre has the capability to write results to a memory resource shared outside of the fibre (e.g., global or local memory), using a mutex or locking management, such an operation would be much slower than a write to fibre storage.

In an exemplary aspect, because fibres do not return a value, data that persists between fibres (e.g., fibres instantiated from a common thread) is confined by data resident or declared as resident in fibre storage. In practice, it is expected that the exemplary aspects disclosed herein would be practiced by allocating a fasted available memory resource to fibre storage, and as such, would typically be expected to be a more limited resource. For example, as between a main memory and a cache memory, a comparatively larger portion of the cache would be dedicated to fibre storage than to other data that may be used by fibres.

Another aspect of some generality is that fibres that reference the same element of fibre storage are reference counted (e.g., a counter is incremented when a fibre referencing that element of fibre storage is emitted, and decremented when such a fibre completes). A reference count hitting zero thus indicates that there are no more fibres outstanding which reference a given fibre storage location (or locations in a case where a given set of fibre references a number of locations). Thus, such a reference count reaching zero can be a trigger to a parent thread that data in the fibre storage is available for usage and/or fetching. A flag set in response to the zero value, such as a flag provided by a built in function can be monitored by the parent thread, by way of further example.

The following is an example construct of coding semantics that can be used in an implementation according to these disclosures. This example is by way of explanation, and not limitation as to how a particular implementation may be structured, or the contents of such an implementation.

In some examples, the techniques described herein can be described or made use of by programmers through a coding semantic. In one example, a module of code can be qualified as a routine to be treated as a fibre; similarly, storage location(s) in cache memories (further examples provided below) can be designated as fibre storage locations. Each fibre routine would take an argument that is used to collect different instances of that fibre routine together for scheduling of concurrent execution in a computation cluster, as described below.

In view of the above introductory explanation and by way of further explanation, a variety of architectural examples and operational situations are explained below. Architectures in which fibre computing aspects can be practiced are diverse. One exemplary type of architecture is one where a plurality of computation clusters each comprise a plurality of Arithmetic Logic Units (ALUs), and a local controller that controls the ALUs. In one more particular instance of such architecture, all the ALUs of a cluster are run from a common program counter selected by the local controller. Each ALU, however, can have an independent port to a local memory. In some examples, the local memory can operate similar to a register set of a general purpose processor, in that each ALU can read and write to and from the local memory. In some implementations, the active program counter in each cluster can be changed on an instruction by instruction basis, without latency. In some architectures having such a plurality of clusters, full threads can be executed in each cluster, and state for such threads maintained in the local memories of the clusters. In some implementations, a local controller may treat fibres differently from threads, in terms of scheduling their execution in the ALUs controlled by that local controller. In some implementations, no fibre that references a common fibre memory storage location (i.e., the fibres share a common origin) would be scheduled for concurrent execution in the cluster in any implementation where memory arbitration is not implemented. One example architecture explicitly avoids arbitrating for local memory access by fibres, so that memory accesses can be accelerated.

Example workloads processed in computation architectures implementing disclosed aspects primarily relate to graphics rendering workloads, and more particularly, ray tracing is provided as a principal application example of fibre computing principals. However, a variety of computational problems can be addressed by application of disclosed aspects of fibre computing. In the context of implementing ray tracing functionality using aspects of fibre computing, a graphics chip may continue to implement rasterization based graphics processing, such as vertex and pixel shading functions, with thread computing principals and using the same plurality of computation clusters.

Figure 2:
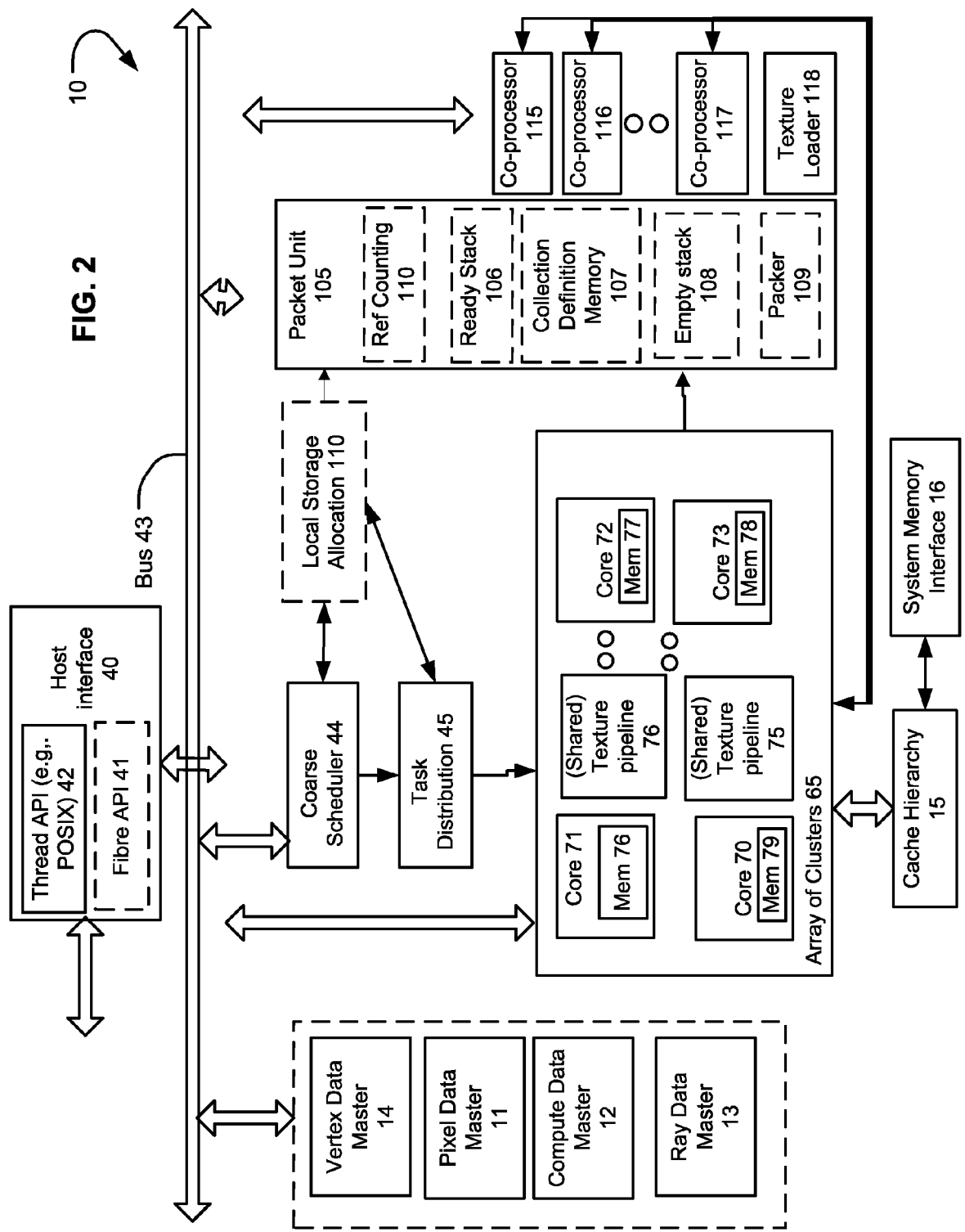
FIG. 2 depicts an example system architecture, in which heterogeneous computation workloads can be scheduled and performed in a cluster of computation elements.

Example system architectures in which disclosed aspects may be practiced are depicted in FIGS. 1 and 2.

FIG. 1 depicts further aspects of a computation architecture according to the disclosure. A number of processing units 169a-169n (e.g., which can be configured for intersection testing, according to an example) can be provided. Each of the processing units 169a-169n can interface with a respective buffer 168a-168n. When processing ray intersection testing workloads, for example, the buffers can contain ray identifiers and information about objects to be intersection tested with rays identified by the ray identifiers.

The ray identifiers can be provided from a ready packet list 164 that is controlled (via control 166) from a packet unit 155. In the example of ray intersection testing, ready packet list 164 can contain a list of ray identifiers to be tested for intersection against one or more shapes identified in the packet (either by reference or by included data). Abstraction point 160 receives such a packet from ready packet list 164 and splits the ray identifiers among the buffers 168a-168n based on which of the processing elements 169a-169n are to process such rays. In one example, the ray identifiers are distributed according to which processing element has cache access to definition data for the identified ray.

In some implementations, abstraction point 160 can split the data based on correlating ray identifiers with memory address locations of fast local memories 171a-171n, such as by masking certain bits of each ray identifier in order to identify the intersection tester with ray definition data for that particular ray (of course, more than one local memory may store data for a given ray). Packets can reference elements of acceleration data or primitives to be intersection tested, and typically, rays are referenced first in packets to test against acceleration elements, and ultimately, primitives are identified to be tested.

Packet unit 155 communicates through abstraction point 157, which in one implementation can include a system interface 156, through which new workloads definitions can be received. For example, rays or groups of rays that need to be tested for intersection can be received. Packet unit 155 also can interface with DRAM 161 in order to schedule memory transactions to deliver shape data to intersection testers based on references included with packets in ready list 164.

Packet unit 155 uses collection memory 153 for maintaining status information for the compute collections (e.g., in the context of ray intersection testing, collections of ray identifiers can be sorted or organized in association with shapes in the acceleration structure). In some cases, collection memory 153 can be subdivided into fixed size locations that can be used to store a given number of ray identifiers. Given that collection memory 153 can have a known or otherwise discoverable or configurable size, a known number of collections can be accommodated, and referenced.

References to each such location can thus be maintained in a free location list 152. For results processed through collecting function 167, packet unit 155 processes those results into collections associated with each acceleration structure element intersected. Such processing can include retrieving an identifier for each of the acceleration elements from a return packet, or other information provided by one or more of processing element 169a-169n. In some implementations, compute elements can circulate a packet to collect processing results (e.g., ray intersection test results for a given acceleration element. In other examples, each processing element 169a-169n can aggregate results (e.g., results of testing one or more rays with one or more acceleration elements). The disclosure also describes still further approaches to feeding computation results from processing elements 169a-169n to packet unit 155, in the context of other example architectures below.

Collection memory 153 also can be subdivided into storage locations of various sizes. For example, 2, 3 or 4 differently sized collection storage locations can be provided. For example, a large location can store data for 32, 64 or 128 schedulable computation instances (e.g., 32, 64, or 128 rays), while comparatively smaller locations can store 24, 16, or 8 rays. Depending on architecture implementation, different numbers of computation instances may be concurrently processed. For example, a number of rays that can be tested at any given time (or cycle) by processing elements 169a-169n can be equal to, smaller than or greater than a number of rays in the largest collection size.

Collection storage locations of different sizes can be assigned to different points in an acceleration structure hierarchy. For example, larger collections (e.g., storage locations) (i.e., those capable of storing more ray references) can be allocated to portions of the acceleration structure closer to a root node, while smaller collection locations can be allocated to nodes closer to leaf nodes, as one example of variable-sized collections. As will be described below, variable sized collections also can be implemented in a distributed manner according to example architectures.

A number of collection storage locations can be combined into one packet that is stored in ready packet list 164, for example. As such, a large collection storage location is not necessarily entirely consumed, even though partially full, waiting for rays to be collected against a comparatively isolated, small, or currently inactive, portion of an acceleration structure. In other implementations, multiple collections of a given size can be combined within collection memory 153 (e.g, when a number of ray references stored in each reach a threshold number). In a further implementation, references to computation instances (e.g., references to rays) can be copied and combined from multiple locations of a given size into fewer locations of a larger size.

Packet unit 155 can select from such collection locations for one or more collections to evict, to form a packet to be tested. In sum, some aspects can provide locations in memory of a certain size, where each can be associated with a different acceleration structure element. Collections can be combined, both for packets in flight, and within the memory. Assignment of packet sizes to points in an acceleration structure can be static or dynamic. Packets can comprise a plurality of substituent packets. Each substituent packet can reference a code module and identify a collection of data elements, and an index key. The data elements can imply a particular code module. For example, in some situations, a particular kind of data element implies that a certain operation will be conducted, which is described by a particular code module that can be obtained based on identifying a kind of data element. The kind of data element can be determined based on memory address range, for example.

Thus, intersection testing results get propagated through abstraction point 160 through collecting 167, while collections identified in ready packet list 164 are distributed among buffers 168a-168n. Each processing element 169a-169n can be operable to read from its buffer when it is able to test another ray for intersection. In some examples, each entry of each buffer can identify a ray to be tested for intersection with an identified shape. Data for the shape can be provided from a DRAM (e.g., DRAM 161) or other larger, comparatively slower memory, and the provision of such data can be initiated by packet unit 155.

In some aspects, in addition to ready packet list 164, a fast packet list 163 also can be provided. Fast packet list 163 can be maintained by packet unit 155. Fast packet list 163 also feeds into abstract point 160, where logic selects packets from both ready packet list 164 and fast packet list 163. Abstraction point 160 can be programmed (configured) to prioritize packets from fast packet list 163 to be intersection tested. In some examples, so long as a packet is available from fast packet list 163, it will be selected prior to selection of a packet from ready packet list 164. In other examples, a higher percentage of packets are selected from list 163 than 164. The percentage can be made to vary based on population metrics for computation instances being processed. Packet unit 155 can populate fast packet list 163 based on aspects of computation instances (e.g., rays) constituting the packet (packets in some aspects contain references to rays, although for convenience, it can be said that the packet contains rays).

Fast packet list 163 also can be populated based on other compute workload characteristics that can be heuristically determined. In the context of ray tracing, for example, a collection with rays that have an origin closer to a parent acceleration element shape can be prioritized. For example, rays are collected against an acceleration element they intersected. Once a collection of such rays is selected for test, child elements of the acceleration element will be tested against that collection. The child elements can be prioritized for test based on which elements are closer to origins of the rays. For example, if rays were emitted and were travelling in a direction to hit a wall, bounded by one child element, but other child elements bounded objects behind the wall (and were obscured), then the wall element can be prioritized. This approach establishes a smaller clipping distance for each ray sooner, such that farther portions of a scene can be excluded quicker.

Collections in memory can be prioritized for testing if they are closer to leaf nodes of an acceleration structure, if they have fewer layers of acceleration structure beneath them (e.g., the acceleration structure need not be symmetrical or balanced). Packets also can be prioritized based on an area or volume bounded by the acceleration element to which they are associated. A hierarchy can be implemented by a list. Such prioritization can be implemented by changing the ordering of the list.

The above examples are techniques that can be employed during intersection testing, but not all techniques need or should be employed for intersecting any given scene. A set of such techniques can be employed, where they are given different weighting factors, positive or negative, to score collections for test, and then select such collections for test based on the score.

Criteria for selecting collections of computation items for test can include collection fullness, fullness metrics for distributed memories 171-171n, and metrics relating to collection memory 153. Another metric than can be employed relates to an "ancestral" history of the computation items in a collection. A particular ray tracing example serves to explain the aspect more generally.

Where a homogenous sphere hierarchy (spheres either bound other spheres or are leaf nodes bounding primitives, and they are hierarchically related) is employed, a parent sphere bounds a number of number of child spheres. Rays can be found to intersect the parent sphere and are collected. If many of those rays also intersected the same grand-parent sphere (i.e., a sphere higher in the hierarchy than the parent sphere), then that collection can be prioritized for testing and a packet representing the collection can be included on fast packet list 163.

More generally, packet unit 155 can prioritize collections of rays that have sequentially been found to intersect the same acceleration elements. One result of this prioritization is that some rays are driven comparatively quickly depth-first into the acceleration structure, even while other rays are allowed to be traversed more broadly in the acceleration structure. This partial depth-first traversal helps some rays complete traversal and get into shading faster, which can encourage production of secondary rays to allow a wider pool of rays from which new collections can be formed. Also, during constrained memory conditions, such depth-first traversal can be used to remedy memory over-use conditions. Thus, fast packet list 163 can be populated with packets selected based on ray population or memory capacity considerations as well.

FIG. 2 depicts an architecture of an example system 10, in which concurrent and parallel processing and scheduling can be implemented according to these disclosures. Systems according to exemplary system 10 can be used to implement graphics processors, for example.

A host interface 40 may includes a thread API 42 and may include a fibre API 41. Thread API 42 can be used by routines running on a host processor (not depicted), in order to instantiate new threads to be executed on system 10. Thread API 42 can be provided, for example, as a firmware coded API available in a System on Chip (SoC) with one or more generally programmable processor cores, such as a computation core operating according to an architecture specification and with an instruction set architecture, such as a core specification by MIPS Technologies, or by ARM Holdings, Ltd. In other examples, thread API 42 can be provided with a driver for an add-on card that off-loads graphics processing loads from the host processor.

In one example, and as described below, fibre API 41 can be used by threads running on the host processor, to instantiate fibres that are executed in systems according to example system 10. As will be described below, threads executing in such systems also can access an API provided according to these disclosures, such that threads executing on the system also can define fibres for execution. In some examples, a fibre API is not exposed at the host interface level, but rather is made available only to threads executing within the graphics processor system 10.

Example system 10 includes a number of masters, which function to setup computation to be performed in system 10. In some examples, computation performed in system 10 is considerably more regular and voluminous than typical application code intended for execution on a processor. Rather, example workloads can include workloads to shade large set of vertices or pixels. Vertex data master 14 and pixel data master 11 can be provided to setup the usage of the available computation elements (described below) to perform such computation). By further example, compute data master 122 and ray data master 13 can be provided to setup computation for a large scale numerical analysis programs, and for ray tracing workloads.

Coarse scheduler 44 receives inputs from data masters, such as data masters 10-13, described above. Coarse scheduler 44 can operate to allocate independently operable computation elements to perform the computation loads that can come from the data masters. Coarse scheduler receives status information from resources available in system 10. Such resources include status of memories located within an array of clusters 65 (described below). Such memories may be private to particular computation units (e.g., cores 70-73) within the array of clusters 65, such as memories 76-79. These memories 76-79 can be implemented as caches that can be allocated among threads that are executing on the core coupled with each memory (e.g., memory 76 can be allocated among threads executing on core 71). The allocation of such memory can be handled by coarse scheduler 44. Each data master (vertex, pixel, computer, ray) can communicate memory allocation requirements to coarse scheduler 44. Such operation is exemplary, rather than exhaustive; such operation also may be adapted in view of the present disclosures.

The exemplary system 10 also includes a packet unit 105 that includes constituent components of a ready stack 106, a collection definition memory 107, an empty stack 108, and a packer unit 109. The functionality, usage, and operation of packet unit 105 within example architecture 10 will be described below. Example system 10 also may comprise a variety of co-processors adapted to perform specific functions, and are depicted as co-processors 115-117. Other special purpose functionality can be provided, such as texture loader 118.

FIG. 2 depicts that threads scheduled by coarse scheduler 44 can be distributed by a task distributor 45. A local storage allocator 110 manages allocations of distributed memories 76-79 and communicates with task distribution 45 and with packet unit 105. In the depicted architecture of FIG. 2, array of clusters 65, coarse scheduler 44, and data masters 11-14 can communicate using a bus 43. Of course, a bus 43 is one example approach to communication among the depicted structural and functional elements.

Exemplary system 10 also may comprise a cache hierarchy 15 that includes one or more levels of cache memory, and a system memory interface 16 that can interface with a main memory, which can be implemented as one or more of high speed graphics RAM, DRAM, and the like. Approaches to large scale memory capacity may be adapted as new technologies are developed, and usage of well-known acronyms, such as DRAM, is not intended to confine the applicability of disclosed aspects to a given process or memory technology.

Figure 3:
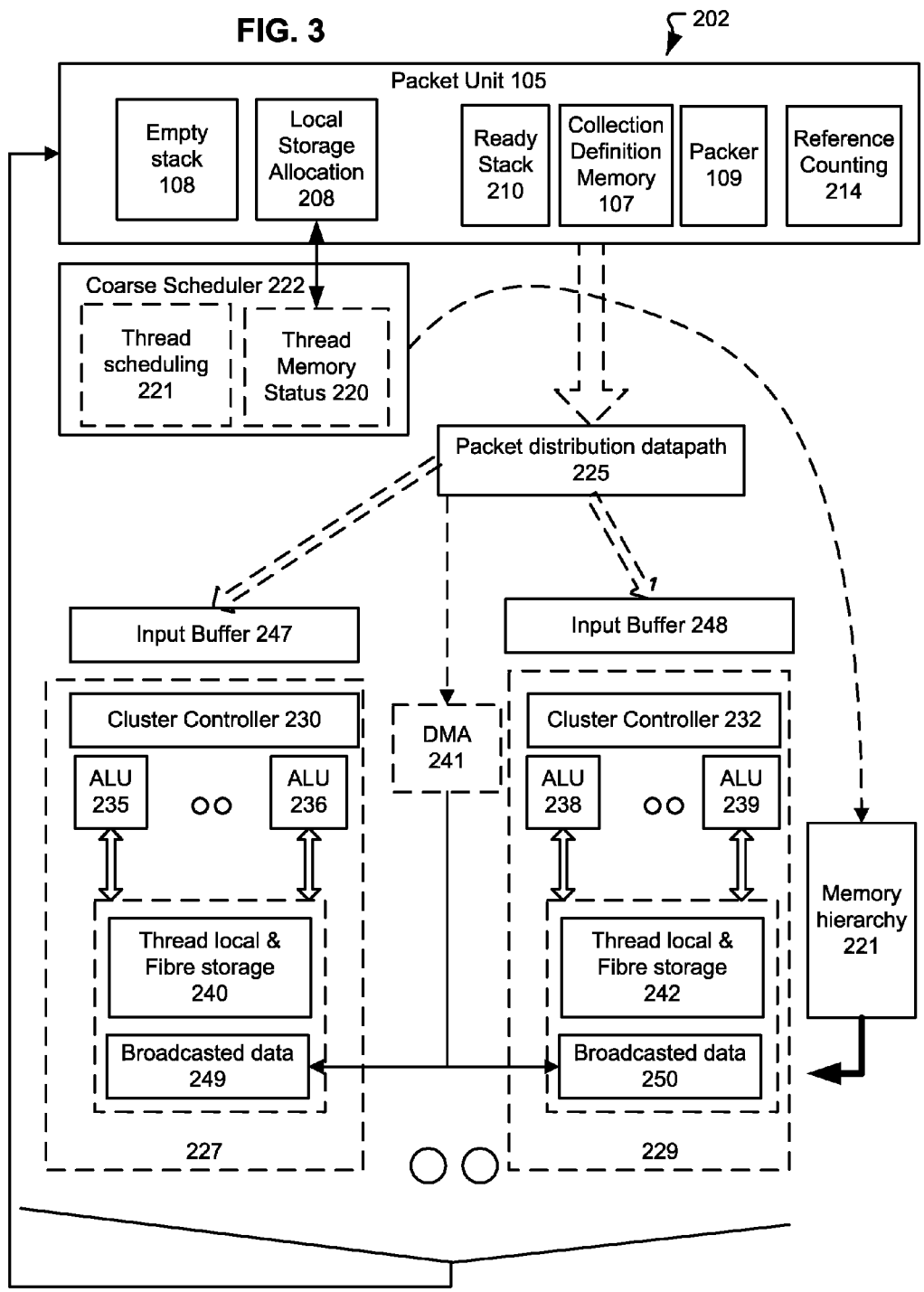
FIG. 3 depicts another example system architecture, in which heterogeneous computation workloads can be scheduled and performed in a cluster of computation elements.

FIG. 3 depicts another exemplary system 202 in which disclosed aspects can be practiced. System 202 comprises a packet unit 105, which includes an empty stack 108, a local storage allocator 208, a ready stack 210, a collection definition memory 107, and a packer 109. Packet unit 105 can communicate with coarse scheduler 222, which can include a thread memory status module 220 and a thread scheduler 221. In some aspects, threads can be allocated execution resources by thread scheduler 221, and status module 220 can track memory usage by such threads. Such memory status can be used in scheduling instances of fibre routines. Packet unit 105 collects groupings of fibres to be distributed among the plurality of compute clusters, which will perform work specified by the fibres, as described below. Coarse scheduler 222 tracks usage of computation resources in the plurality of computation clusters, such as memory allocation and usage. In some implementations, an allocation of a portion of a local memory in a particular computation cluster is static and assigned when setting up the thread on that computation cluster. Coarse scheduler 222 also can allocate fibres for execution in the clusters.

In one example, a thread executing on a particular cluster can instantiate a fibre routine (thereby making a fibre). Coarse scheduler 222 can receive the information concerning the instance and allocate a particular cluster to execute the fibre. As introduced above, allocation of a fibre to execute on a cluster does not indicate that execution would commence immediately on that cluster, but rather execution of such fibre depends on location scheduling criteria as well.

A packet distribution datapath 225 separates a series of computation clusters (clusters 227 and 229 are depicted) from coarse scheduler 222 and from packet unit 105. Distributor layer 225 accepts groupings of fibres from packet unit 105 and causes the fibres to be distributed among the computation clusters, according to an exemplary approach described below.

Each cluster comprises a respective controller (controllers 230 and 232 depicted for cluster 227 and 229 respectively). Each cluster controller (e.g., 230 and 232) controls a plurality of arithmetic logic units (ALU) (e.g. cluster controller 230 controls a plurality of ALUs including ALU 235 and ALU 236). Each ALU of a cluster communicates with a thread local and fibre storage memory (e.g. thread local and fibre storage 240). In one implementation each ALU has a separate and dedicated access path to thread local and fibre storage, such that each ALU can read or write concurrently from and to the memory with the other ALUs of that cluster. Memory resources of a given cluster further comprise a broadcasted data memory (e.g. broadcasted data memory 249 of cluster 227).

Broadcasted data memory 249 can be implemented in the same physical storage medium as thread local and fibre storage 240. Broadcasted data memory 249 can be highly interleaved cache that allows a particular location of memory map to a number of different locations in the broadcast data memory. In some implementations, broadcasted data memory 249 may comprise a ring buffer or FIFO memory implementation. These broadcasted data memories are fed using a direct memory access unit (DMA) 241. DMA 241 can schedule data transfers to control storage of data broadcasted data memories (e.g., 249) in a number of clusters. Broadcasting data is one aspect of an example computation model, but is not a required feature of all implementations according to these disclosures.

Each cluster comprises an input buffer, e.g. cluster 227 comprises input buffer 247. Each input buffer for each cluster is written by distribution layer 225 and read by the respective controller of that cluster. For example distribution layer 225 writes to input buffer 247 which is read by cluster controller 230.

Figure 4:
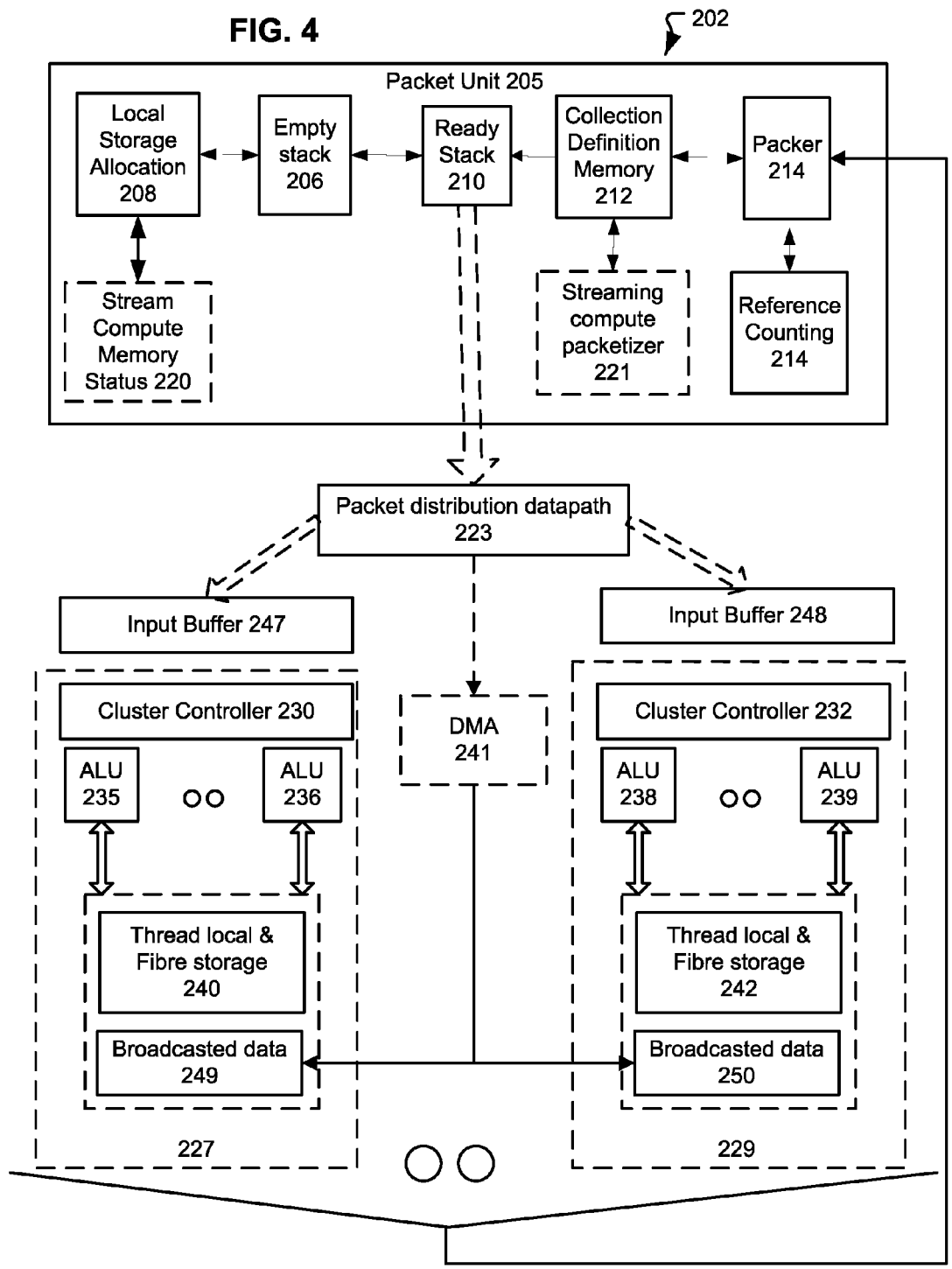
FIG. 4 depicts another example system architecture, in which heterogeneous computation workloads can be scheduled and performed in a cluster of computation elements fed through a unified datapath.

FIG. 4 depicts an architecture with a unified datapath for distributing information describing heterogeneous workloads. As an example, one type of workload can be composed of workloads that may largely consist of a temporal stream of data elements that are processed by a fixed sequence of pipeline stages; in some cases, portions of these pipeline stages can be programmable. In some cases, the temporal stream of data elements may be processed by a small kernel of program code. Another type of workload is one that has many decision points, or branches, conditional operators and the like, such that a group of data elements being processed may not all need to have the same operations performed on them (e.g., one data element may evaluate to take one branch of a conditional, and another data element may evaluate to take a different branch). Such workloads may benefit from sophisticated approaches to storage of data elements, and approaches to handling accesses to memories in order to obtain data (e.g., main memory accesses).

A unified datapath provides an implementation of an abstraction point (see FIG. 1, 160), through which information that describes collected schedulable instances of workloads can be distributed among appropriate. The unified datapath provides a packetized approach in which collections of schedulable instances are distributed to processing clusters that can performed low-latency interleaved processing for a number of instances that have been scheduled for execution in that cluster.

FIGS. 3 and 4 depict that architectures support different kinds of computation. or example, one kind of computation is a load/operate/store approach, where data is loaded, operated on and saved to global memory by a thread. For example, a streaming computation paradigm can be implemented, where clusters can implement a function pipeline for a streamed set of data elements. For example, vertex shading and tesselation can be implemented. FIG. 3 depicts an approach where a packetized computation scheduling framework according to the disclosure is implemented in conjunction with a thread scheduling framework (e.g, coarse scheduler 222 handles thread scheduling, while packet unit 105 handles packetizing computation instances and dispatching packets of instances through datapath 225 to the clusters. FIG. 4 depicts an architecture where all these different approaches to computation are implemented in a packetized computation scheduling framework, as disclosed, where instances are grouped and distributed on a cluster. Generally, global memory loads are amortized over the cluster, while fast read/write access to comparatively persistent data is confined to local memories within the clusters.

Figure 5:
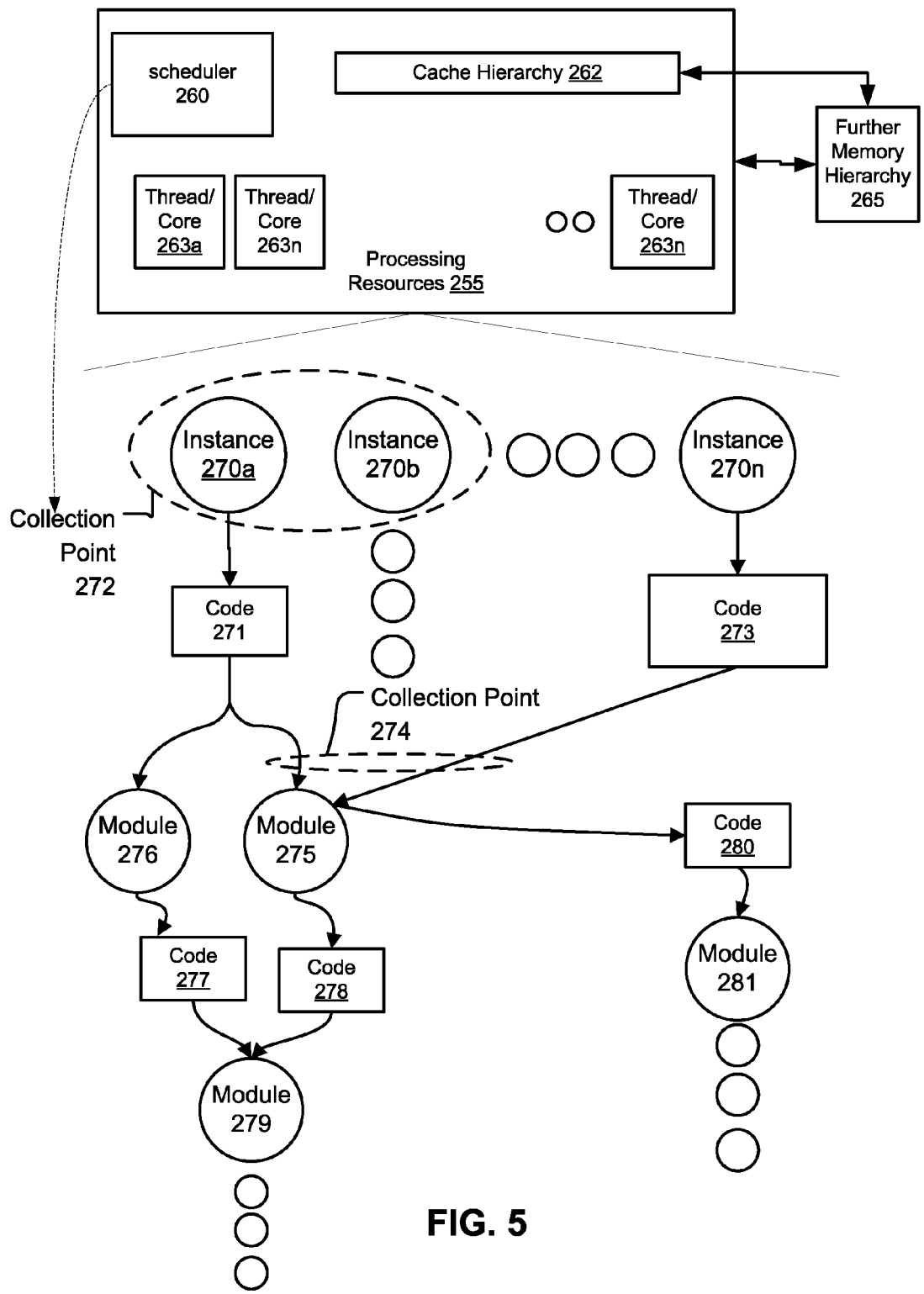
FIG. 5 depicts data flow aspects relating to collecting and deferring instances of program code modules to be executed, such as in the context of shading of rays based on intersected object and shading code components.

FIG. 5 depicts further examples of how ray collections can be grouped based on object intersection information, or at a more granular level based on portions of shader code being executed. FIG. 5 depicts intersection processing resources 255 that can comprise a plurality of execution cores (threads) 263a-263n, a scheduler 260, and a cache hierarchy 262 that can comprise a plurality of cache memories. In this example, cache hierarchy 262 can comprise a plurality of caches located on-chip, and/or within a module in which execution cores 263A-263n are located. Further memories 265 can be accessed off-chip. Processing resources 255 can execute shader code in execution cores 263a-263n, and in this particular example, shader instances 270a and 270b are depicted, which are differences instances of the same shader. Shader instance 270n is also depicted as an instance of shader code for a different shader. The above is a specific example of grouping for program code instances relating to shading of intersections between rays and scene geometry, during ray tracing. However, the example applies in general SIMD processing of program code instances.

Scheduler 260 can create points of aggregation at which rays can be collected to defer their shading in favor of shading collections of other rays. Collection point 272 shows that a scheduler can aggregate rays (or more generally computation instances) to await execution of the two depicted shader instances 270a and 270b (depicts an entrance point of such shader code). Thus, as rays are deferred, they are collected into a collection associated with collection point 272. When the collected rays are to be shaded, data useful in their shading can be paged into cache hierarchy 262 (as explained with respect to FIG. 6).

FIG. 5 also depicts that shaders may comprise multiple sections of code, and may also branch and call other modules of code. For example, code 271 is depicted as code that was branched to during execution of shader instance 270a, but not shader instance 270b. Modules 276 and 275 are examples of code modules, such as a diffuse lighting modules that can be called by shaders. A collection point 274 can be provided to collect rays of shader instances that have made calls to such modules. For example, collection point 274 represents collecting rays that have called module 275.

As depicted, such calls can come from instances of different shader code (here, instance 270b and instance 270n). Once module 275 has been executed for rays collected at collection point 274, shaders continue in their normal shading path. For example, rays collected from module 273 can return to execute code 280, and call module 281, after completion of module 275. Similarly, shader instance 270a had two taken branches in which module 276 is executed for some rays while module 275 was executed for other rays. Collection point 274 applied only to module 275, such that for those intersections that took the module 276 branch, they would execute code 277, and ultimately converge to the same code path at module 275, as would those intersections that took module 275, executed code 278 before converging at module 279.

FIG. 5 is only exemplary in that a scheduler process can provide a variety of collection points, within shader modules, based on calls to provided modules, based on access to defined regions of memory that have been loaded with object data for certain objects or object portions, and so on. In one aspect, ray intersection processing can be collected at a start of diffuse lighting calculations, such that diffuse lighting calculations can proceed for a number of rays that intersected portions of the same object, and in other examples, rays that intersected portions of the same or different object, and whose shaders use a diffuse lighting call can be collected.

Figure 6:
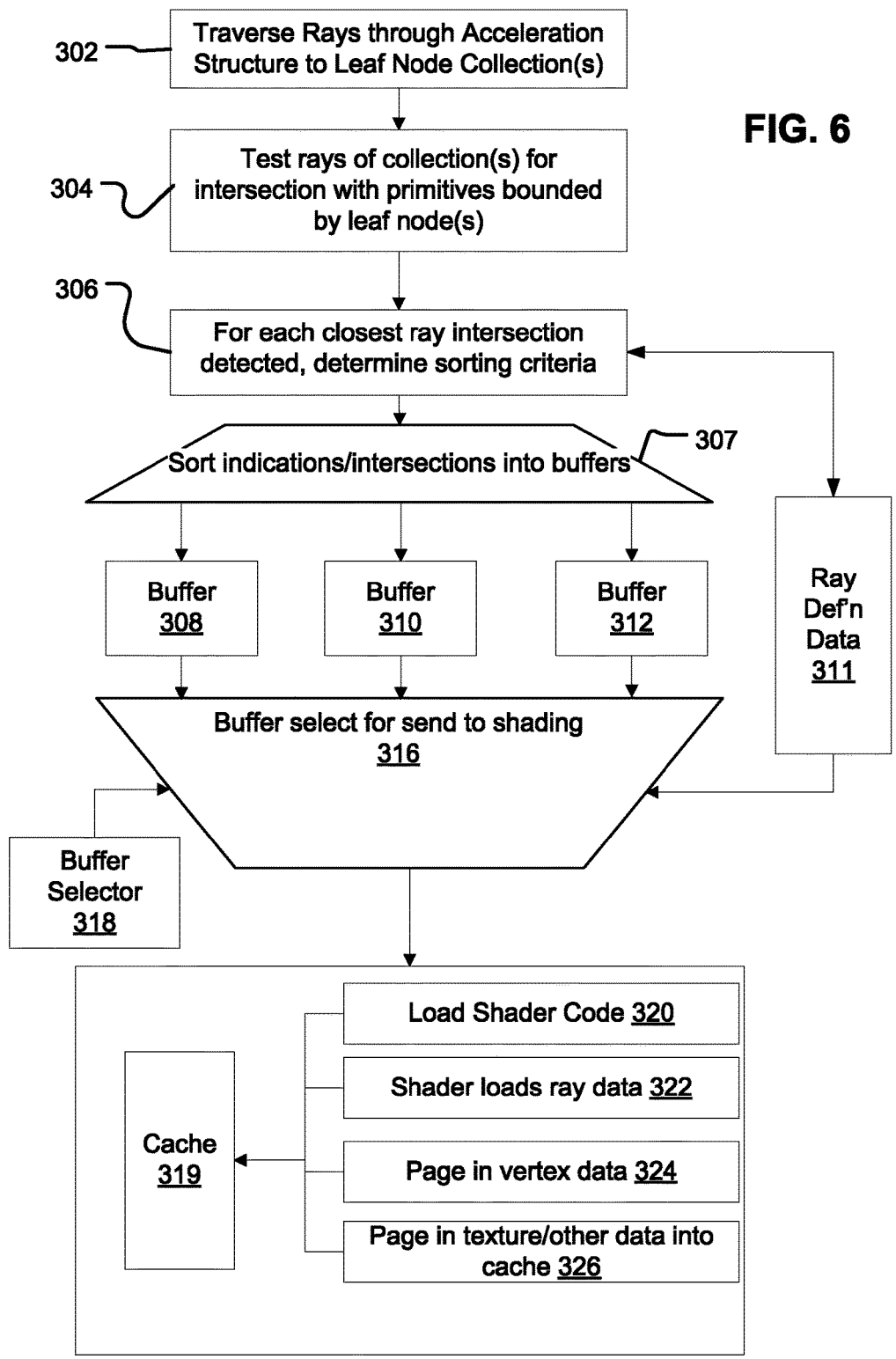
FIG. 6 depicts aspects relating to collecting intersecting rays by shader, or by intersected object, which is a component implementable in ray tracing on specific or general purpose architectures, such as those of FIGS. 1-3.

FIG. 6 depicts aspects of a method that includes ray traversal, ray sorting, and preparation for shading. FIG. 6 depicts that rays can be traversed (302) through an acceleration structure. FIG. 6 also depicts that in one implementation, rays of collections(s) can be intersection tested (304) by a bounding element (e.g., a leaf node) that can be considered as completing the traversal. Such an element can be a leaf node, or can be another node in the acceleration structure (e.g., a node bounding primitives associated with an object).

In 306, a sorting criteria can be determined. In one example, such sorting criteria includes using an identifier associated with each primitive. In another example, such sorting criteria can include that a common shader, or a portion of a shader code module, and more generally, common data to be accessed and/or code are to be used and/or executed in shading the intersections. The sorting criteria can then be used in sorting the intersections.

In either case, the rays can be sorted (307) based on a current possible closest detected intersection for that ray and the object containing that possible closest detected intersection. The sorting (307) can provide for sorting ray intersection information, including identifiers for intersecting rays, based on an expectation that certain of the rays will use one or more of common shading code and common shading data during shading of their intersections. Such an expectation can be formed in ways such as determining that rays have intersected the same primitive, or have intersected different primitives of the same scene object.

It is to be noted that since this description comprises an approach wherein the traversal is stopped before final primitive intersection testing, the closest intersection is indicated as possible, since it can be the case that the ray ultimately may miss intersecting a primitive bounded by an acceleration element, even though it intersects that element.

In either case, sorting (307) of intersections (or possible intersections) into object-associated buffers can be made based on the intersected information then-available (actual and/or possible intersections), and can be implemented by a sorter. Buffers 308, 310, and 312 are depicted as example buffers for receiving intersection information sorted by object; such buffers can be implemented as FIFOs, ring buffers, linked lists, and so on. Other implementations can sort rays into buffers based on association with a particular code segment, such as a shader. In some implementations, sorting 307 of rays into buffers associated with a particular shader or a particular object can be implemented using ray tracing deferral aspects described above. In some cases, primitives can each be given a unique number, some portion of which identifies a scene object to which the primitive belongs, and the sorting of the rays into various of the buffers can be based on a primitive identifier associated with the ray, or the scene object-identifying portion thereof.

A buffer selection 318 can control from which buffer ray intersection information is obtained for conducting shading operations. Buffer selection 318 can operate by selecting a fuller or fullest buffer from among buffers 308, 310, and 312. In some cases, buffer selection 318 can select any buffer having more than a minimum number of rays collected therein (collecting rays preferably refers to collecting identifiers for the rays, but also can include collecting definition data for the rays in the buffers). In some examples, a ray result lookup function can be provided where buffers 308-312 store ray identifiers, but less than all data that would be used to identify a particular intersection, such as a primitive identifier. A mux 316 can be controlled by buffer selector 318, so that a selected buffer from buffers 308-312 can be outputted. Ray definition data 311 can be used as a source of ray definition information, where buffers 308-312 store ray identifiers.

In one example, rays can be collected by object, and shader code associated with that object can be loaded 320, and stored, such as in cache 319. Shaders further can load (322) definition data for rays identified in the data read from the selected buffer(s). Vertex attribute data for the object(s) associated with rays from a selected buffer can be paged (324) from memory. Further, during execution, shader code can sample texture and other data useful in shading of ray intersections, which can be paged (326) in larger chunks for use by many different instances sampling such texture. The collections maintained in buffers 308, 310, 312 can be larger, and in some cases much larger than collections maintained with respect to nodes of the acceleration structure. For example, each buffer can hold 256, 512, 1024, 1096, 2048, or more or fewer ray intersection indications. This example was specific, for sake of clarity, to ray tracing. However, a more general application provides that different kinds of computation can be scheduled with different respective sizes of collections of instances of such computation.

Buffering approaches can include including buffer segments of a comparatively small size, such as 128 entries and linking them as needed for a larger buffer. Still further approaches can include having a plurality of buffer sizes, and selecting a buffer size based on a number of primitives composing a shape to be associated with the buffer. For example, a shape associated with 250 k primitives can be associated with a smaller buffer than a 1M primitive shape. Buffer sizes can be created based on an analysis of the scene and the objects composing it. For example, if the scene has a distribution of many smaller objects, than more smaller buffers can be allocated; conversely, if there are fewer larger objects in the scene, then fewer larger buffers can be allocated.

Although a buffered approach was described above, aspects of ray sorting and collection described herein do not require such buffering. For example, groupings of ray information for which intersections have been determined can be outputted immediately after intersection testing, without an intermediate buffering. For example, in some cases, intersection testing resources can concurrently test 32, 64 or more rays for intersection with selections of primitives that can be related to, or part of, the same scene object. Any rays found to intersect from that concurrently testing can be outputted as a group, without buffering, such as buffering to await more rays intersecting the same object. In other implementations, buffering can be used to aggregate hundreds or even thousands of rays for outputting to shading.

In some cases, system implementations can include a software or hardware implemented function that allows a lookup of what triangle was intersected by a given ray. For implementations that provide such a function, the buffers need not store the triangle identifier with the ray or ray identifier, and instead, a lookup can be conducted using the ray identifier when the ray is ready to be shaded.

In the above aspects, it is preferred to page in a relatively large section of vertex attributes and maintain that data in cache while a number of ray intersections are shaded using portions of the paged-in vertex data (and other data).

Figure 7:
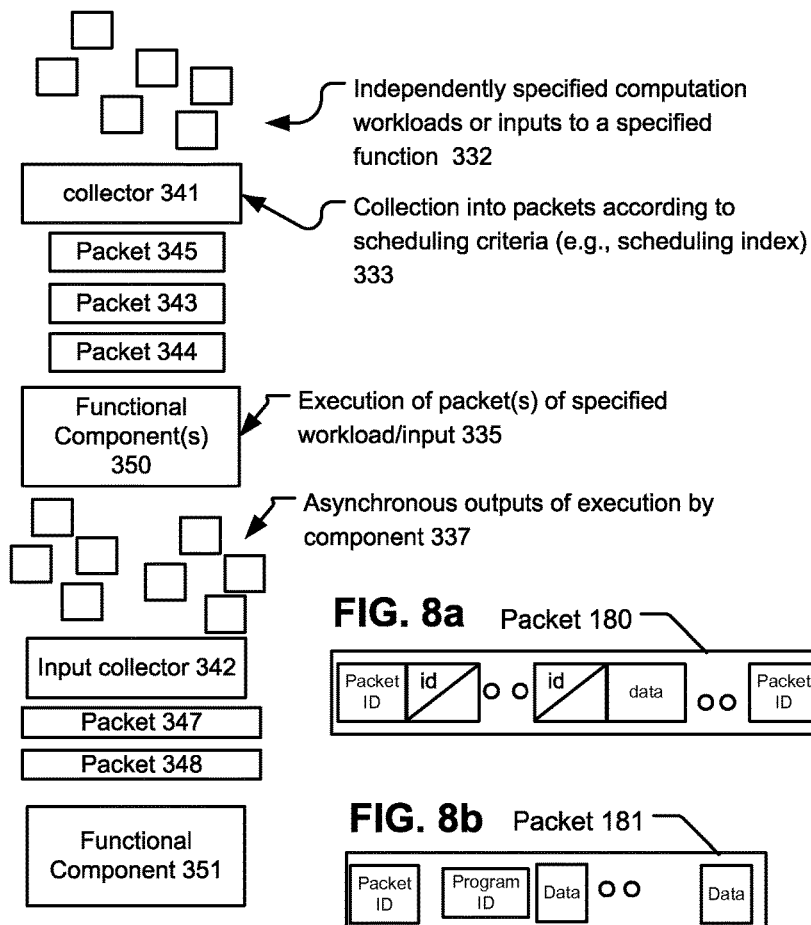
FIG. 7 depicts computation instances, created, packetized as inputs to functional components, processed and causing creation of further computation instances.

FIG. 7 depicts further example aspects of variable sized collections of computation instances. At 332, a plurality of computation instances are specified, such as from a plurality of independently operating computation units. A collector 341 makes collections from these instances 332 (such groupings also may include instances other than instances 332, such that instances 332 can be added to existing collections. Collector 341 outputs packets 343-345. Packets 343-345 can be of a respective size determined according to a type of computation or a type of data that will be used in executing the instances. Packets 343-345 therefore can be the same size or different sizes. Packets 343-345 each may have a maximum size set based on a type of computation instance to be collected, but are not required to have a number of computation instances equal to that maximum size to begin processing.

Packets 343-345 are inputs to functional component(s) 350. Such functional components 350 represent machine execution of the computation instances specified by packets 343-345. As such, functional components 350 can be implemented as threads of code specified by packets 343-345 executing on processor elements of a computation cluster, for example. Outputs from functional components 350 are asynchronous with respect to inputting contents of packets 343-345 to functional components 350. Functional components 350 produce outputs 337 by executing (335) specified workloads from such packets. Such execution can occur asynchronously among functional components 350, in an example. These outputs 337 are collected by an input collector 342. Packets 347-348 are outputted from input collector 342. These packets 347-348 are inputs to functional component(s) 351. FIG. 7 thus depicts a situation where multiple instances of computation can be aggregated into one or more packets, which are a vehicle to distribute those instances among functional components that perform processing responsive to receiving portions of information from the packets. In an example, each input collector 342 can operate to collect a different number of instances based on a type of computation for that instance, or a type of data that may be used during execution of that instance of computation. Functional components 350 and 351 can be ALUs of a computation cluster, configured by instructions identified through a received packet. Functional components also can be implemented by fixed function components, or can represent a pipeline of operations. Outputs of execution by the functional components can represent a further instance of computation to be performed. Collectors 341 and 342 can be implemented as a single functional unit to receive outputs from ALUs of the computation clusters. As such, collectors 341 and 342 can also function to separate or sort outputs of functional components 350 and 351 as part of packet formation.

FIGS. 8a-8c depict examples of packets that can be formed by collectors 341 and 342. FIG. 8a depicts that a packet 180 can have a packet ID, and a sequence of instance identifiers, with a data element identifier or value. FIG. 8a also depicts that packet 180 can be composed of a series of sub-packets that may have different packet IDs, and constituent instance identifiers and data elements for each packet.

FIG. 8b depicts a packet 181 which can have constituent components including a program ID followed by a series of data elements (or identifiers for data elements). FIG. 8b depicts an example packet that may be formed to perform stream type computing on an architecture implementation according to these disclosures.

A lookup of shapes (or more generally, data) associated with a packet ID can be implemented. For example, when packet in ready stack 210 is determined to begin testing, the shape indicated in that packet can be used to identify a plurality of related (e.g., child) shapes, and when those related shapes are identified, identifying information for them can be retained by packet unit 205 or by another functional unit.

Alternatively, if the shapes are explicitly identified, such as by a format like that of format, then lookup can be skipped. In either case, a plurality of shape identifiers are obtained. Each can be hashed and a number of bits from the hash value can be used to index collection memory 212 to identify a plurality of candidate locations for a ray collection associated with that shape ID. For example, collection memory 212 can be implemented a multi-way interleaved cache, and the indexing thus can provide multiple candidate locations for a collection associated with given hash value. Then, an entirety of the shape ID can be compared with a shape ID stored in each candidate location to determine if the location stores a collection for that shape ID. If there is a matching shape ID, then it is determined whether the collection has a free slot, and if so then the rid ID from the packet is added to that location. This example is for collections with fixed sized, which is a preferred implementation, but collections also can be variably sized.

If there is not a free slot, then one of the collections identified as being in one of the matching locations is evicted, and a collection for the shape ID is created at the just-evicted, now free, location.

If there was no match, then it is determined whether any of the candidate locations is open, and if so then a collection is started at that location. If there is no free location, then a collection is evicted and a collection started for the new shape ID at that location. Thus, in some exemplary aspects, collection memory 212 can be managed in fixed size chunks where collections can be stored in a subset of available collection locations, based on hash values of identifiers for them. An eviction strategy can be implemented to ensure that a shape will be able to have rays collected against it. The eviction can result in collection identifying information being placed in ready list 210.

In some implementations, the eviction strategy can be tailored for achieving a variety of objectives that can be relevant in tracing/traversing rays in a scene. For example, an override mode can be implemented in which one or more differing collection selection strategies can be employed. The override mode can be engaged at certain times or in response to certain conditions. In other examples, there need not be an explicit decision to change collection selection modes, and instead a set of collection heuristics can be employed that comprehend the objectives sought to be achieved in both the override and normal modes.

In FIG. 8C, a sequence ID 183 was depicted and serves as an example of an approach to allowing a packet to maintain an index into a dataset, without explicitly identifying a set of data elements to be processed for that packet. For example, where a regular memory layout for computation operates is provided, packet datapath 225 can infer a set of data elements and respective clusters to process members of that set of data elements using sequence ID 183.

FIG. 9 depicts an example structure for a cluster that can be used in an array of clusters, such as those depicted in FIGS. 1-3, for example. FIG. 9 depicts that a cluster controller 455 can maintain a plurality of program counters 456-458. Each program counter can be used to reference sequence of program instructions available from an instruction memory hierarchy 460. In some examples instruction memory hierarchy can include an instruction cache where recently used instructions may be stored. Such instruction cache can implement a least recently used algorithm for example or a trace cache approach in which a sequence of instructions including branches is maintained within the cache. A trace cache approach may be more appropriate for a cluster in which the ALUs can perform speculative execution, e.g. where cluster controller can include a predictive mechanism for predicting whether branches will be taken or not.

Regardless of the specific implementation, a sequence of instructions, e.g. instruction 462 and instruction 464 can be provided from instruction memory hierarchy 462 a plurality of ALUs 471-473. As depicted in FIG. 9, each ALU executes the same instruction concurrently. However, data provided for execution of that instruction may vary. Each ALU communicates fibre completion information 476 and can make requests or otherwise provide information for new fibres 475. Fibre assignment status can be maintained for the cluster by a fibre assignment module 479. In some examples, such module may be included in controller 455. Such module may receive status information from the global scheduler 478. For example, such fibre information can include information for new fibres to be executed within the cluster. Other information that can be maintained between global scheduler and the cluster includes fibre reference count information in some examples such fibre reference count information can be maintained within the cluster on which related fibres execute. In other words, one example implementation causes all related fibres to be executed on a single cluster, and in such implementation reference counts can be maintained within that cluster for those related fibres.

The example of FIG. 9 also shows that each ALU 471-473 maintains a port to cache 480. Cache 480 stores thread local data as exemplified by thread local memory 485-487; cache 480 also can store cache global variables 488. Cache 480 also includes a plurality of fibre memory locations 490-492. The example of FIG. 9 also comprises a broadcast input queue 495. In the example of FIG. 7, each ALU 471-473 can use cache 480 in a manner similar to a register set such that SIMD cluster controller 455 schedule instructions for different threads and different fibres on an instruction by instruction basis without incurring latency.

Figure 10:
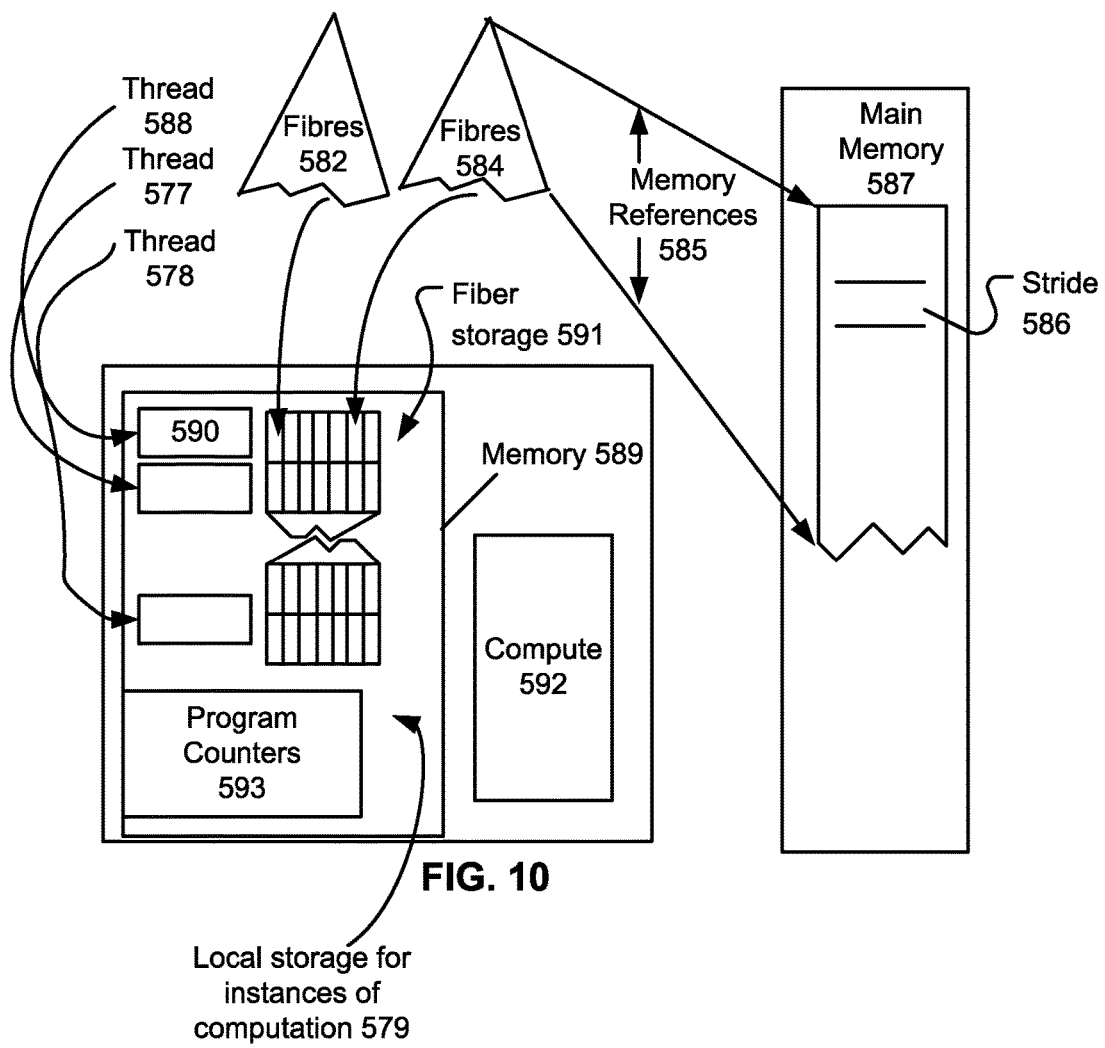
FIG. 10 depicts example heterogeneous computation workloads having data stored in a local memory for a processing element, and main memory access patterns.

FIG. 10 depicts a situation where local memory of a computation cluster stores thread local variables and multiple elements of fibre data storage. For example, thread 588 uses a local storage portion 590 in memory 589. This portion is expected to be allocated during a thread setup process as a maximum amount of memory that the thread 588 is able to use. FIG. 10 depicts two different families of fibres 582 and 584, both of which reference different locations in fibre storage 591, while members of each family reference the same element of fibre storage. FIG. 10 further depicts that memory references made by members of a given family of fibres, e.g. fibres 584, will vary during the course of recursive instantiation of these related fibres. In this example these memory references 585 are made to a main memory 587. Further this example shows that these memory references can be on a regular stride or interval 586. In some implementations these memory references can be used as scheduling keys to collect fibres of different families. For example, fibres from fibres 582 and fibres 584 can be collected together based on matching of these memory references. FIG. 10 also depicts computation resources 592 that can be configured to execute fibres and threads, as explained above.

Figure 11:
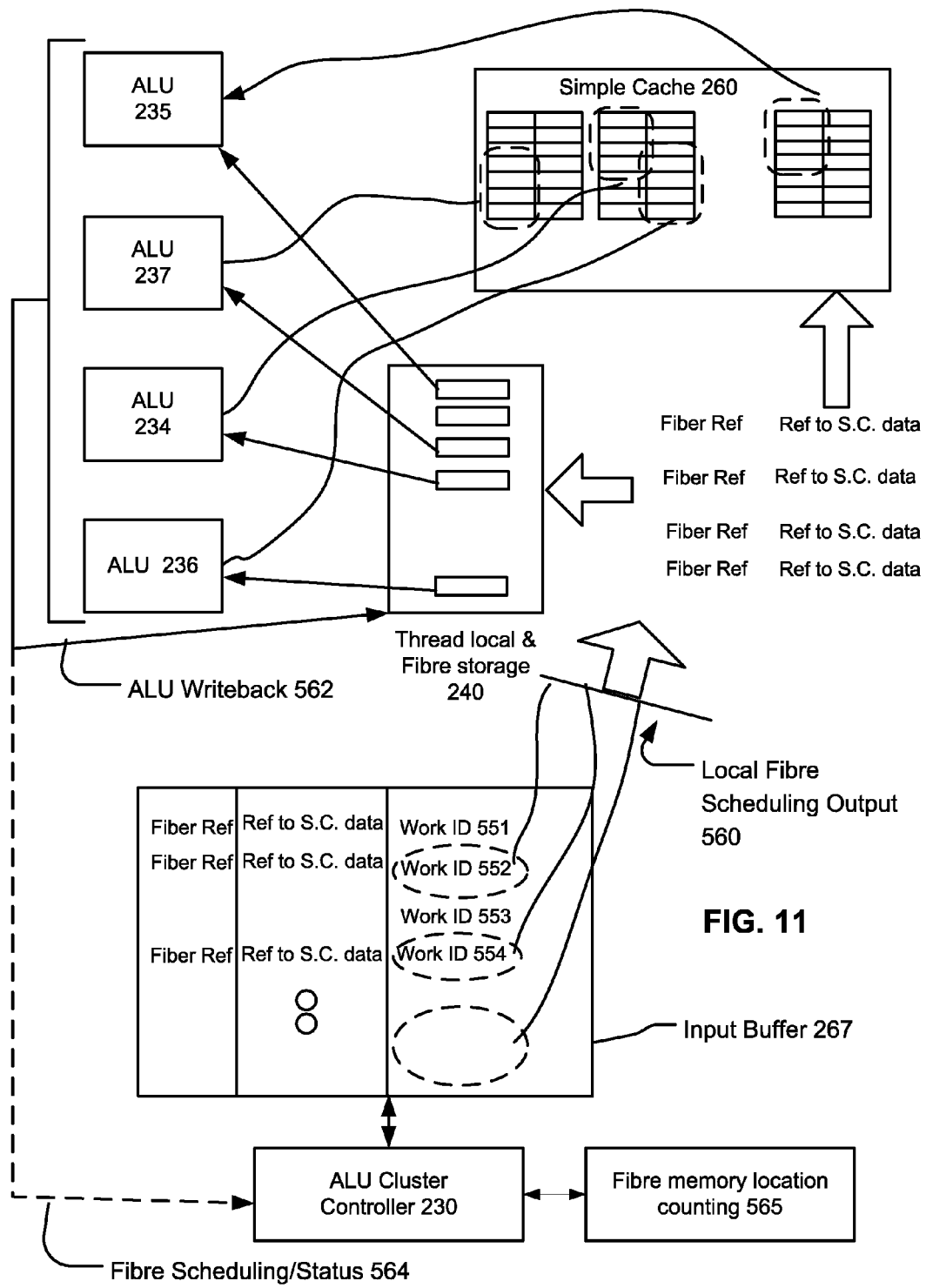
FIG. 11 depicts an example of a processing element comprising a cluster of Arithmetic Logic Units capable of being scheduled by a local scheduler.

FIG. 11 is used to explain an example operation of a cluster comprising a plurality of ALUs 234-237. An ALU cluster controller 230 reads from an input buffer 267 to identify a plurality of portions of work to be performed. The portions of work can be identified by work IDs, which in one implementation are program counters or other references to instructions that are to be executed. These work IDs can be current program counters that indicate the next instruction to be executed for each fibre in input buffer 267. Of course, not all fibres in input buffer 267 may have been taken up for execution within the cluster at any given time, and in such case these work IDs may simply be an identifier of a first instruction for the fibre routine to be executed for those respective fibres. Thus, status information for fibres awaiting execution and for fibres partially executed can be maintained. Program counters can be maintained in respective cluster input buffers, in situations where all the ALUs of a cluster may all be driven from the same program counter, such that only fibres that are to execute the same next instruction may be collected by ALU cluster controller 230 for execution.

Such status information is more relevant for implementations where ALU cluster scheduler can interrupt fibre routines during execution, such as on an instruction by instruction basis. However in other implementations, a group of fibre routines from input buffer 267 that have not yet begun execution can be scheduled and can be entirely executed without interruption and execution of a different program stream. In either case, threads can be treated differently, in that ALU cluster controller can interrupt execution of threads, such as for the purpose of executing selected fibre routines from input buffer 267. For example, threads that are executing can be interrupted to perform a fibre routine.

FIG. 11 further depicts that work IDs selected from input buffer 267 can be grouped into a local fibre scheduling output 560. In this example for fibres each with a matching work ID can be comprised in output 560. Each fibre reference can be used to retrieve a particular element of fibre storage data from thread local and fibre storage 240 and provide that respective element of fibre storage data to different of the ALUs 234-237. Similarly each fibre comprised in scheduling output 560 can reference one or more data elements stored in simple cache 260.

In one example, each fibre can reference different data elements in simple cache 260 and in other implementations multiple of the fibres scheduled for execution on ALU 234-237 can reference the same element of data from simple cache 260. Thus each ALU 234-237 executes the same thread of control, but can operate on different elements of fibre data in different elements of data from simple cache 260. Each ALU further can output information to be stored and thread local and fibre storage 240. These writes are made to respective elements of fibre storage. Where no two fibres that reference the same element of fibre storage are scheduled for parallel execution by ALU cluster 230, protection mechanisms for thread local and fibre storage 230 for such fibre storage locations is unnecessary in such implementation. Information concerning fibre scheduling and status 564 also can be provided from ALUs 234-237 to ALU cluster controller 230. In turn ALU cluster controller 230 can update fibre memory location counts 565 to account for new fibres created by fibre routines that have executed and also to account for fibres that now have completed. It is noted however that, in many implementations, ALU cluster controller does not control population of its input buffer 267 with new fibres that have been created. Rather, input buffer 267 is populated by a central controller which also populates one or more other input buffers for other ALU clusters (not depicted here).

Figure 12:
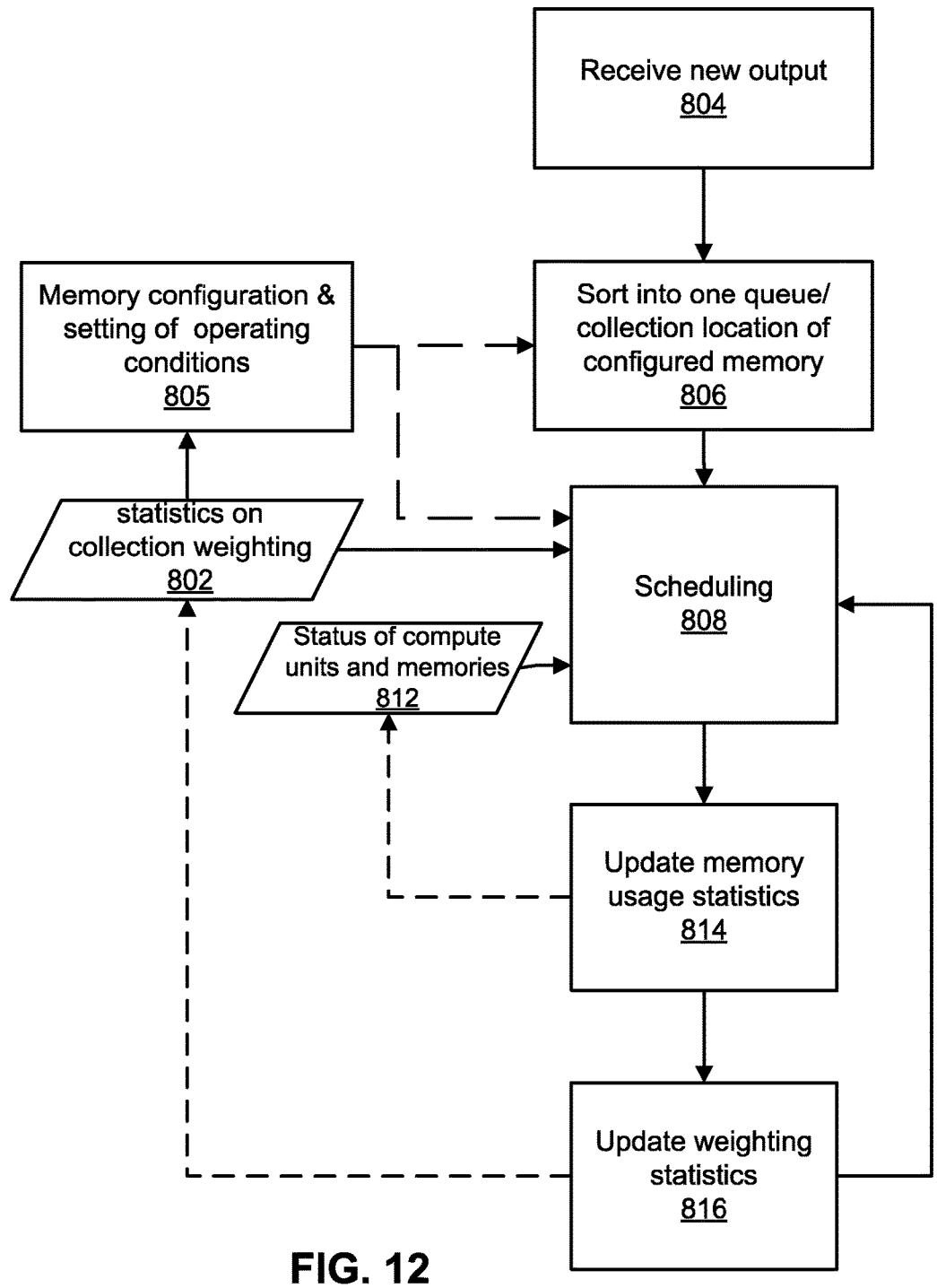
FIG. 12 depicts method aspects for an approach to dynamic scheduling and population control of computation instances.

For example, FIG. 12 illustrates an example where new rays (more generally, computation instances, but for simplicity, rays are described) are received (804) from a camera shader and/or other shaders (more generally, other executing computation instances). Weights associated with the new rays are accessed to sort (806) each of the rays into one queue of a plurality of queues. Such weights used for sorting can be represented as statistics on ray weighting (802). For example, three queues can be provided, such that rays with weights up to a certain number are put into the low queue, a middle range of weights go in the middle queue, and the rest go in the high queue. Memory configuration, system configuration, and operating conditions (805) also can be input to sorting and scheduling (808). Memory configuration can indicate a number of queues, and what rays are to be disposed in each queue, for example.

Then, a determination as to which queue to pull a subsequent indication from for testing is determined (scheduling 808) based on memory usage statistics (812). Updating (814) of the memory usage statistics and also those of the weighting statistics (816) can be accomplished. The method can loop to obtain another indication from one of the queues.

FIG. 13 depicts an example of dynamic collection, scheduling, and distributed execution of fibre routines on a plurality of computation cores 543-545. More particularly the depicted example shows that a number of fibres to be processed 505 can be instantiated. Such instantiation as described can occur by virtue of threads instantiating fibres or by fibres instantiating descendent fibres. In some exemplary implementations threads can instantiate new fibres storage but fibres can only create descendent fibres that reference already instantiated fibre storage within the scope of the instantiating fibre. FIG. 13 depicts that each fibre definition comprises a scheduling key 510, at data reference 511, and further may comprise prioritization information 512. Data reference 511 is intended to be a reference to fibre storage. Scheduling key 510 can be inferred or it can be explicit.

FIG. 13 further depicts two function modules, one being a collection forming module 515 and another being a fibre storage maintenance module 516. Each function can be performed as part of a scheduler module or can be provided by separate hardware and/or software. These modules receive information about fibres to be processed 505. Such information can be generated during execution of threads, fibres, or a combination thereof, in cores 543-545. The information returned can include identifying information for the fibre, such as an identifier string (e.g., a number), information about a scheduling key, and information about a program to be run when executing the fibre (e.g., a program counter). However, not all this information need be returned or transmitted to collection forming module 515.

For example, in some implementations, all fibres that reference a particular element of fibre storage can be made to execute on the core with the local storage that has access to that element of fibre storage (in an example where there is a disjoint separation of fibre elements among memories). Therefore, in such implementations, when one fibre that references such memory element instantiates another fibre, some portion of information about the newly instantiated fibre can be kept locally. For example, information identifying the program that the fibre will execute can be kept locally; the location of the fibre memory element being referenced also can be kept locally (in contrast, for example, from sending all fibre data to a central collection maintenance function—here collection forming module 515).

Fibre storage maintenance module 516 in conjunction with fibre memory set up 525 operate to provide or allocate fibre memory storage locations in the distributed memories of cores 543-545. As such fibre storage maintenance module 516 can maintain information about current memory usage in cores 543-545. Such memory usage can include thread local storage for threads in addition to fibre memory storage.

Collection storage 518 stores identifications of fibres correlated with their scheduling key, such that groupings of fibres that have a common scheduling key can be selected and output together. Scheduler 533 can select which grouping of fibres is to be outputted, and by particular example a dispatched packet of fibres 519 is shown. Packet 519 also includes a packet identifier and a packet priority indicator. These elements can be created by scheduler 533 upon selection of a group of fibres based on matching their scheduling keys. Subsequently the fibres of a given packet are distributed among input buffers 540-542 each corresponding to a respective core 543-545. The distribution of the fibres is determined based on where a fibre data elements used by a particular fibre is located among the distributed memories of the cores. Such memory can be selected based on a fibre ID or based on an explicit memory reference, for example.

Each core as it is executing workloads, which can include threads and fibre routines, can output fibre status information 549. Such status information can include new fibres instantiated by other fibres or threads, as well as information about which fibres have been completed. Information about completing fibres can be used to decrement reference counts of fibres that require access to the same element of fibre storage; likewise, instantiation of new fibres that reference a given element of fibre storage results in increase of such reference counts. These reference counts can be maintained by a given core where a group of related fibres executes or by a centralized resource.

For example, collection forming 515 is implemented using a hardware based hash, in which each fibre can be slotted into a collection according to a hash of a respective fibre identifier. The collection forming function 515 groups fibres according to scheduling keys. FIG. 13 depicts scheduling keys 520-523 respectively associated with collections having varying numbers of fibres, each comprised within collections storage 518.

In sum, FIG. 13 depicts how streams of fibres can be instantiated and processed concurrently in a distributed computation resource, but without rigid criteria concerning synchronization of accesses to memory or synchronization of program execution among different cores of the computation resource. Rather FIG. 13 depicts that collections of work to be performed, e.g. fibres, are made with one objective being amortization of access to a larger slower memory resource and persistency of storage of data that will be persistently used or updated during a given sequence of computational elements.

FIG. 14A depicts a packet flow format in which timeslots T1 . . . T5 are available. New ray packets 843 in this example can identify up to 40 rays in each timeslot, while the intersection testing resources can test up to 32 rays in each timeslot, as depicted by ray testing 841. FIG. 14A depicts a situation where a series of completely full packets 845-848 are provided for testing over timeslots T1-T4. Since the completely full packets contain 40 rays, intersection testing of 4 40 ray packets requires 5 timeslots. Thus, in timeslot 5, no new rays begin intersection testing.

With deeper buffers at an input to intersection testing (e.g., buffers 421a-421n), more ray packets can be received before intersection testing must begin to catch up. However, in other implementations, it is expected that the excess of ray identifier transmission capability to ray intersection testing capacity is to be used primarily to allow transmission of non-full collections, while keeping intersection testing resources saturated. Transmission of non-full collections, while maintaining saturation allows implementing of collection selection/eviction strategies that can be dynamic during intersection testing progress.

Of note is that FIG. 14A is depicted from the perspective of an abstraction point (e.g, 160, 45, 223, 225), such that the packets are provided through such abstraction point, but packet unit 205 does not have visibility to what rays were tested or not, or to which intersection tester each ray of a given collection was distributed.

Such an example is depicted in FIG. 14B, wherein the same 5 timeslots are depicted. In T1, a 40 ray packet is transmitted, and 32 rays are tested, leaving 8 untested. FIG. 14B further illustrates that a 32 ray packet can be received in the T2 timeslot, while 32 rays are tested. Thus, of the 40 rays available for testing, 32 can be tested, leaving 8. In T3, a 24 ray packet is received, making 32 rays available for test, all of which can be tested in T3. In T4 and T5, 40 ray packets are received, while 32 rays are tested in each timeslot, such that 16 rays can be left over for testing in subsequent timeslots. In practice, buffering can be deeper that what was described here, such that even if some mostly empty packets were received, the buffers for each test would have enough ray identifiers to test.

FIG. 15 depicts further exemplary details of how a cluster 820 can implement ray intersection testing. In the depicted example, cluster 820 may comprise a plurality of testers 1102a-1102n (ALUs configured for intersection testing during such processing), each having access to working memory 810, and which stores data defining a plurality of shapes 825, 826, and 833. These shapes were stored in working memory 810 as a result of a memory fetch initiated by a packet unit (e.g., 105). Buffer 834 stores ray identifiers that have been received from a plurality of packets that were distributed through an abstraction point. FIG. 15 depicts further that rays identified by a selection of such ray identifiers are loaded into respective testers 1102a-1102n from ray definition data storage 835. As depicted, different of testers 1102a-1102n can test rays from different packets against different shapes.

In some cases, each tester 1102a-1102n can be implemented as a thread executing on a computation unit. Although each tester 1102a-1102n can test different rays against different shapes, the shapes and rays available for test in any of tester 1102a-1102n preferably is based on whether a given intersection tester has localized access to definition data for a particular ray. Further, since that particular ray is associated through collections with objects to be tested for intersection, both the ray identifiers and the shapes available in the testers is determined ultimately by a packet unit (e.g., 105). By contrast, a number of computation units executing freely on work scheduled independently would be accessing main memory in a more random pattern and with less efficiency.

As explained above, architectures can allow asynchronous control of when rays are presented for intersection testing, such that locality of object data against which the rays will be tested is substantially increased. It can be the case in intersection testing that packets can often be filled as these example architectures provide for deferral of intersection testing for rays, and in such cases, object data often can be streamed from main memory, as a large number of rays can be tested against a large number of objects. However, it can be desirable at times to schedule testing of packets that are less full.

For example, intersection testers can be designed to use collection storage of a given size, implying that either a maximum or approximate maximum of collections can be stored at a given time, or that a maximum number of active collections can be maintained in a faster memory, for example. As explained, rays can be collected against elements of an acceleration structure (e.g., a hierarchical structure). In some implementations, at each point in such a structure, there can be a relatively high fan out. For example, a given node in the structure can have 8, 10, 16, 24 or even 32 child nodes that are to be tested next for intersection. In turn, each of those nodes can have their own child nodes. Although it is generally desirable to disperse rays into a number of different collections, in order to increase ray diversity and identify more rays that can be tested against a common object (e.g., an acceleration element), such dispersal also can cause creation of too many collections that each need to be tracked.

In some computing problems, a workload can begin to be processed, and as the processing of the workload progresses, a set of dependencies to be resolved before completion of the workload can grow until a point when the dependencies begin to resolve. One approach to expressing such a computational paradigm that finds favor with programmers is the usage of recursion, in that it is provides a programmatically simple and logical way to track outstanding state to be resolved for a workload. Although recursion may be appropriate for some computation workloads and some architectures, in one approach according to the disclosure, a recursive computation workload is mapped to an expression of a workload in which a set of fibres is used to define the workload, and which are not recursively resolved.

Then, any such identified or otherwise selected collections can be evicted or flagged as ready for test, and can be stored in a ready list (e.g. 164).

Figure 16:
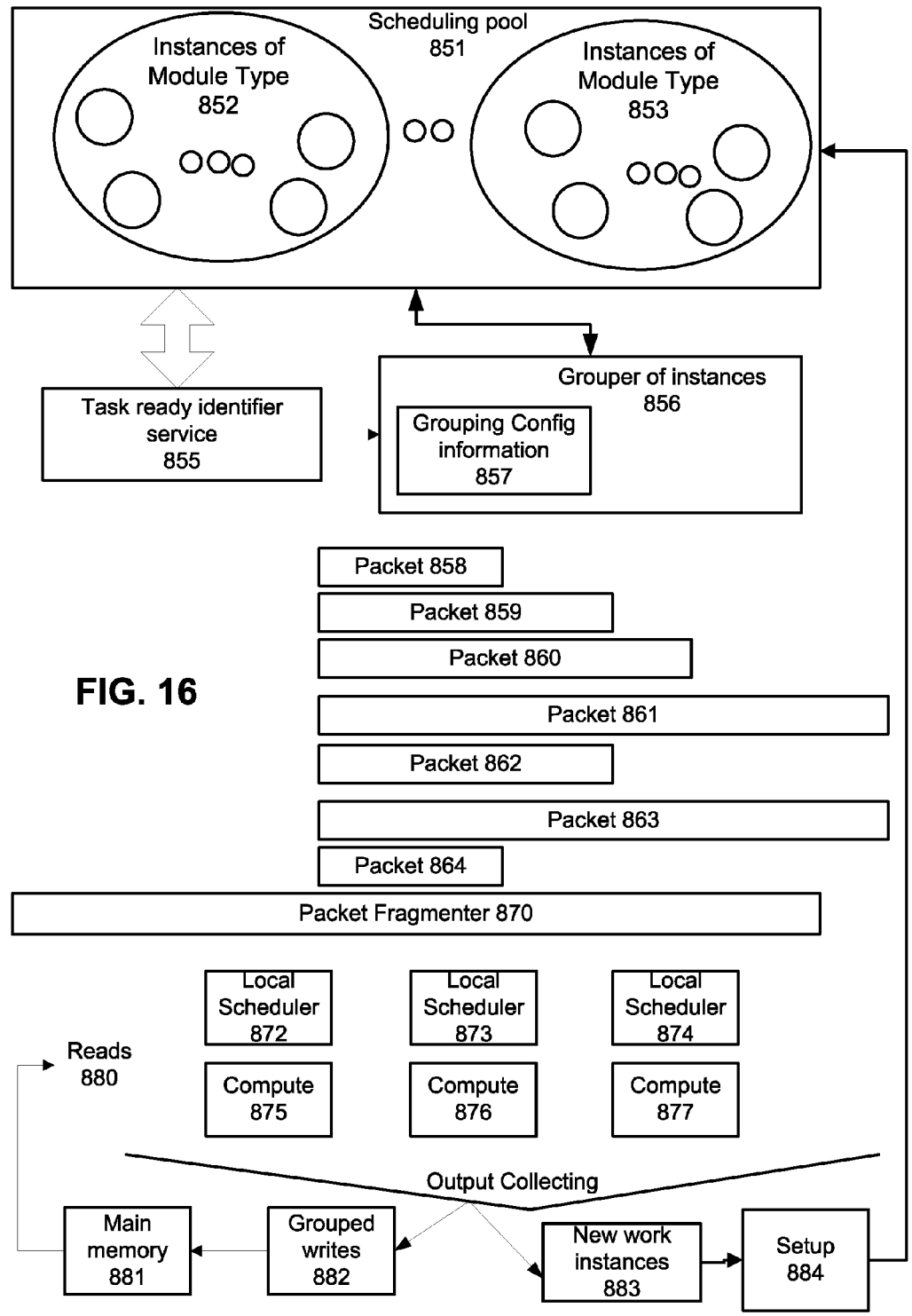
FIG. 16 depicts an example system architecture in which a scheduling pool of instances to be processed are grouped and scheduled for output in variable-sized packets, which can be fragmented for processing on a group of processing elements.
Figure 17:
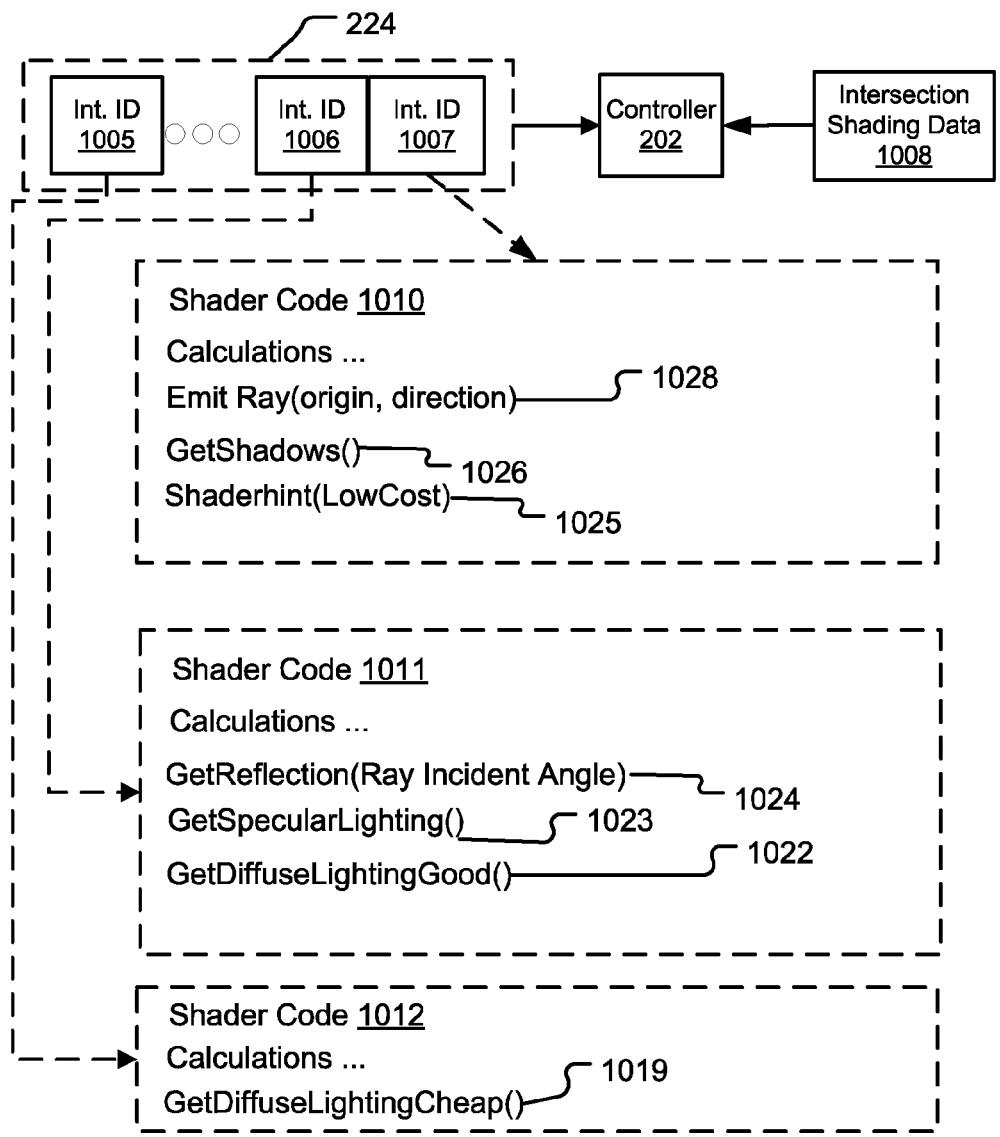
FIG. 17 depicts aspects of mapping shaders to identified ray/primitive intersections, and examples of constituent code that may compose such shaders.

FIG. 16 summarizes a variety of the disclosures above. FIG. 16 depicts that a scheduling pool 851 of computation instances can be collected into different collections according to a type of computation (e.g., a specific portion of program code or code module executed by the instance). Specifically, collections 852 and 853 are depicted. A task ready identifier service 855 monitors status of the collections in scheduling pool 851 and communicates with a grouper 856. Grouper 856 contains configuration information 857 that determines how grouper 856 should treat different instances that are to be grouped and maintained in scheduling pool 851. Grouper 856 operates to produce sequences of packets 858-864 defining instances that are dispatched for execution on processing elements. As depicted, such packets can have a variety of different sizes. Packets can have different numbers of computation instances, and can have different kinds of data provided in the packets, which would be used during execution. For example, some packets may specify a vertex shading program, and include a number of vertexes in the packet, while in other implementations, a memory address for vertexes to be shaded can be provided in the packet.

A packet fragmenter 870 causes packets 858-864 to be fragmented such that different portions of information contained in the packets is provided to different portions of the processing elements. In FIG. 16, processing elements 875-877 are depicted, where each element 875-877 is driven by a respective local scheduler 872-874. Each processing element 875-877 executes instances provided to it from packet fragmenter 870 and generates outputs. A grouped write unit 882 can coalesce outputs to a main memory 881, which can be read 880 by processing elements 875-877. New instances of computation can be generates by each of the processing elements 875-877, which are outputted through a setup module 884 and fed back for grouping and storage in scheduling pool 851.

Figure 18:
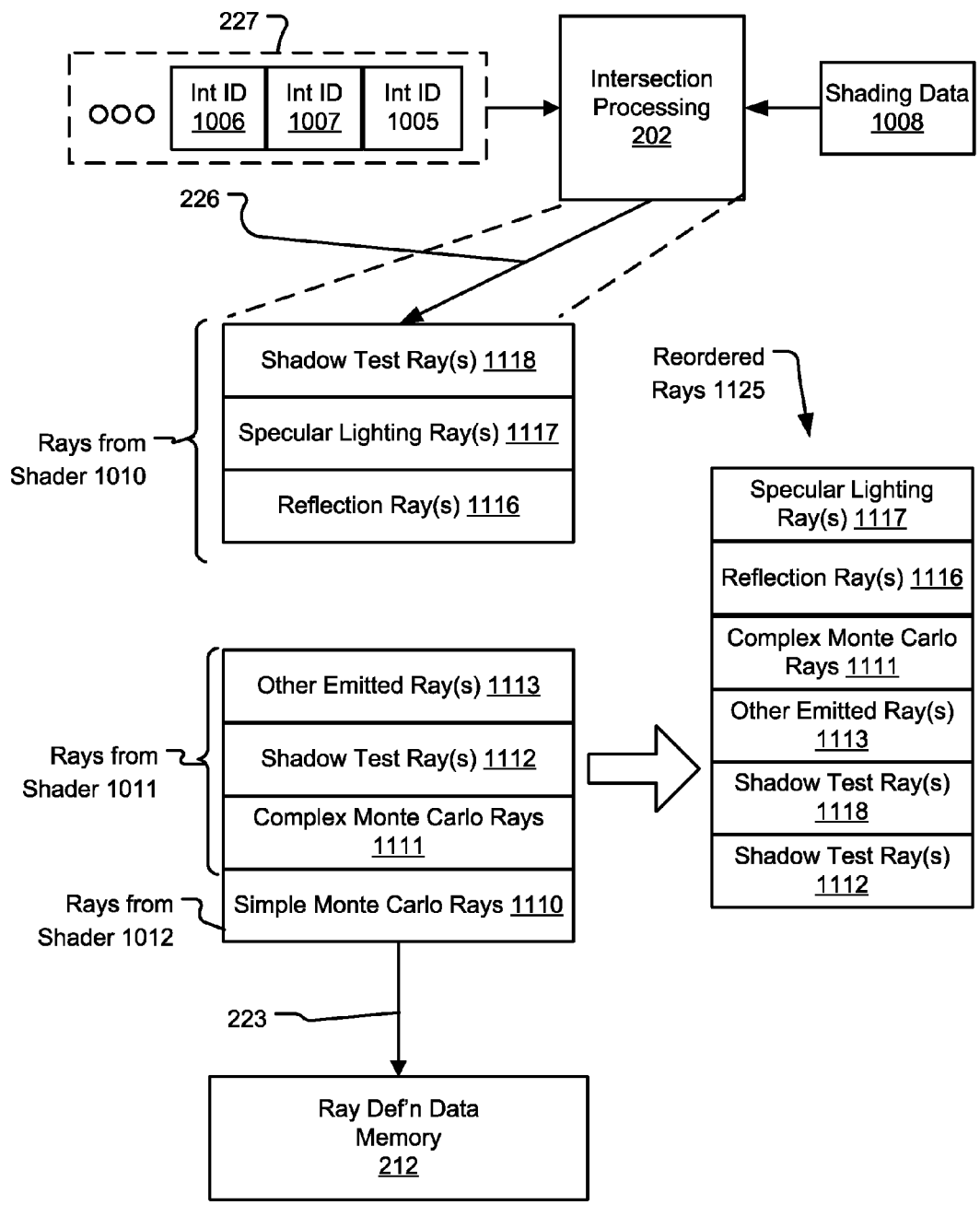
FIG. 18 depicts output of new rays to be intersection tested based on the shaders depicted in FIG. 17.

FIG. 18 illustrates an approach where contents of shaders can be analyzed or speculatively executed, in order to determine shader behavior for the purposes of determining whether that shader should be executed and its rays emitted for storage and intersection testing. Link 224 comprising a plurality of intersection indications 1005-1007 are read by controller 202, which receives or accesses data concerning intersection shading 1008, and which can include memory usage statistics and the like. Each of the intersection indications is mapped to shader code, respectively 1010, 1011, and 1012. In this example, shader 1010 comprises an emit ray call 1028, a getshadows( ) call 1026 and a shaderhint 1025. Shader 1011 comprises a getreflection 1024 call, a getDiffuseLightingGood( ) call 1022, while shader 1012 includes a getDiffuseLightingCheap( ) call 1019. In one aspect, the shaderhint call of shader 1010 can be used to interpret that the shader 1010 does not emit a large number of new rays. This hint can be used to determine that the shader should be allowed to run. In some cases, hints that can be provided by shaders express or can be interpreted to express a maximum number of rays that are allowed to be emitted during shading of an intersection of that ray. In other words, a shader can emit a ray, with a maximum ray number hint, an intersection for that ray is identified, and during shading of that new identified intersection, the maximum ray number hint can be used to determine whether shading should be deferred.

In another example, the nature of the calls can be analyzed. For example, shader 1011 includes getDiffuseLightingGood( ) call 1022, while shader 1012 includes a cheap diffuse lighting call 1019. Thus, a compiler can generate a hint that shader 1012 would be cheap or relatively cheaper in terms of new ray emissions. This determination also can be made at run time.

A still further variation is that each shader can be allowed to run in a sandbox, and its ray emissions counted or otherwise analyzed to determine whether that shader's behavior is appropriate to allow execution at that point, given memory usage information, and the like.

FIG. 18 depicts further aspects that can be implemented based on example architectures disclosed herein. A number of intersection indications are available from queue/link 227, and are shaded by intersection processing 202, with intersection shading data 1008. Outputs, though link 226, include the rays depicted. For example, complex Monte Carlo rays 1111 are due to the getDiffuseLightingGood call 1022, while the simple Monte Carlo rays 1110 are due to the getDiffuseLightingCheap( ) call 1019. Link 223 is shown leading to ray data master memory 212.

FIG. 18 illustrates that these rays can be reordered into an order that is more appropriate for causing fewer rays to be emitted subsequently. For example, specular lighting rays and reflection rays can be submitted for intersection testing after shadow test rays and Monte Carlo rays, which may be less likely to cause execution of shaders that will emit a large number of rays themselves.

In sum, one common attribute of the above examples is modulating a number of rays that are emitted to be stored for intersection testing in a scene being rendered. In some examples, the modulation is implemented by a relatively direct control over such control by deferring shading of intersections for rays that are likely to immediately issue a large number of new rays. In other examples, higher order effects can be used for ray population control. For example, amongst a number of shaders that have emitted new rays, those rays that are less likely to invoke shaders that emit a large number of new rays can be prioritized for intersection. For example, although a mirror shader may only issue a few rays, those rays ultimately may hit a primitive whose shader would emit a large number of rays. By contrast, a large number of shadow or diffuse lighting rays, although large in number, are not likely to cause invocation of shaders that would emit large numbers of rays during shading of intersections involving those rays.

Figure 19:
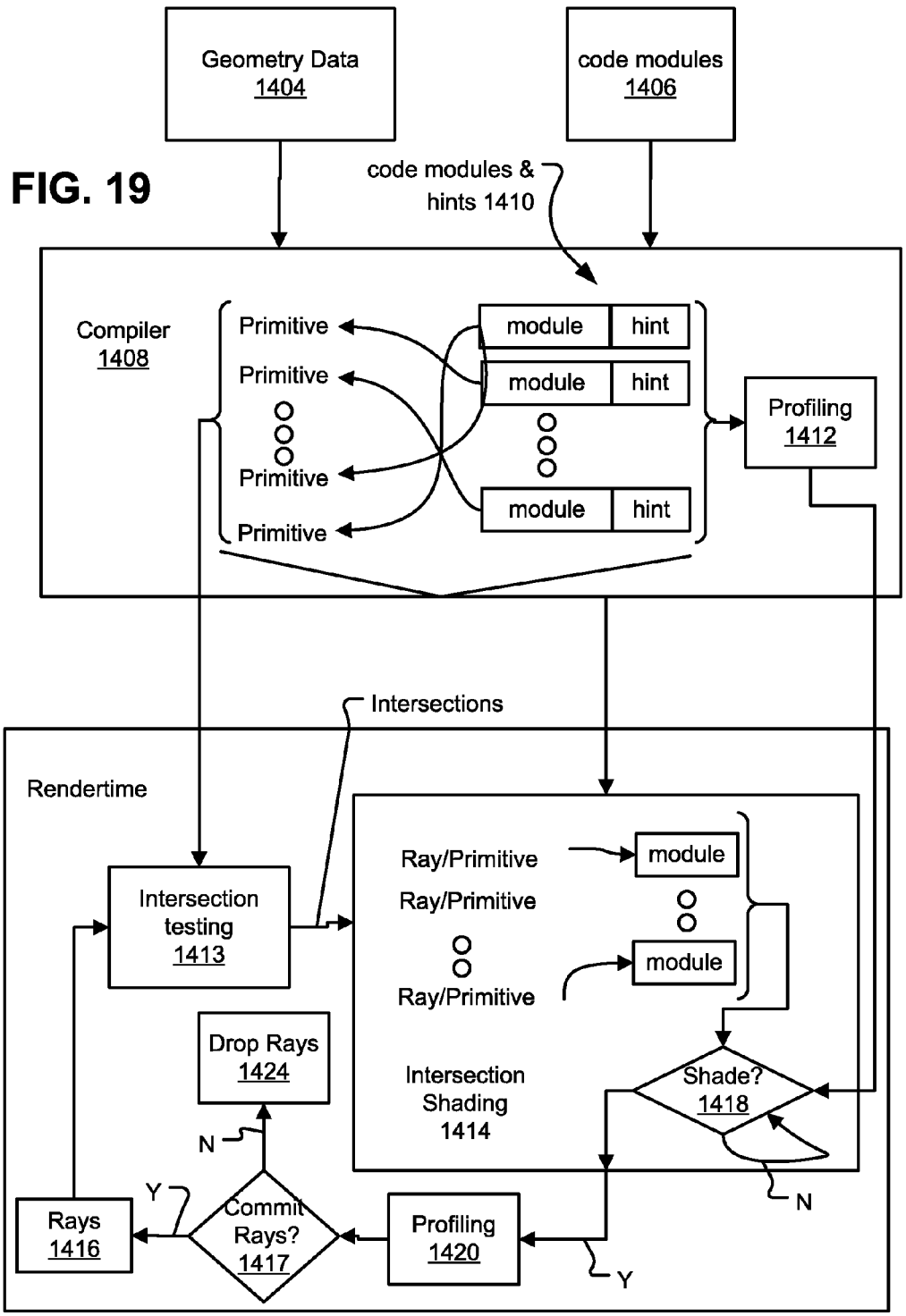
FIG. 19 depicts aspects of a compile time/run time rendering view, in which various examples of shader profiling, hinting, and scratch execution can be provided.

FIG. 19 depicts a further example in which various further aspects and approaches to ray population control are disclosed. In FIG. 19, geometry data 1404 and shader code modules 1406 are provided to a compiler 1408, which makes preparations for scene rendering. One function of compiler 1408 is to bind or otherwise associate primitives of geometry data 1404 to shader code modules, each of which are depicted as being associated with a respective hint concerning that shader's behavior in issuing new rays in run time. A profiling function 1412 uses these hints in producing data that can be used to direct render time behavior. At render time, the scene primitives are provided for intersection 1413 with rays of various sorts (typically starting with camera rays, then rays spawned by such testing, and so on). Indications of such intersections are provided to intersecting shading 1414, wherein shader modules for those intersections can be identified. A decision as to which of these shaders to run can then be made on data derived from the hints. For example, if such hinting information indicates that a particular shader may issue a comparatively large number of rays when shaded, then that shader can be deferred in favor of executing another shader, if there is information indicating a surplus of ray data (or rays). If there is no indication of a constraint in memory rays, a ray surplus or other equivalent indication, as implemented in particular embodiments, then shaders can be executed without analysis of hinting information.

Additional or different population control functionality can be implemented as well. For example, after the shader has been executed, profiling 1420 of the rays that were emitted can occur. For example, a number of rays emitted by that shader can be counted. If weighting factors are associated with the rays, statistics concerning those weighting factors can be collected. Such statistics can be pertinent for estimating future effects of running the shader. For example, if only a few highly weighted rays are emitted, then that shader may be immediately cheap, but if each of those rays spawn a large number of rays when they are shaded, then that may be a relevant consideration to be used in some implementations.

In some examples, the original execution of a shader can be done in a scratch memory area that can absorb a large number of rays, or if there is a limit as to a number of rays that can be emitted by any given shader, then the scratch area can be implemented based on that largest expected number of rays. Then, after profiling 1420, it can be determined (1417) whether those rays 1416 are to be finally committed for intersection testing, or whether they should be discarded/dropped (1424). For example, in a constrained memory condition, the rays can be discarded if they ultimately end up being larger than expected, or larger than what can be absorbed within desired operating conditions (e.g., keeping memory utilization under a threshold).

Profiling 1420 also can result in data that is fed back to be used in an original shading decision. For example, hint information can be used at first, and when actual execution information is available, that actual execution information can substitute for or supplement the hint information. The execution information can be according to various branches in shader code, such that the hint information can be used for not-yet-taken branches in a particular shader, if there are any, while branches that have been taken, actual profiled ray emission data can be used in shade/no shade decisions.

In some implementations, there is a comparison between information associated with one ray and information associated with a group of rays, where that comparison is for making probabilistic determination as to behavior of a shader for the ray. The concept can thus be described in relative terms, such that a ray when shaded may be more likely than another ray, or a typical ray, to cause more ray emission. The usage of such relative comparisons would be understandable by those of ordinary skill to be interpretable based on the context, and implementable based on particulars of a situation.

Information gathered by profiling can be stored or otherwise maintained for usage throughout rendering, within a single frame rendering, within rendering of a sequence of frames, or throughout usage of that shader module. Such profiling information can be of predictive as to how many rays may be issued by that shader during execution, even though it may not be absolutely deterministic. In particular, shaders may issue a different number of rays based in part on what kind of ray hit a primitive associated with that shader. Therefore, what happens with a particular shader during rendering of a scene usually would depend both on the shader module and what happens during rendering of a given scene. Nevertheless, predictive value of such profiling data remains. In still further examples, the profiling data can be increasingly specific, and can include data about what kind of ray provoked a particular behavior of that shader. For example, the same shader can be associated with a number of primitives, and that shader can be run in response to a number of detected ray/primitive intersections. Thus, profiling can include maintaining information about what kind of ray (e.g., shadow, diffuse lighting, and so on) provoked a particular behavior. Other information considered helpful or predictive of shader behavior also can be profiled, stored or otherwise maintained during rendering. For example, histograms of rays that were emitted by the shaders can be maintained, they can be associated with weighting factors, and in some cases, they can also be associated with particular branches within code of a particular shading module. Between frames of a sequence, the same shader again may be used, such that the profiled information can continue to be of use in predicting behavior of that shader in rendering subsequent frame sequences.

As would be understood from these disclosures, a variety of attributes, data and other information can be used in estimating, predicting, quantifying or otherwise probabilistically determining shader behavior. However, it often will be the case that precise determinations of shader behavior will not be available. Therefore, decisions made to dynamically control ray population often are heuristic to some degree. As explained above, the heuristic can include gathering data about system resource usage or availability of system resources, data about what rays have been shaded, statistics about such information and so on.

Decisions about whether or not to allow a particular ray intersection to be shaded at a given time then can be based on comparisons between ray intersections available for shading at that time or based on a window of such available intersections. Decisions also can be made based on statistical information, and using that information in comparisons involving particular intersections. Thus, each ultimate decision to shade an intersection at a given point in rendering can involve comparative and/or qualitative determinations, such as whether a shader would emit comparatively more or fewer rays than another shader. Similarly, determinations as to resource usage can be qualitative and need not be precisely numerical. From the disclosed variety of examples and other information, a person of ordinary skill would be able to understand how these terms should be applied or understood in a particular circumstance, based on the various considerations disclosed and other considerations that can be understood from these exemplary disclosures.

By way of further summary, systems according to these examples can more broadly operate to allocate resources between driving intersection testing into further areas of a scene structure, and to produce a wider variety of rays and to starting new camera rays. Ultimately, it is expected to test all rays emitted by the shaders that execute, but an order of execution can have important effects on memory usage during rendering.

Any of the functions, features, and other logic described herein can be implemented with a variety of computing resources. Examples of computing resource(s) include a thread, a core, a processor, a group of processors, a virtual machine, a fixed function processing element, and the like. Thus, various approaches, aspects of methods, processing components, and the like were described, and such computing resources can provide means for implementing these functions. Also, other functions that may be used in implementing embodiments can be provided or implemented as a process, thread or task that can be localized to one computing resource or distributed among a plurality of computing resources (e.g., a plurality of threads distributed among a plurality of physical compute resources).

By particular example, computing resources being used for intersection test can also host other processes, such as shading processes that are used to shade intersections detected. By further example, if a core can support multiple threads, then a thread can be dedicated to shading while another thread can be dedicated to intersection processing.

As discussed above, the described examples can be used in transforming a 3-D scene into a 2-D representation of it, as viewed from a defined vantage point. The 3-D scene can include data representations of physical objects. Other results of ray intersection testing can include object visibility determinations, which can be used in a variety of applications. Other transformations include transforming computer readable media into a different state by storing data determined according to the defined methods.

Now, turning to FIG. 20*a*, there is illustrated a portion of test control 703, comprising banks of memory associated with each of ray data 766*a*-766*n*, each bank having slots for populating with ray data, and addressable by memory addresses. FIG. 20*a* illustrates that output 744 from queue 730 includes ray identifiers 1, 18, 106, and 480, each of which have spaces allocated in memory 803, and which are allowed to be overwritten in response to reception of these ray identifiers from output 744. Output 745 includes ray data for use in shading. Output 745 may also include other data. In practice memory 803 may be implemented in a memory used also by other processes, such as processes executing shaders, and therefore output 745 can represent retrieval of such data from memory 803 by computing resource, and in such cases, output 745 can continue to carry ray ID data for use in such retrieval.

FIG. 20*b* illustrates that data for new rays comes in from output 741 (from shading operations). Such ray data at least includes ray origin and direction information. Now, test control 703 assigns these new rays to locations in memory 803 that are for different of the ray data 766*a*-766*n*. The identifier associated with each ray origin and direction depends on where it was stored. Output 743 includes both the ray identifiers and their associated origin and direction information stored in memory 803. The assignment of ray IDs illustrated in FIGS. 20*a* and 20*b* is convenient, in that a ray ID can be used to index a memory to identify relevant data.

FIG. 21 depicts a local storage allocator 1085, which receives inputs including a status of local memories 1081 (e.g., local memories of processor elements). Local storage allocator 1085 has inputs to receive new thread inputs (new thread input 1078) and new fibre inputs 1079 (collectively identified as inputs for new computation instances 1077). In some implementations, where fibres are threads that are treated according fibre computing aspects disclosed herein, such as allocation, serialization, packetization and recursive instantiation, these inputs can be a single logical or physical input that would include data indicating a computation model to be performed.

FIG. 22 depicts an example process of characterizing computation instances, and using outputs of different approaches to characterization in determining how and on what resources the computation instances will be executed. This example process has some portions that are generally appropriate to implement in a runtime situation, in which specific instances of a given program module are being created. However, many of the depicted process portions can be implemented before scene rendering. Profiling can occur both before and during scene rendering. At 1050, parameters or other information defining a computation instance for which an allocated is needed are accessed. Such access can be during runtime, in that a particular instance of computation can be profiled during runtime. At 1052, code for an instance can be profiled. At 1054, such profiling can include inspecting flags included with the code. Such flags may have been generated during a previous profiling of that code module, or may have been provided by a programmer or other tool. These flags may have information related to the following process steps. At 1056, an estimate of promiscuity of the code module (or more specifically, the instance being considered), and at 1058, an estimate of proliferation of the code module can be produced. At 1060, a relative priority for the instance can be determined. At 1062, a collection size for scheduling of instances of the code module is determined. At 1065, these characterizations and determinations are captured for storage relating to profiled modules, or can be used to update flags stored in the code modules.

FIG. 23 depicts an example approach to estimating 1056 promiscuity of a code module during execution. FIG. 23 depicts that, at 1066, a number of memory reads can be estimated, and at 1067, kinds of memory reads can be estimated. For example, a characterization of a pattern of the memory reads can be made. Other dependencies can be characterized at 1068, and a similarity (1069) and dissimilarly (1070) of a current code module to other code modules can be estimated.

FIG. 24 depicts an example process for estimating proliferation 1058. At 1071, a number of outputs produced during execution of the code module is estimated. At 1073, a number of new routines resulting from execution of the code module is estimated. And at 1075, an estimate of promiscuity/proliferation of routines called during execution of the code module can be estimated.

Figure 25:
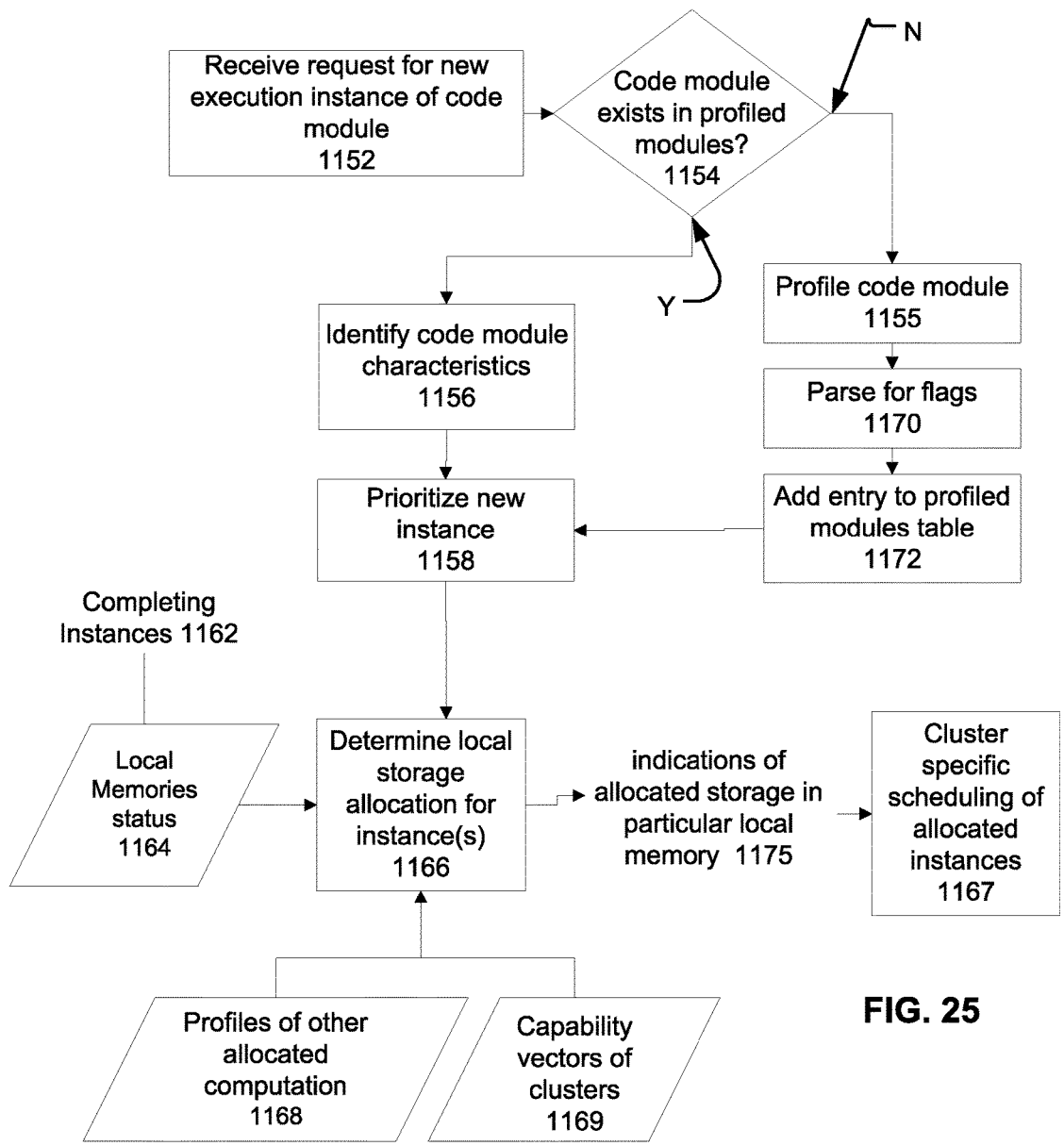
FIG. 25 depicts an example process of handling computation instances.

FIG. 25 depicts an example process by which local storage allocations can be determined. According to the example, a local storage allocation process may be initiated responsive to receiving 1152 a request for a new computation instance of a code module (or equivalent mechanism to identify a configuration or some other programmatic configuration to be executed, which will be referred to as a code module, for simplicity). In most cases, a data set or a portion thereof, or an initial portion of a data set will be specified as well. At 1154, a determination whether the code module instance has been profiled is made. If so, then at 1156 characteristics of the code module are identified, and based on these characteristics and the request, the new instance is prioritized at 1158. If the code module (or instance thereof) has not been profiled, then profiling (1155) can be performed. The code module can be parsed (1170) for flags or compiler or programmer provided allocation information and an entry in a profiled modules list or table can be created (1172).

A local storage allocation is determined (1166) for the instance, based on local memory status 1164. Status 1164 is kept updated by information about completing computation instances 1162. Other inputs to determining (1166) include profiles 1168 of other computation allocated, and capability vectors 1169 of the processing elements in the computation system. Further description of examples of such profiles 1168 and capability vectors 1169 and their usage in allocating local storage is found below. A product of determining (1166) is indications of allocated storage 1175, which can be an input to cluster specific scheduling 1167 for instances of computation.

Figure 26:
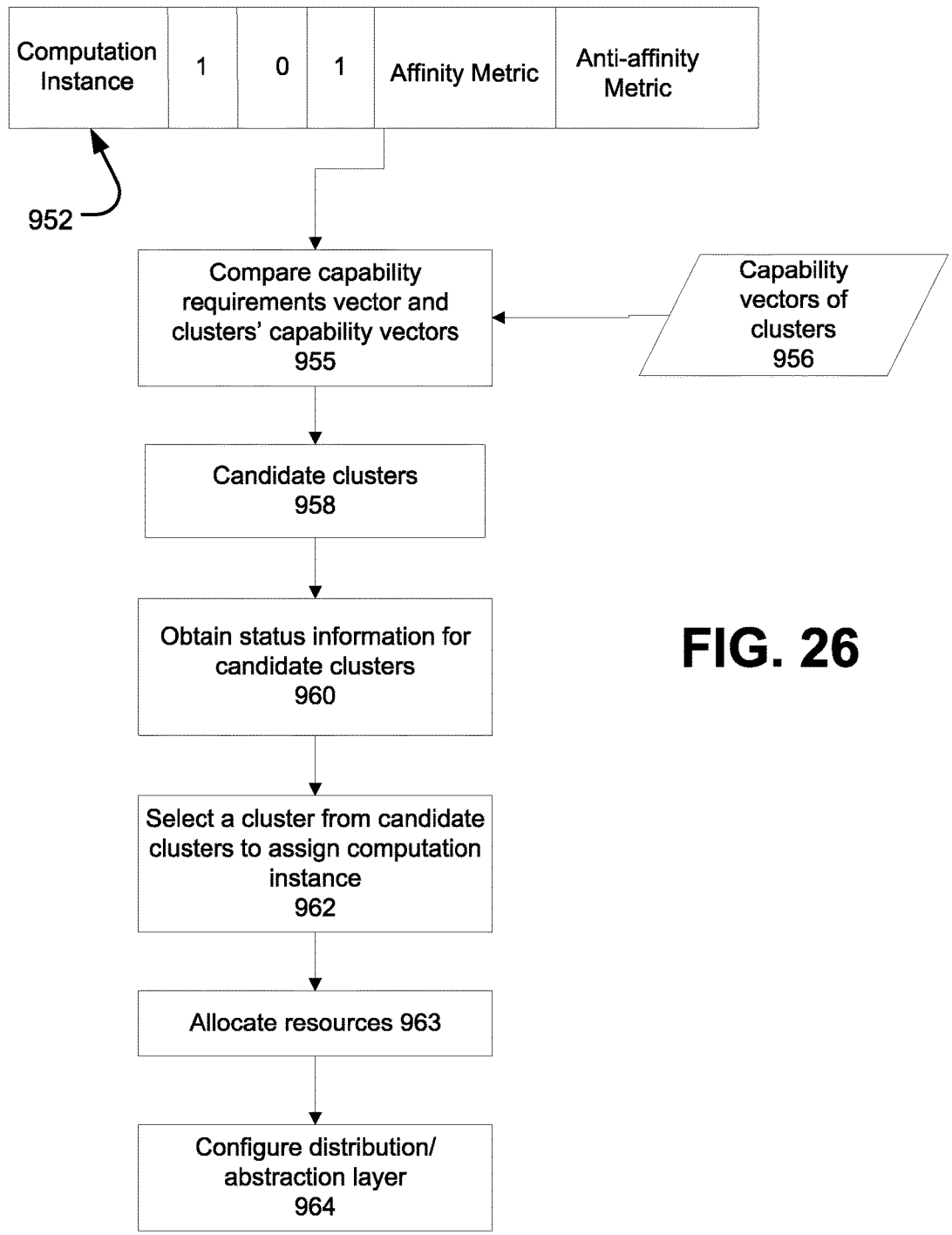
FIG. 26 depicts an example local storage allocation process for instances.

FIG. 26 depicts that a request for a new computation instance includes a capabilities requirements vector 952, which can include a bitstring indicating whether or not certain capabilities are required to execute the new computation instance. Other features that may be included in the computation instance are an affinity metric or indication, and an anti-affinity metric or indication.

Capabilities requirements vector is an input to a local storage allocation process that, in the example of FIG. 26, includes, at 955, comparing capabilities requirements vector 952 with capability vector descriptions of the cluster processor elements 956. An output of the comparison is a set of candidate clusters 958. Assuming that the set is not null, at 960, status information is obtained for the candidate clusters. A cluster of the candidate clusters is selected at 962, and local memory is allocated at 963. At 964, a distribution/abstract layer can be configured based on the allocated resources, such that distribution/abstraction layer can send computation instances to computation units that store required memory elements.

FIGS. 27-29 depict examples of data that can be stored in order to implement local storage allocation and scheduling aspects disclosed herein. For example FIG. 27 depicts an example of data (in a table format, for clarity) that represents profiling outputs. Such profiling outputs can be used in determining treatment of instances of the profiled program modules. For example, such stored outputs can determine a group size for instances being collected, or for estimating an amount of computation that will be triggered by running an instance of a profiled program module, or for estimating an amount of data that will be read during execution of an instance of the profiled program module.

In FIG. 27, a table can include entries for modules 905-907. Each of these modules can be parameterized according to a plurality of metrics, and each module can have a respective indicator associated with it for each metric. For clarity, indicators for each module are identified in groups. For example, indicators 910 are for estimated promiscuity of each module 905-907. In some aspects, promiscuity represents a estimate of how memory intensive the computation represented by each module is expected to be. Indicators 911 represent respective estimates of proliferation for each module. Proliferation represents how much computation is expected to be generated by executing an instance of that module. For example, some modules may output many new computation instances that need to be executed, or new computation instances generated themselves may be especially computationally intensive.

Indicators 912 represent an estimate of an appropriate collection size for instances of each module. For example, some modules may have a coherence size of 32 or 64 instances, while other modules may have a coherence size of 512, 1024, 2048, more or fewer instances. Indicators 912 can represent ranges of size. The ranges of size can be further qualified by a distribution that can be used in selecting collections for scheduling. Indicators 913 can represent a respective count of instances for each profiled module. Such instance count can be updated during runtime processing, as can indicators 910-912. It is expected that these indicators will have some variability among different scenes, and also may depend on characteristics of other modules that are activated to render a particular scene.

FIG. 28 depicts data that represents capability vectors for clusters available in a given computation system, which can be used where some clusters in the computation system have different characteristics than others. For example, in a computation system, some clusters may have a faster or more robust trigonometry capability 922, or may have a double precision floating point capability 924, or may have a hardware accelerated transcendental function capability 925. These capability vectors may be binary, or may represent gradients of relative efficiencies or preferences for certain workload types to be allocated to certain clusters.

FIG. 29 depicts that a set of code modules 918 can each be allocated a specific memory range. Allocation of code modules to particular memory ranges 915 may be used to select sub-portions of an allocated memory range for particular instances of each code module.

Figure 30:
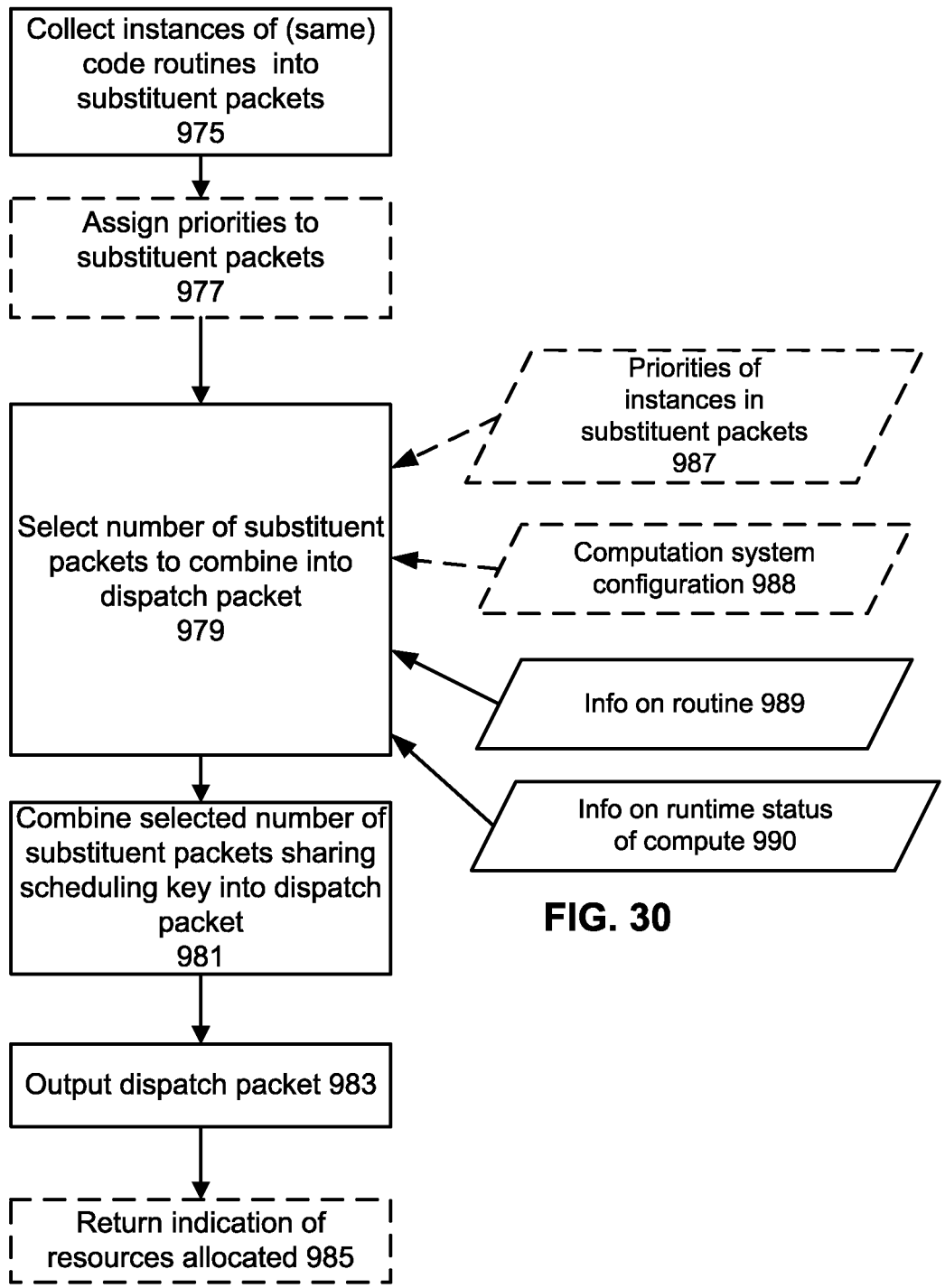
FIG. 30 depicts a process of dispatching packets of computation instances according to the disclosure.

FIG. 30 depicts an example process of variable packet size creation and dispatch. In FIG. 30, at 975, instances of code routines are collected into substituent packets. These instances in one example are all of a single code routine; in a more particular example, these instances also further reference at least one common (same) scheduling key, and may reference the same single scheduling key. At 977, a priority can be assigned to each substituent packet. At 979, a number of substituent packets can be selected for combination into a packet for dispatch. A number of different inputs can be provided for such selection, including priorities (987) of computation instances in substituent packets. For example, at 977 a priority can be assigned for each substituent packet; however, an alternative approach is to allow inspection of priorities of instances within substituent packets. Averaging or other statistical measures can be used to represent such priorities. Information (989) on respective code routines for different substituent packets can be used, which can include profiling information about such routines. Information (990) on runtime status of computation resources also can be used to determine packetization sizes. Information (988) about characteristics of the computation resources available to be used also can be inputted. For example, SIMD vector widths, cache sizes, cache line widths, special characteristics of certain elements of computation (e.g., accelerator or fixed function units) all can be used to determine a number of substituent packets to combine. At 981, a selected number of substituent packets (in some aspects, all sharing a scheduling key) are combined into a dispatch packet. In some cases, the number selected at 979 is a target for 981, but is not a required number. At 983, the dispatch packet is output. At 985, an indication of what resources were allocated to service the dispatched packet can be returned. Such return 985 is optional in that implementations may pre-allocate memory resources for instances that are within substituent packets in process of instantiating those instances. However, in some situations, a large number of instances may be defined and awaiting execution, but an allocation of resources may await a decision to dispatch a packet that references a selection of those instances.

In various examples herein, queues were described as being provided between different components. A queue can be implemented logically using a shared memory resource, can be implemented as a first in first out queue, can allow random access, can be implemented as a ring buffer, can be implemented as a dedicated memory or section of memory, can be implemented as a linked list, or by another means as deemed appropriate in the implementation.

Ray data can be stored in a plurality of logically or physically distinct memories. These memories can have different capacities, latencies, bandwidth, and so on. Therefore, in these examples, it would be understood that information relating to memory usage, targets for memory usage, targets for ray population and so on can be expressed to account for characteristics of such systems. For example, a ray population target can be a soft target that allows paging out of rays to a slower, or higher latency memory, and ray population targets need not be a hard target.

Some examples herein were described in terms of memory utilization measures, or goals, while other examples involved ray population targets. It is to be understood that the breadth of these examples show that a variety of implementations can be provided in accordance with these disclosures that provide information useful in dynamic ray population control. For example, measures can be based on a total amount of data for rays being maintained. Such a measure can be useful if some rays have more information for them than other rays.

The above examples explained sorting responsive to detection of intersections with primitives (one example). In addition to sorting based on detected intersections, each ray also can be associated with a default bin or buffer in which it is to be sorted, absent a detected intersection. The specified bin or buffer can be a bin or buffer that also is associated with one or more primitives, or objects, or particular code modules, such that some rays end up there by virtue of their respective default assignment, while others end up there as a result of detecting an intersection that causes that ray to be binned or buffered there. Therefore, although the prototypical example is sorting/buffering/binning based on detected intersections, examples also can provide functionality that allows each ray to specify a default. An API call allowing ray emission can be made to accept that default assignment. Combinations of approaches to both examples can be implemented within one system.

By way of further summary, systems according to these examples can more broadly operate to allocate resources between driving intersection testing into further areas of a scene structure, and to produce a wider variety of rays and to starting new camera rays. Ultimately, it is expected to test all rays emitted by the shaders that execute, but an order of execution can have important effects on memory usage during rendering.

Any of the functions, features, and other logic described herein can be implemented with a variety of computing resources. Examples of computing resource(s) include a thread, a core, a processor, a group of processors, a virtual machine, a fixed function processing element, and the like. Thus, various approaches, aspects of methods, processing components, and the like were described, and such computing resources can provide means for implementing these functions. Also, other functions that may be used in implementing embodiments can be provided or implemented as a process, thread or task that can be localized to one computing resource or distributed among a plurality of computing resources (e.g., a plurality of threads distributed among a plurality of physical compute resources).

By particular example, computing resources being used for intersection test can also host other processes, such as shading processes that are used to shade intersections detected. By further example, if a core can support multiple threads, then a thread can be dedicated to shading while another thread can be dedicated to intersection processing.

As discussed above, the described examples can be used in transforming a 3-D scene into a 2-D representation of it, as viewed from a defined vantage point. The 3-D scene can include data representations of physical objects. Other results of ray intersection testing can include object visibility determinations, which can be used in a variety of applications. Other transformations include transforming computer readable media into a different state by storing data determined according to the defined methods.

In one application, these systems and methods can be used in rendering representations of a 3-D scene for use in holographic imaging systems. In an example approach to rendering for holographic imaging systems, a plurality of images of a given scene are to be rendered, each from a different perspective. In rendering such images, each perspective can be considered to be an origin of rays to be intersection tested. The rays of each perspective can be collected together for intersection testing, such as collecting rays of different origins and their progeny together, without regard to their origins, but rather with respect to commonality of intersection testing and/or shading to be performed. Allowing collection of rays from a plurality of such origins allows systems and methods to provide for setup of the 3-D scene once, so that such scene setup is amortized over a large number of image renderings. Also, combining rays to be traced from different origins may allow for greater coherence and overall processor utilization. Thus, in the above examples, where collections of rays are formed, outputted, or otherwise handled according to the disclosures, these rays can be attributed to a plurality of camera positions. For example, rays of a given collection can be tested against child nodes of a parent node of a common acceleration structure.

Another application of these disclosures comprises determining mappings between data elements of a first type, which can be defined during execution of a computer-implemented process to data elements of a second type, which comprise code modules that can use information provided in elements of the first type during execution of the process. In other words, as between a number of discrete potential inputs to a number of discrete potential code modules, an application comprises determining, based on characteristics of the potential inputs and characteristics of the code modules, which code module is to receive which input. In such applications, code modules can generate further potential inputs, for which the determination is to be conducted again. Thus, in some such applications, a complete dataset to be processed is developed or otherwise evolved during execution of the application itself.

By way of contrast, some classes of processes may have an entirety of possible actions to be taken specified prior to initiating the process; for example, code modules that accept data elements used as inputs in the code modules can be specified prior to execution of a program or process that uses the code modules. However, in the present circumstances, which actions are to be taken (or code modules executed, in a more specific instance), and under what circumstances those actions are to be taken, may be indeterminate prior to initiation of the process or even at any given point during the execution of the process. Instead such information is determined during iterations of process execution. As such, in some examples, an entirety of the data set used during execution of a process may be indeterminate at commencement of the process. Also, it may be indeterminate which code modules (or functional modules) of the process will use which portions of the data set. A fine grained parallelization of execution of such processes at compile time is difficult, because the order of execution of code modules, and which code modules may use which inputs is unknown at that time.

Therefore, systems and methods that can determine and schedule processing for portions of a data set that evolves over the course of execution of a process to take increased advantage of available parallelism are desirable. In one particular process category, there can be one type of data element, where different instances of that data element can have different parameters, and each parameter can have different values. Different data elements can have different parameters, even if there is a superset of parameters from which the parameters associated with any given data element can be chosen.

These data elements can be used as input to code modules that may use parameters of these data elements as inputs, and can also instantiate new data elements as outputs of execution. When data elements are instantiated, they are to be closed either by determining that they cause no further code executed, or an appropriate portion of code to be run for each of them is identified (and executed, depending on how the closure is defined).

A preliminary setup for executing the process includes establishing an n-dimensional space in which code portions (e.g., code modules or portions of a module) can be inter-related or organized by associating the code portions with one or more points or locations in the n-dimensional spatial structure (such code portions also can be associated with defined regions in n-dimensional space, but preferably, they are associated with points, and the description uses this example, without limitation).

The n-dimensional space can be sub-divided by an acceleration structure comprising a plurality of elements, where each of the elements establishes a hypersurface (for convenience, called a surface—as in a 3-D structure) that bounds a respective selection of points associated with respective code portions. In some examples, the acceleration structure is hierarchical, with child elements of parent elements (this example will be used below, for ease of description, but hierarchy in the acceleration structure is not required). Typically, parent acceleration elements bound supersets of the points bounded by their children, but do not necessarily bound the entirety of the surfaces of the child elements themselves.

A plurality of data elements are defined (or obtained), for which processing may need to be conducted. A search in the n-dimensional space is to be conducted to determine one or more code modules that are to be run for closing processing of those data elements (and in some more general cases, whether any processing is to be done for a given element). The search is to be conducted based on criteria specified in the data element, which comprise one or more parameters whose permissible range of values define a path or region in the n-dimensional space. For example, in the case of rays as data elements, parameters can comprise an origin and direction specified in 3-D space, which define a line in 3-D space. Similarly, parameters may define a 3-D object, such as a sphere. An arbitrary path of a point through space, or of an extrusion of a 2-D surface are other examples. Hyperdimensional regions can be defined by regular or irregular bounds in the n-dimensional space. The region can be contiguous or non-contiguous, e.g., the region may comprise a union of a plurality of disjoint portions of n-dimensional space. Thus, a data element defines a spatial extent in the n-dimensional space, where n can be two or more; the spatial extent depends on the parameters and values of the parameters defined for a given data element ("spatial" is used here for increased understanding, and without limitation as to a number of dimensions in the operational space).

To determine what code portion(s) (if any) are to be run for a given data element, the spatial extent for that data element is tested for intersection in the n-dimensional space with surfaces (hypersurfaces) defined by elements of the acceleration structure. As data elements are found to intersect surfaces of acceleration elements, those data elements are collected into collections associated with those acceleration elements.

The searching can be done in a computation resource that comprises a plurality of test elements, such as threads, or dedicated test cells, that can test different data elements for intersection with a given surface (one example). This computation resource is limited in that it cannot concurrently perform all intersection testing that must be done, so this computation resource is to be scheduled. The allocation of the computation resource for the testing is based on scheduling collections of data elements for further testing, from a pool of collections. Rather than testing the data elements in an order in which they were defined or began testing, the data elements are tested based on membership in collections selected from the pool. Data elements can concurrently exist in multiple collections, and can be tested by virtue of membership in one collection, even while testing based on membership in a different collection is deferred.

The deferral of some collections in favor of other collections provides for further collections to be traversed to join collections in the acceleration structure that have less full collections, such that, in general, data elements from fuller collections can be tested concurrently (heuristics for collection scheduling can include selecting collections having other characteristics in some circumstances). In the case of a hierarchical acceleration structure, a collection of data elements would be tested next with children acceleration elements of the acceleration element to which the given collection of data elements was associated.

In the case of ray intersection testing, the interesting result typically is a closest intersection from an origin of the ray being tested. However, for a more general case of intersection testing of spatial extents defined by a parametric definition in a data element (in n-dimensional space), a plurality of results can be returned, or a selected result, or an ordering of results. As such, the results to be returned, and a format thereof, can be specified by provision of a format to which a data element query can be formatted.

Outputs from such testing can include indications of which data elements are to be used as inputs to (or triggers to execute) to which code portions. Such data elements also can be outputted as a collection, such that a number of the instances of the same or related code portions can be provided for different of the data elements. In turn, outputs of the code portions can include further data elements for which the described searching is to be conducted.

In addition or separate from the above, scheduling of execution of the code portions themselves can include parallelizing the execution of the code portions for different of the data elements, such that common portions of the code can execute concurrently for different of the data elements. Also, other data (e.g, data other than what may be included within the data elements themselves) used by the code portions can be retrieved and cached for use.

Thus, systems according to the above examples can implement methods where data elements comprising a plurality of parameters whose values define a region in an n-dimensional space can be tested for intersection with hypersurfaces that bound points (or regions) in space which are associated with modules of code for execution. The data elements found to intersect such hypersurfaces can carry data which can be used as input to one or more of the code modules bounded by an intersected surface. In some examples, system can perform further testing to establish a nearness or intersection to a specified degree of precision between the region defined by a given data element and a point associated with a given code module. Testing of a plurality of data elements preferably is performed concurrently in systems by deferring further testing of individual data elements to accumulate a number of data elements found to intersect a given hypersurface and scheduling other accumulated data elements for testing on provided system resources.

Computer code and associated data can be provided for implementing methods and other aspects described herein. The computer code can comprise computer executable instructions that may be, for example, binaries, intermediate format instructions such as assembly language, firmware, or source code. The code may configure or otherwise cause to be configured a general purpose computer, a special purpose computer, or a special purpose processing device to perform a certain function or group of functions.

Any such code can be stored in computer readable media, such as solid-state drives, hard drives, CD-ROMs and other optical storage means, transiently in volatile memories, such as DRAM, or less transiently in SRAM.

A variety of implementations can be provided which can include interoperative hardware, firmware and/or software that can also be embodied in any of a variety of form factors and devices, including laptops, smart phones, small form factor personal computers, personal digital assistants, and so on. Functionality described herein also can be embodied in peripherals or add-in cards. Such functionality also can be implemented on a circuit board among different chips or different processes executing in a single device, by way of further example.

For example, machines for according to these examples can comprise intersection testing resources including particular fixed-purpose testing cells, and/or general purpose computers configured with computer readable instructions from a computer readable medium to perform the particular intersection tests described and interpret the results of the tests. Further machine components include communication links for providing the acceleration structures to the testing resources and to receive the results of the testing. The machines for intersection testing can be a component of a larger system including other input and output devices, such as a drive for reading scene description data, and a display or a computer readable medium for outputting rendered scenes. For example, the computer readable medium can be a DVD and each scene may be a frame of a motion picture.

In all of the above examples, the 3-D scene being rendered can represent an abstraction or a model of a real-world scene and the rays being tested also can represent light energy being emitted from lights located in the scene. Similarly, the usage of the camera also can represent a vantage point of an observer for the scene. The output of intersection testing results in determining how light affects the scene and ultimately affects output that can be consumed by other applications, can be stored in computer readable media, and can be displayed to a user.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than, additional to, or less than, those identified herein. Rather, the described features and steps are disclosed as examples of components of systems and methods within the scope of the appended claims.

We claim:

1. A non-transitory computer readable storage medium having stored thereon computer-executable instructions that when executed cause at least one processor to:

prepare a code module of instructions to be ready for instantiation for execution on a target computer system comprising a plurality of computation units collectively capable of multithreaded execution of instances of code modules, by providing configuration information comprising an indication of code module operating group size representing an estimate of the number of instances of the code module that can be collected together in a group, and cause a packet unit to:
(i) form groups of computation instances to be concurrently dispatched to the target computer system for execution by the plurality of computation units, each computation instance being an instance of a code module, and
(ii) control the dispatch of groups of computation instances using respective target dispatch quantities of grouped instances of code modules determined according to a function using the operating group size of at least one of the respective code modules associated with computation instances of each grouping.

2. The non-transitory computer readable storage medium of claim 1, wherein one or more parameters of the function are defined by characterizing the respective code module.

3. The non-transitory computer readable storage medium of claim 1, wherein each of the computation instances in each group references a single code module.

4. The non-transitory computer readable storage medium of claim 3, wherein the groups of computation instances may include groups referencing different code modules.

5. The non-transitory computer readable storage medium of claim 1, wherein the indication of operating group size is determined based on characteristics of a respective code module.

6. The non-transitory computer readable storage medium of claim 1, wherein the target computer system has a plurality of local memories, allocation of respective memory segments in the plurality of local memories for a group of computation instances being deferred until the target dispatch quantity of instances for that group has been collected by the packet unit.

7. The non-transitory computer readable storage medium of claim 1, wherein respective indications of operating group size are produced by identifying a corresponding parameter value in each code module.

8. The non-transitory computer readable storage medium of claim 1, further comprising instructions that cause a compiler to receive the code module of instructions in an uncompiled form, and to produce a parameter value for the function, the value of the parameter set using one or more characteristics of the target computer system, for which the module of instructions is to be compiled.

9. The non-transitory computer readable storage medium of claim 1, further comprising instructions that cause an Application Programming Interface to receive a parameter value that is used in determining the indication of operating group size for an associated code module.

10. A computation system, comprising:
a plurality of computation units, collectively configured to perform concurrent execution of a plurality of instances of a code module of instructions; and
a packet unit including hardware logic, said packet unit configured to form groups of computation instances to be concurrently dispatched to the target computer system for execution by the plurality of computation units, each computation instance being an instance of a code module, and to control dispatch of groups of instances of code modules for execution on the plurality of computation units, the packet unit operable to maintain groupings of instances of code modules, and to obtain an indication of dispatch group size for each code module of which instances can be grouped and scheduled for execution on the plurality of computation units, the dispatch group size for a code module representing an estimate of the number of instances of that code module that can be collected together and being used by the packet unit for selecting from among the maintained groupings particular groups of instances of code modules for commencement of execution on the plurality of computation units.

11. The computation system of claim 10, further comprising a receiving unit operable to receive versions of the code modules, prepare the versions of the code modules for execution, and produce the respective indications of dispatch group size.

12. The computation system of claim 11, wherein the received versions of the code modules include uncompiled versions of at least some of the code modules, and the receiving unit is operable to compile the uncompiled versions of the code modules, and produce the respective indications.

13. The computation system of claim 12, wherein the receiving unit is operable to produce the respective indications according to information obtained from the code modules.

14. The computation system of claim 12, wherein the receiving unit produces the respective indications according to information obtained from the code modules and a characteristic of the plurality of computation units.

15. The computation system of claim 12, wherein the receiving unit comprises a driver configured to execute on a host processor, and operable to accept code modules for execution on the computation system from applications executing on the host processor.

16. The computation system of claim 10, wherein each of the plurality of computation units comprises a cluster of Arithmetic Logic Units (ALUs), and the ALUs of each cluster share a register space that is allocated by the scheduler among the instances of code modules concurrently executing in that cluster.

17. The computation system of claim 10, wherein each of the plurality of computation units comprises a cluster of Arithmetic Logic Units (ALUs), each driven by the same program counter, and having a SIMD vector processing capability.

18. The computation system of claim 17, wherein the packet unit is operable to set target dispatch group sizes for instances of the plurality of code modules as a function of at least a number of ALUs in the cluster and a width of the SIMD vector of ALUs of a cluster.

19. The computation system of claim 10, wherein each computation unit comprises a SIMD-width processing capability, and respective dispatch group sizes for groups of instances that execute on each computation unit are correlated to the respective SIMD width of that computation unit.

20. The computation system of claim 10, wherein the instances of code modules comprise instances of a code module for testing a ray for intersection with a shape in a 3-D scene, and instances of a code module for shading an identified intersection between a ray and a shape.

21. The computation system of claim 10, wherein each instance comprises information identifying a data element and a program of instructions to execute, and the scheduler is operable to collect together the data elements from different instances of the same program of instructions to form a dispatch group.

22. The computation system of claim 10, wherein the respective program of instructions and the data element are identified based on a reference to a location in memory that is mapped to a particular program of instructions.

23. The computation system of claim 10, wherein each computation unit comprises a fixed-size maximum number of registers that can be allocated among a plurality of threads having program instructions that can be interleaved for execution in that computation unit.

24. The computation system of claim 10, wherein larger dispatch group sizes are formed from a plurality of smaller dispatch group sizes.

25. The computation system of claim 10, wherein a code module is defined by a divergent branch instruction, and a request for execution of that code module is specified based on a branch condition for that divergent branch.

26. The computation system of claim 10, wherein the plurality of code modules comprise a code module for testing a ray for intersection with a shape in a 3-D scene, and a code module for shading an identified intersection between a ray and a shape.

\* \* \* \* \*